(12) United States Patent
Lin et al.

(10) Patent No.: US 7,473,999 B2
(45) Date of Patent: Jan. 6, 2009

(54) SEMICONDUCTOR CHIP AND PROCESS FOR FORMING THE SAME

(75) Inventors: Mou-Shiung Lin, Hsin-Chu (TW); Chien-Kang Chou, Tainan Hsien (TW); Hsin-Jung Lo, Taipei County (TW)

(73) Assignee: MEGICA Corporation, Hsinchu (TW)

( * ) Notice: Subject to any disclaimer, the term of this patent is extended or adjusted under 35 U.S.C. 154(b) by 163 days.

(21) Appl. No.: 11/534,672

(22) Filed: Sep. 24, 2006

(65) Prior Publication Data

US 2007/0069347 A1    Mar. 29, 2007

(30) Foreign Application Priority Data

Sep. 23, 2005    (TW) .............................. 94133248 A

(51) Int. Cl.
*H01L 21/44*    (2006.01)
(52) U.S. Cl. ................ 257/738; 257/751; 257/758; 257/773; 257/E23.049; 257/E21.579

(58) Field of Classification Search ................. 257/738, 257/751, 773, E23.049
See application file for complete search history.

(56) References Cited

U.S. PATENT DOCUMENTS

| 2005/0250255 A1* | 11/2005 | Chen ........................... 438/127 |
| 2005/0101116 A1* | 5/2006 | Tseng ......................... 438/622 |
| 2007/0246834 A1* | 10/2007 | Lin et al. .................... 257/773 |
| 2008/0012132 A1* | 1/2008 | Lin ............................. 257/738 |
| 2008/0045007 A1* | 2/2008 | Lin et al. .................... 438/644 |

* cited by examiner

*Primary Examiner*—Michael S Lebentritt
(74) *Attorney, Agent, or Firm*—Winston Hsu

(57) ABSTRACT

A semiconductor chip comprises a first MOS device, a second MOS device, a first metallization structure connected to said first MOS device, a second metallization structure connected to said second MOS device, a passivation layer over said first and second MOS devices and over said first and second metallization structures, and a third metallization structure connecting said first and second metallization structures.

20 Claims, 36 Drawing Sheets

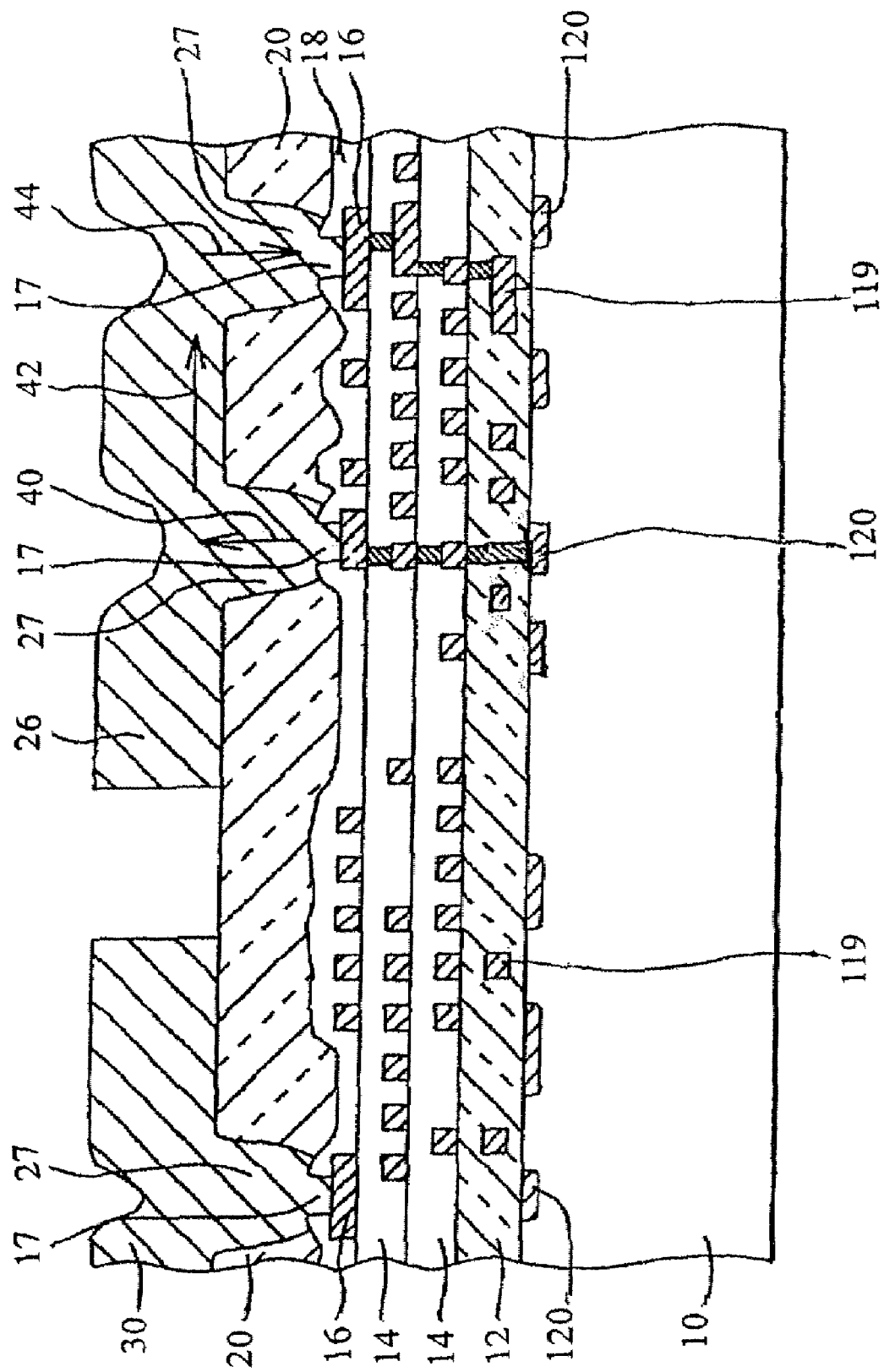

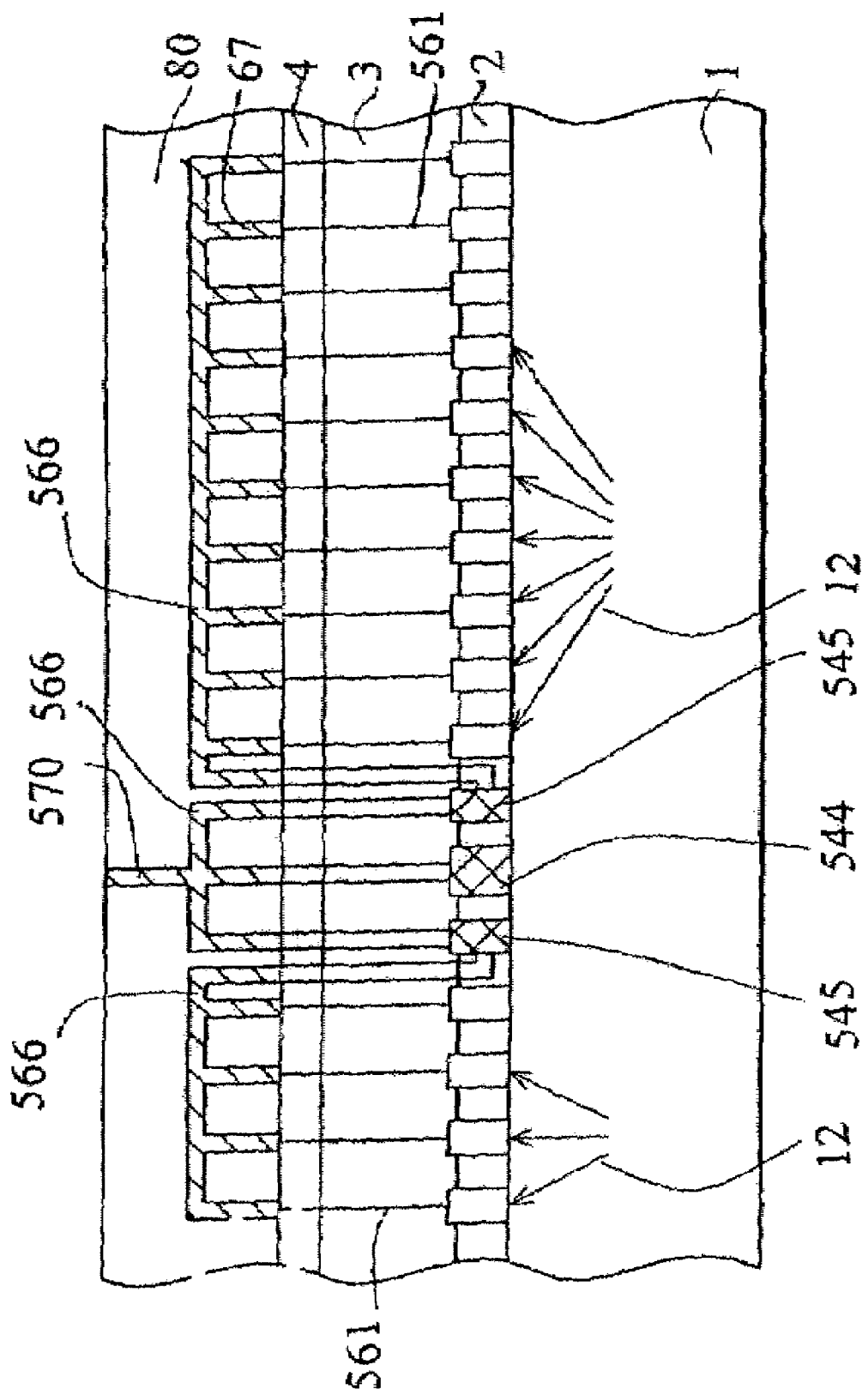

Table 1 PPT RC Constant

| PPT RC Constant (peco-second per milimeter, ps/mm) | | | | | R(Ohm/mm) | C (pF/mm) with PI | C (pF/mm) with BCB | RC (ps/mm) with PI | RC (ps/mm) with BCB |
|---|---|---|---|---|---|---|---|---|---|
| Metal | | | Dielectric | | | | | | |
| Width($\mu$m) W2 | Space($\mu$m) S2 | Thickness ($\mu$m) t2 | PI Thickness ($\mu$m) d2 | BCB Thickness ($\mu$m) d2 | | | | | |
| 3 | 3 | 3 | 3 | 3 | 2.00 | 1.00 | 0.76 | 2.0000 | 1.5152 |
| 5 | 5 | 5 | 5 | 5 | 0.72 | 1.00 | 0.76 | 0.7200 | 0.5455 |
| 10 | 10 | 5 | 5 | 5 | 0.36 | 1.00 | 0.76 | 0.3600 | 0.2727 |
| 20 | 10 | 5 | 5 | 5 | 0.18 | 2.00 | 1.52 | 0.3600 | 0.2727 |
| 20 | 20 | 5 | 5 | 5 | 0.18 | 1.00 | 0.76 | 0.1800 | 0.1364 |
| 10 | 10 | 5 | 10 | 10 | 0.36 | 0.50 | 0.38 | 0.1800 | 0.1364 |
| 10 | 10 | 10 | 10 | 10 | 0.18 | 1.00 | 0.76 | 0.1800 | 0.1364 |
| 20 | 10 | 10 | 10 | 10 | 0.09 | 2.00 | 1.52 | 0.1800 | 0.1364 |
| 20 | 20 | 10 | 10 | 10 | 0.09 | 1.00 | 0.76 | 0.0900 | 0.0682 |
| 20 | 10 | 20 | 20 | 20 | 0.05 | 2.00 | 1.52 | 0.0900 | 0.0682 |
| 20 | 20 | 20 | 20 | 20 | 0.05 | 1.00 | 0.76 | 0.0450 | 0.0341 |
| 20 | 20 | 10 | 30 | 30 | 0.09 | 0.33 | 0.25 | 0.0300 | 0.0227 |
| 40 | 40 | 20 | 20 | 20 | 0.02 | 1.00 | 0.76 | 0.0225 | 0.0170 |
| 40 | 40 | 10 | 30 | 30 | 0.05 | 0.33 | 0.25 | 0.0150 | 0.0114 |
| 50 | 50 | 10 | 30 | 30 | 0.04 | 0.33 | 0.25 | 0.0120 | 0.0091 |
| 50 | 50 | 10 | 30 | 30 | 0.04 | 0.33 | 0.25 | 0.0120 | 0.0091 |
| 60 | 60 | 10 | 30 | 30 | 0.03 | 0.33 | 0.25 | 0.0100 | 0.0076 |
| 50 | 50 | 10 | 60 | 60 | 0.04 | 0.17 | 0.13 | 0.0060 | 0.0045 |
| 60 | 120 | 10 | 30 | 30 | 0.03 | 0.17 | 0.13 | 0.0050 | 0.0038 |
| 60 | 60 | 10 | 60 | 60 | 0.03 | 0.17 | 0.13 | 0.0050 | 0.0038 |

SEMICONDUCTOR CHIP AND PROCESS FOR FORMING THE SAME

The present application claims priority benefit of Taiwan Application Serial No. 94,133,248, filed Sep. 23, 2005.

BACKGROUND OF THE INVENTION

1. Field of the Invention

The invention relates in general to a chip structure and a process for forming the same. More particularly, the invention relates to the process with simplified steps and its corresponding chip structure.

2. Description of the Related Art

The way to improve the performance of a semiconductor device is usually to reduce the geometric dimensions of the Integrated Circuits. It results in the reduction in the cost per die and the improvement of performance. A metal connection between Integrated Circuits and other circuits or between Integrated Circuits and system components is becoming relatively important and has an increasingly negative impact on the circuit performance, while Integrated Circuits are more miniaturized.

The increase of the parasitic capacitance and resistance induced by the metal interconnections increase degrades the chip performance significantly. Of most concerns are the voltage drop along power and ground buses and the RC delay of critical signal paths. Attempts to reduce the resistance by using wider metal lines result in higher parasitic capacitance induced by these wider metal lines. To solve this problem, a metal of low resistance, such as copper, is introduced as the conducting wires and a dielectric material with low dielectric constant (k) is used between the signal lines. According to the historical point of view of the metallization structure for IC, since 60s the sputtered aluminum dominated as the material for connecting metal. An aluminum thin-film layer is formed to cover the whole chip by using a sputtering process and then patterned by a photolithography process and a dry or wet etching process. Due to the cost and the thin-film stress formed by a sputtering process, the technique for forming an aluminum circuit with a thickness of more than 2 microns is very difficult and expensive.

In about 1995, a damascene copper became another material for connecting metal in IC. According to the damascene copper process, after patterning an insulating layer, a copper layer is formed by an electroplating process inside the opening in the insulating layer and on the insulating layer. Then, the copper layer outside the opening in the insulating layer is removed by using a Chemical Mechanical Polishing/Planarization (CMP). As a result, the copper trace can be formed inside the opening in the insulating layer.

However, the thick metal layer electroplated onto the whole chip has a relatively large inner stress and the thickness of the damascene copper layer depends on the thickness of the insulating layer made of, for example, a Chemical-Vapor-Deposition (CVD) oxide. Because of the concern about the inner stress and the cost, the damascene copper process can not form a thicker copper trace. In other words, it is difficult in aspect of technology and expensive in cost to form a copper wire that is thicker than 2 microns.

Nakanishi (U.S. Pat. No. 5,212,403) discloses a method of forming wiring connections both inside and outside in a wiring substrate, especially a logic design varying with the length of the wiring connections.

Gehman, Jr. et al. (U.S. Pat. No. 5,501,006) shows a structure with an insulating layer between integrated circuits (IC) and a wiring substrate. A distribution lead connects the bonding pads of the IC to the bonding pads of a circuit board.

Jacobs (U.S. Pat. No. 5,055,907) discloses an integrated semiconductor structure allowing manufacturers to integrate circuitry beyond a chip by forming multiple thin-film wiring layers over a support substrate and over the chip.

Volfson et al. (U.S. Pat. No. 5,106,461) teaches a multilayer interconnect structure with alternating an insulating layers of polyimide, formed over a chip, and with a TAB structure.

Wenzel et al. (U.S. Pat. No. 5,635,767) teaches a method for reducing RC delay by a PBGA with multiple separate metal layers.

Fulcher (U.S. Pat. No. 5,686,764) shows a flip-chip substrate that reduces RC delay by separating the power traces from I/O traces.

In the book of "Silicon Processing for the VLSI Era" (Vol. 2, pp. 214-217, Lattice Press, Sunset Beach, Calif. c. 1990), written by Stanley Wolf, it is discussed that polyimide is used as an insulating layer between metals in 80s. However, due to some disadvantages in polyimide, polyimide has not been used for that purpose.

SUMMARY OF THE INVENTION

The main objective of the invention is to provide a thick metal layer over a passivation on layer of a semiconductor chip.

In accordance with the above objectives, the invention provides a semiconductor chip comprising a first MOS device, a second MOS device, a first metallization structure connected to said first MOS device, a second metallization structure connected to said second MOS device, a passivation layer over said first and second MOS devices and over said first and second metallization structures, and a third metallization structure connecting said first and second metallization structures.

In accordance with the above objectives, the invention provides a semiconductor chip comprising a first circuit, a second circuit, a first metallization structure connected to said first circuit, a second metallization structure connected to said second circuit, a passivation layer over said first and second circuits and over said first and second metallization structures, and a third metallization structure connecting said first and second metallization structures, wherein a current passing through said third metallization structure ranges from 5 milliamperes to 5 amperes.

BRIEF DESCRIPTION OF THE DRAWINGS

FIG. 1b is a schematically cross-sectional view of a semiconductor chip in an embodiment of the present invention.

FIGS. 14a-14j show circuitry architectures having a thick circuit trace or plane over a passivation layer connecting an off-chip I/O circuit and multiple internal circuits or connecting an off-chip I/O circuit and multiple intra-chip drivers or receivers.

Table 1 shows products of resistance times capacitance for various cases.

DESCRIPTION OF THE PREFERRED EMBODIMENTS

First Embodiment

The present invention discloses an Integrated Circuit structure, wherein a redistribution circuit layer and a polymer layer are formed over the passivation layer of a conventional IC. Wide and thick metal lines are used for the redistribution circuit layer, so that RC Delay can be declined. Alternatively, a thick and wide metal line located over the passivation layer may connect two separate electrical bond pads exposed by the openings in the passivation layer. Alternatively, inductors, capacitors and resistors can be formed with a thick metal layer located over the passivation layer.

Figure 1A:
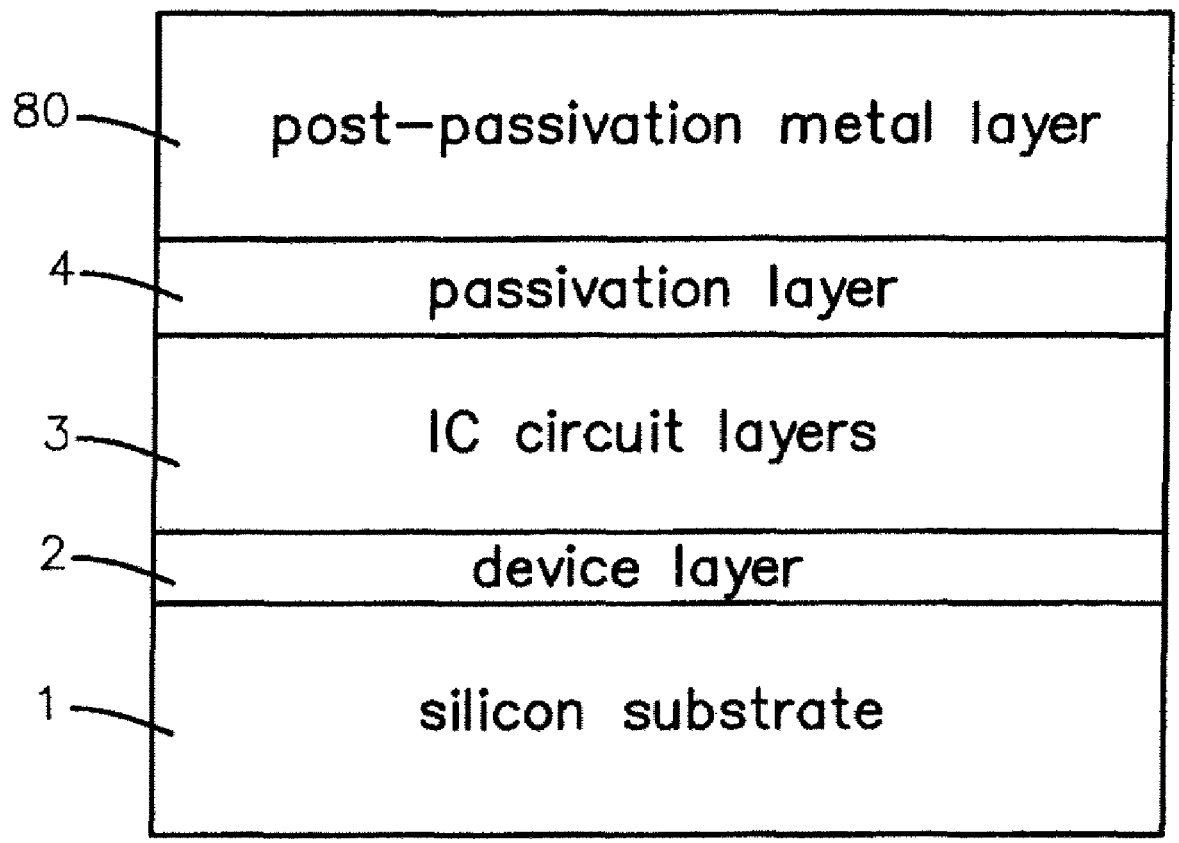
FIG. 1a shows a simplified cross-sectional view of a semiconductor chip according to the present invention.

Referring to the FIG. 1a showing a simplified cross-sectional view of a semiconductor chip according to the present invention. A semiconductor substrate 1, for instance, silicon substrate, germanium substrate or gallium-arsenide substrate is provided. Multiple electronic devices are formed by doping ions with pendat valence electrons or trivalence electrons, such as phosphorus ions or boron ions, into the semiconductor substrate 1, which is shown as a device layer 2 in FIG. 1a. These electronic devices include, for instance, metal oxide semiconductor (MOS) devices, transistor, poly silicon resistor and poly-to-poly capacitor . . . etc.

An IC interconnection layer 3 located on the device layer 2 is formed with alternating depositions of thin-film metal layers and thin-film insulating layers. In general, the materials of the thin-film insulating layer between the thin-film metal layers include an oxide containing silicon, such as a CVD silicon oxide, a CVD Tetraethoxysilane (TEOS), a spin-on glass (SOG), a Fluorinated silica Glass (FSG) and a CVD oxide formed through high density plasma. The thin-film insulating layers can be a composit or a single layer made of above mentioned materials.

The general thickness of the thin-film metal layer each ranges, for instance, from 1000 microns to 10,000 microns. In general, the thin-film metal layer is formed by patterning a sputtered aluminum or aluminum alloy, such as aluminum-copper alloy, to form fine metal lines. In one case, an aluminum-copper alloy, which has less than 5 weight percent of copper, may be employed for forming the thin-film metal layer below the passivation layer.

In the process for forming said fine aluminum lines, an aluminum layer is firstly sputtered on a thin-film insulating layer, such as silicon dioxide or an insulating layer with a dielectric constant of lower than 2.5. Next, the aluminum layer is patterned by photolithography and etching processes. Next, another thin-film insulating layer, such as silicon dioxide or an insulating layer with a dielectric constant of lower than 2.5, is formed on the patterned aluminum layer by a Chemical Vapor Deposition (CVD) process. Next, said another thin-film insulating layer is patterned by photolithography and etching processes such that multiple openings can be formed through said another thin-film insulating layer and expose the patterned aluminum layer thereunder. Thereafter, the above-mentioned process may be a sequent repeat for depositing the IC interconnection structure 3. In addition, the above-mentioned fine aluminum lines may be replaced by other kind metal lines formed by a damascene copper process.

In the damascene copper process, a copper line is protected by an adhesion/barrier layer, which is located under the copper line and around the side wall of the copper line, avoiding copper ions of the copper line from migrating to affect other active components.

In the copper damascene process, a thin-film insulating layer, such as silicon dioxide or material with dielectric constant of less than 2.5, is formed by a CVD process. Then, the thin-film insulating layer is patterned by photolithography and etching processes such that multiple openings can be formed in the thin-film insulating layer and expose an underlying metal layer. Next, an adhesion/barrier layer, such as tantalum, tantalum nitride (TaN) or titanium, or titanium nitride (TiN), can be sputtered over the thin-film insulating layer and in the openings in the thin-film insulating layer. Then, a metal layer, such as copper layer, can be formed over the adhesion/barrier layer and in the openings in the thin-film insulating layer by an electroplating process, a sputtering process or a CVD process, wherein the metal layer has, for example, greater than 95 weight percent of copper. Next, the metal layer and the adhesion/barrier layer outside the openings in the thin-film insulating layer are removed by using a chemical-mechanical-polishing (CMP) process. Thereby, the adhesion/barrier layer covers the bottom and the side wall of the metal layer. The above-mentioned process may be a sequent repeat for depositing the IC interconnection structure 3.

In general, the thickness of the above-mentioned thin-film metal layer under a passivation layer 4 is about between 1000 and 10,000 Angstroms. The metal line of the thin-film metal layer is required to be fabricated in the clean room of less than or equal to Class 10 that means that the number of the airborne particles, whose size are larger than 0.5 microns, can not exceed 10 per cubic inch in air. The metal line of the thin-film metal layer should be formed using a 5× stepper or a scanner or better equipment and using a photoresist layer having a thickness of less than 5 microns. The IC metal interconnection in the IC interconnection structure 3 connects different electronic devices in the device layer 2 to form an operation circuit. The topmost thin-film metal layer under the passivation layer 4 is provided with metal contact points for external electrical connection, such as bond pads. These bond pads provide the electrical connection between IC interconnection layer 3 and an external circuitry.

The passivation layer 4 is disposed on the IC interconnection structure 3 and is provided with multiple openings exposing the bond pads of the IC interconnection structure 3. The passivation layer is formed by depositing oxide and nitride using Plasma Enhanced Chemical Vapor Deposition PECVD process. The passivation layer 4 is formed by first, depositing one layer of silicon oxide layer with the thickness of 0.5 microns using a PECVD process and, then forming a silicon nitride layer with the thickness of greater than 0.3 microns and preferably of 0.7 microns.

The above mentioned passivation layer 4 is quite important. It can protect the device layer 2 and the IC interconnection structure 3 from being damaged by the moisture, by the transition metal such as gold, silver, copper, etc and by the foreign ion contamination such as sodium ion.

To attain the goal of the protection, the thickness of the layer of silicon nitride of the passivation layer 4 is usually greater than 0.3 microns. The passivation layer 4 between the IC interconnection structure 3, which contains thin-film fine lines of Integrated Circuits formed with a sub-micron (less than 1 micron) order thickness, and the post passivation structure 80, which contains a thick and wide metal interconnection lines formed with a micron order (greater than 1 micron) process, is a key point. Due to the protection of the passivation layer 4, the post passivation structure 80 with a thick and wide metal interconnections and a thick polymer layer can be allowed to be formed by a cheaper process in a clean room with lower cleanliness.

The thickness of the passivation layer 4 is, for example, more than 0.35 microns. The passivation layer may be silicon oxynitride, phosphosilicate (PSG), borosilicate glass BSG borophosphosilicate glass BPSG or a composite formed of at least one of the above mentioned materials.

In one case, the passivation layer 4 includes one layer of silicon nitride and one layer of silicon oxide, wherein the layer of silicon nitride lies on the layer of silicon oxide. The thickness of the layer of silicon nitride ranges, for instance, from 0.2 microns to 1.2 microns. The thickness of the layer of silicon oxide ranges, for instance, from 0.1 microns to 0.8 microns. In general, a passivation layer 4 includes the topmost layer of silicon nitride and the topmost layer of silicon oxide of the finished chip structure. The passivation layer 4 includes the topmost CVD-formed insulating layer of the chip structure. Multiple openings in the passivation layer 4 expose the topmost one of the thin-film metal layers in the IC interconnection layer 3. The largest transverse dimension of the openings in the passivation layer may range from 0.1 to 25 microns.

The below mentioned selective deposition process can be employed to form the wide and thick metal interconnection lines over the passivation layer 4. The product of resistance created by a first section of the wide and thick metal interconnection line over the passivation layer 4 times capacitance created by said first section is far smaller than that of resistance created by a second section of the thin-film fine line under the passivation layer 4 times capacitance created by said second section by 5 times, 50 times, 1000 times or 10000 times, for example.

FIG. 1*b* is a cross-sectional view of a semiconductor chip in an embodiment of the present invention. A semiconductor substrate 10 contains electronic devices, such as transistors or MOS (Metal Oxide Semiconductor) devices having a source, drain and gate. A thin film insulating layer 12 is formed over the semiconductor substrate 10 and over these electronic devices. The diffusion layer 120 of source or drain lies inside the semiconductor substrate 10. The bottommost one of the thin film insulating layers 12 may include a gate 119 over the semiconductor substrate 10 between the source and the drain, so that the channel can be formed in the semiconductor substrate 10 under the gate 119, and between the diffusion layer 120 of source or drain.

An interconnection structure 14 comprising multiple thin-film metal layers and thin-film insulating layers lies over the thin film insulating layer 12, wherein the thin-film metal layers of the structure 14 is formed by previously mentioned sputtering aluminum process or damascene copper process. The main material of the thin-film insulating layers is, for instance, silicon oxide formed by CVD. A passivation layer 18 is deposited over the interconnection structure 18. The topmost thin-film metal layer under a passivation layer 18 is formed, for instance, by previously mentioned sputtering aluminum process or damascene copper process. Multiple openings in the passivation layer 18 expose the electrical bond pads 16 of the topmost one of the thin-film metal layers of the interconnection structure 14. The structure and function of the passivation layer 18 can be referred to as that of the passivation layer 4 in FIG. 1*a*.

As below, eleven methods for depositing the passivation layer 42 are to be introduced.

Method 1

A silicon oxide layer with a thickness of between 0.2 and 1.2 microns is formed with a CVD method; and next, a silicon nitride layer with a thickness of between 0.2 and 1.2 microns is formed on the silicon oxide with a CVD method.

Method 2

A silicon oxide layer with a thickness of between 0.2 and 1.2 microns is formed with a CVD method; next, a silicon oxy-nitride layer with a thickness of between 0.05 and 0.15 microns is formed on the silicon oxide with a plasma-enhanced CVD method; and next, a silicon nitride layer with a thickness of between 0.2 and 1.2 microns is formed on the silicon oxy-nitride layer with a CVD method.

Method 3

A silicon oxy-nitride layer with a thickness of between 0.05 and 0.15 microns is formed with a CVD method; next, a silicon oxide layer with a thickness of between 0.2 and 1.2 microns is formed on the silicon oxy-nitride layer with a CVD method; and next, a silicon nitride layer with a thickness of between 0.2 and 1.2 microns is formed on the silicon oxide layer with a CVD method.

Method 4

A first silicon oxide layer with a thickness of between 0.2 and 0.5 microns is formed with a CVD method; next, a second silicon oxide layer with a thickness of between 0.5 and 1 microns is formed on the first silicon oxide layer with a spin-coating method; next, a third silicon oxide layer with a thickness of between 0.2 and 0.5 microns is formed on the second silicon oxide layer with a CVD method; and next, a silicon nitride layer with a thickness of between 0.2 and 1.2 microns is formed on the third silicon oxide layer with a CVD method.

Method 5

A silicon oxide layer with a thickness of between 0.5 and 2 microns is formed with a HDP-CVD (High Density Plasma-Chemical Vapor Deposition) method; and next, a silicon nitride layer with a thickness of between 0.2 and 1.2 microns is formed on the silicon oxide layer with a CVD method.

Method 6

A USG (Undoped Silicate Glass) layer with a thickness of between 0.2 and 3 microns is firstly formed; next, an insulating layer with a thickness of between 0.5 and 3 microns, such as TEOS, BPSG (Borophosphosilicate Glass) or PSG (Borophosphosilicate Glass), is formed on the USG layer; and next, a silicon nitride layer with a thickness of between 0.2 and 1.2 microns is formed on the insulating layer with a CVD method.

Method 7

A first silicon oxy-nitride layer with a thickness of between 0.05 and 0.15 microns is optionally formed with a CVD method; next, a silicon oxide layer with a thickness of between 0.2 and 1.2 microns is formed on the first silicon oxy-nitride layer with a CVD method; next, a second silicon oxy-nitride layer with a thickness of between 0.05 and 0.15 microns is optionally formed on the silicon oxide layer with a CVD method; next, a silicon nitride layer with a thickness of between 0.2 and 1.2 microns is formed on the second silicon oxy-nitride layer or on the silicon oxide layer with a CVD method; next, a third silicon oxy-nitride layer with a thickness of between 0.05 and 0.15 microns is optionally formed on the silicon nitride layer with a CVD method; and next, a silicon oxide layer with a thickness of between 0.2 and 1.2 microns is formed on the third silicon oxy-nitride layer or on the silicon nitride layer with a CVD method.

Method 8

A first silicon oxide layer with a thickness of between 0.2 and 1.2 microns is formed with a PECVD (Plasma Enhanced Chemical Vapor Deposition) method; next, a second silicon oxide layer with a thickness of between 0.5 and 1 microns is formed on the first silicon oxide layer with a spin-coating method; next, a third silicon oxide layer with a thickness of between 0.2 and 1.2 microns is formed on the second silicon oxide layer with a CVD method; next, a silicon nitride layer with a thickness of between 0.2 and 1.2 microns is formed on the third silicon oxide layer with a CVD method; and next, a fourth silicon oxide layer with a thickness of between 0.2 and 1.2 microns is formed on the silicon nitride layer with a CVD method.

Method 9

A first silicon oxide layer with a thickness of between 0.5 and 2 microns is formed with a HDP-CVD method; next, a silicon nitride layer with a thickness of between 0.2 and 1.2 microns is formed on the first silicon oxide layer with a CVD method; and next, a second silicon oxide layer with a thickness of between 0.5 and 2 microns is formed on the silicon nitride layer with a HDP-CVD method Method 10

A first silicon nitride layer with a thickness of between 0.2 and 1.2 microns is formed with a CVD method; next, a silicon oxide layer with a thickness of between 0.2 and 1.2 microns is formed on the first silicon nitride layer with a CVD method; and next, a second silicon nitride layer with a thickness of between 0.2 and 1.2 microns is formed on the silicon oxide layer with a CVD method.

Method 11

A silicon oxy-nitride layer with a thickness of between 0.05 and 0.15 microns is formed with a CVD method; next, a first silicon oxide layer with a thickness of between 0.2 and 1.2 microns is formed on the silicon oxy-nitride layer with a CVD method; next, a silicon nitride layer with a thickness of between 0.2 and 1.2 microns is formed on the first silicon oxide layer with a CVD method; and next, a second silicon oxide layer with a thickness of between 0.2 and 1.2 microns is formed on the silicon nitride layer with a CVD method.

After forming the passivation layer 18, MOS components and the interconnection structure 14 formed before the formation of the passivation layer 18 can be protected from being damaged by the moisture, by the transmit metals or by the foreign ion contamination. Therefore, it is allowed to employ cheaper process to form the thick and wide metal interconnections and thick polymer layer over the passivation layer 18. And they can be manufactured in the clean room with low class of purity, such as class 100 or over class 100, wherein the definition of the class 100 is that the number of the particles with the diameter of more than 0.5 microns is equal to or exceeds 100 per cubic inch.

After forming the passivation layer 18, a layer of polymer 20 can be deposited over the passivation layer 18. The material for forming the polymer layer is, for example, polyimide from Hitachi-Dupont (HD2732 or HD2734), or polyimide from Asahi (LS800, 1-83005 or 8124). Another material forming the polymer layer 20 may be BenzoCycloButene (BCB), manufactured by Dow Chemical. It is trend that BCB is going to be replaced with polyimide. Parylene, porous insulating material or elastomer, etc can be the material for forming the polymer layer 20.

The material containing epoxy, such as photosensitive epoxy SU-8 manufactured by Sotec Microsystems, can be the material of forming the polymer layer 20 as well. The polymer layer 20 can be deposited by spin-on coating and curing process, as mentioned below: An ester-type precursory polymer layer made of, for example, photosensitive polyimide, is coated over the passivation layer 18 and electrical bond pads 16 by a spin-on coating process; next, the precursory polymer layer can be patterned by a photolithography process such that openings can be formed in the precursory polymer layer and expose the electrical bond pads 16; next, the precursory polymer layer us cured at 380 degrees centigrade for 4 hours in a vacuum or nitrogen ambient.

Alternatively, another process can be employed, as mentioned below: An ester cursory polymer layer made of, for example, non-photosensitive polyimide is first coated over the passivation layer 18 and electric bond pads 16 by spin-on coating process; next, the precursory polymer layer is cured at 380 degree C. for 4 hours in a vacuum or nitrogen ambient; next, the cured polymer layer is patterned by photolithography and etching processes such that openings can be formed in the cured polymer layer and expose the electrical bond pads 16.

If a thicker polymer layer 20 is needed, more than one ester-type precursory polymer layers, such as photosensitive polyimide, can be coated over the passivation layer 18, then patterned by a photolithography process, and then cured at 380 degree C. for 4 hours in a vacuum or nitrogen ambient. Thereby, the polymer layer 20 comprising multiple layers of polymer can be formed over the passivation layer 18.

Alternatively, if a thicker polymer layer 20 is needed, one or more ester-type precursory polymer layers, such as non-photosensitive polyimide, can be coated over the passivation layer 18, then cured at 380 degree C. for 4 hours in a vacuum or nitrogen ambient, and then patterned by photolithography and etching processes. Thereby, the polymer layer 20 comprising multiple layers of polymer can be formed over the passivation layer 18.

Besides, the polymer layer 20 can be formed by screen printing an ester-type precursory polymer layer over the passivation layer 18. While the precursory polymer layer is printed, an area, which is not printed, can be left for forming the openings in the precursory polymer layer exposing the electrical bond pads 16. So, the step of the photolithography process and/or the etching processes can be saved. The material of the precursory polymer layer is, for example, polyimide. Thereafter, the screen-printed precursory polymer layer is cured at 380 degree C. for 4 hours in a vacuum or nitrogen ambient.

Alternatively, the polymer layer 20 can be formed by pressing with heat a dry film with multiple openings formed therein over the passivation layer 18, so that the openings in the polymer layer 20 can be formed not through photolithography or etching process. The openings in the polymer layer 20 expose the electrical bond pads 16. Therefore, the step of the photolithography process and/or the etching process can be saved. Alternatively, the polymer layer 20 can be formed by pressing with heat a dry film without openings formed therein over the passivation layer 18. Next, multiple openings are formed in the pressed dry film by a photolithography process and/or an etching process. The openings in the pressed dry film can expose the electrical bond pads 16.

In another embodiment, The precursory polymer formed by spin-on coating or screen printing can be cured at the highest temperature of lower than 320 degree C. Alternatively, the precursory polymer formed by spin-on coating or screen printing can be cured over 320 degree C. for less than 40 minutes, or even less than 20 minutes.

The thickness of the polymer layer 20, after being cured, may exceed 2 microns, or, for example, range from 2 to 150 microns. It is dependant on the requirement of electronic design. The polymer layer 20, after being cured, should be thicker than any one of the thin film insulating layers or any one of the thin-film metal layers of the interconnection structure 14 by 2 to 500 times. After the curing process, the sidewall of the openings in the polymer layer 20 is sloping. The angle between the sidewall and the horizon is, for instance, 45 degrees or more, such as between 50 and 60 degrees. Basically, the angle is greater than 20 degrees, so that the openings in the polymer layer 20 is shaped like half cones.

Referring to 1b, the greatest transverse dimension of the openings 27 in the polymer layer 20 is greater than that of the corresponding openings 17 in the passivation layer 18, wherein the greatest transverse dimension of the openings 17 of the passivation layer 18 is, for instance, between 0.1 and 50 microns and preferably between 0.5 and 20 microns. The greatest transverse dimension of the electrical bond pads 16 lies, for instance, between 0.1 and 50 microns and preferably between 0.5 and 20 microns. The greatest transverse dimension of the openings 27 in the polymer layer 20 lies, for instance, between 1 micron and 100 microns and preferably between 2 and 30 microns. Thereby, the electrical bond pads 16 exposed by the openings 17 and 27 can be made very small, so the routing ability of the topmost thin-film metal layer under the passivation layer 18 can be enhanced. Furthermore, the parasitic capacitance generated between the electric bond pads 16 and the underlying thin-film metal layer.

Referring to FIG. 1b, after forming the polymer layer 20, a thick metal layer 30 is formed over the polymer layer 20 and inside the openings 27 in the polymer layer 20. A thick and wide metal line 26 of the patterned thick metal layer 30 may connect multiple electric bond pads 16. Referring to FIG. 1b, a signal output from the source 120 of a semiconductor device may be transmitted to one of the electrical bond pads 16 through the thin-film metal layers of the interconnection structure 14, and then passes through the thick and wide metal line 26 to another one of the electrical bond pad 16 (transmission path as indicated by the arrows 40, 42, 44), and finally is transmitted to the gate 119 of another semiconductor device through the thin-film metal layers of interconnection structure 14.

Figure 2A:
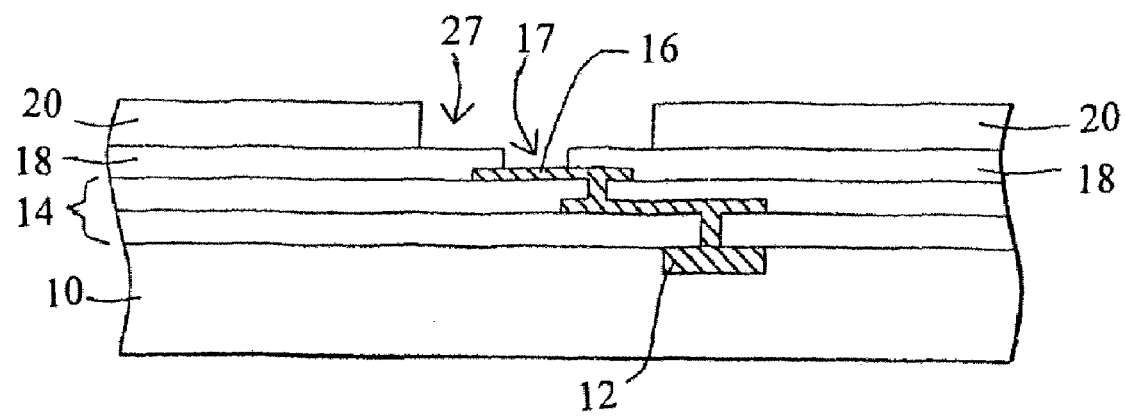
FIGS. 2a-2m are schematically cross-sectional views of various processes for fabricating a thick circuit layer over a passivation layer

The process for forming the patterned thick metal layer 30 as shown in FIG. 1b can be referred to as shown in FIGS. 2a-2f. To simplify the figures, number 12 represents MOS devices containing gate, source and drain, or passive devices, wherein the semiconductor devices 12 can be connected to the electrical bond pads 16 through the interconnection structure 14. The openings 17 in the passivation layer 18 expose the electrical bond pads 16. The polymer layer 20 is formed onto the passivation layer 18 by the above mentioned process. The openings 27 in the polymer layer 20 expose the electrical bond pads 16, as shown in FIG. 2a.

Figure 2B:
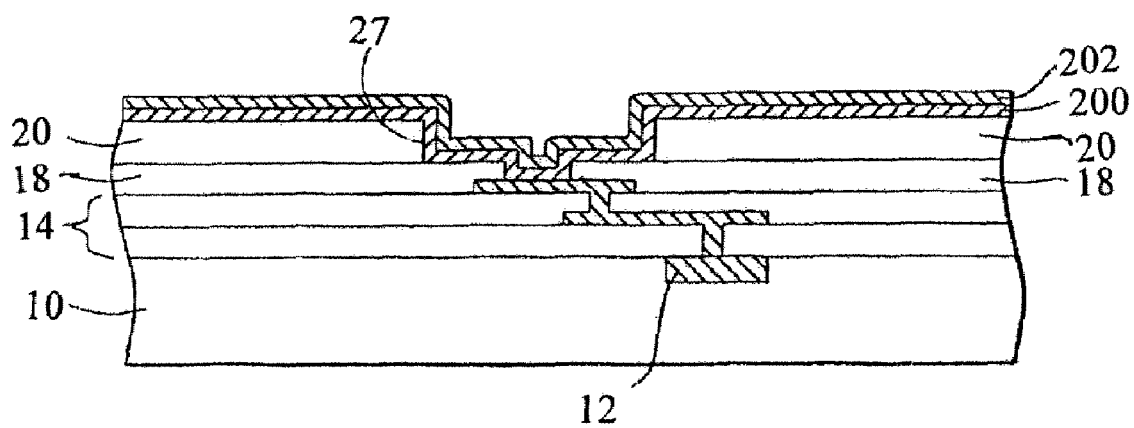

Next, referring to the FIG. 2b, after forming the polymer layer 20 onto the passivation layer 18, an adhesion/barrier layer 200, such as titanium-tungsten alloy, chromium, chromium-copper alloy, titanium, tantalum, tantalum nitride or titanium nitride, having a thickness ranging from 0.01 microns to 3 microns and preferably ranging from 200 angstroms to 5000 angstroms, can be sputtered onto the polymer layer 20, in the openings 17 in the polymer layer 20 and onto the electrical bond pads 16.

Next, a seed layer 202, such as copper, gold, silver, palladium, platinum, rhodium, ruthenium, rhenium, or nickel, having a thickness ranging from 0.01 microns to 3 microns and preferably ranging from 300 angstroms to 10000 angstroms, is formed onto the adhesion/barrier layer 200 by a sputtering process or an electroless plating process.

Figure 2C:
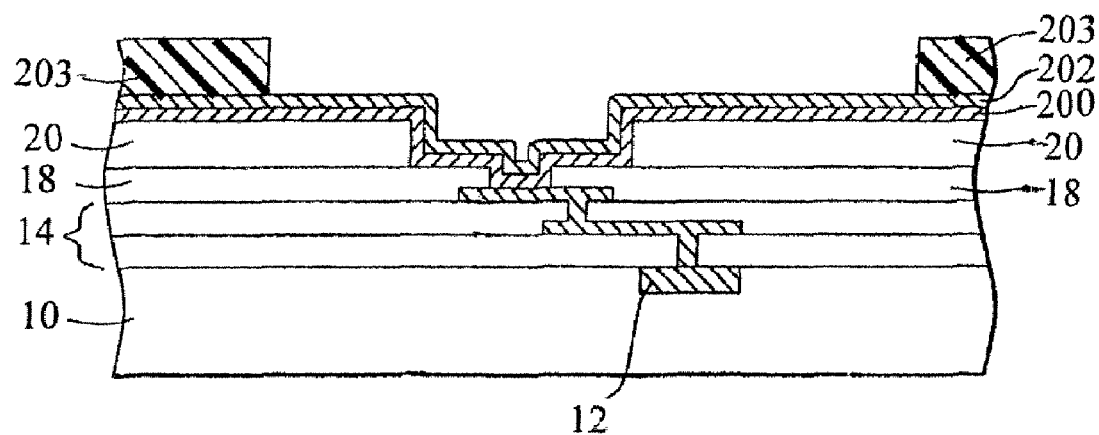

Subsequently, referring to FIG. 2c, a thick photoresist layer 203, such as positive photoresist, napthoquinone diazide, having a thickness of between 8 and 50 microns, can be spin coated onto the seed layer 202, wherein the thickness of the photoresist layer 203 may range from 1 micron to 100 microns. Next, the thick photoresist layer 203 is patterned by a photolithography process including exposing and developing steps to form multiple openings in the thick photoresist layer 203 exposing the seed layer 202, wherein a light (G-line) with a wavelength of between 434 nanometers and 437 nanometers may be used for performing the exposing step. A light (H-line) with a wavelength of between 403 nanometers and 406 nanometers may be used for performing the exposing step. A light (I-line) with a wavelength of between 364 nanometers and 366 nanometers may be used for performing the exposing step. A 1× stepper or aligner is preferably used for performing the exposing step.

Figure 2D:
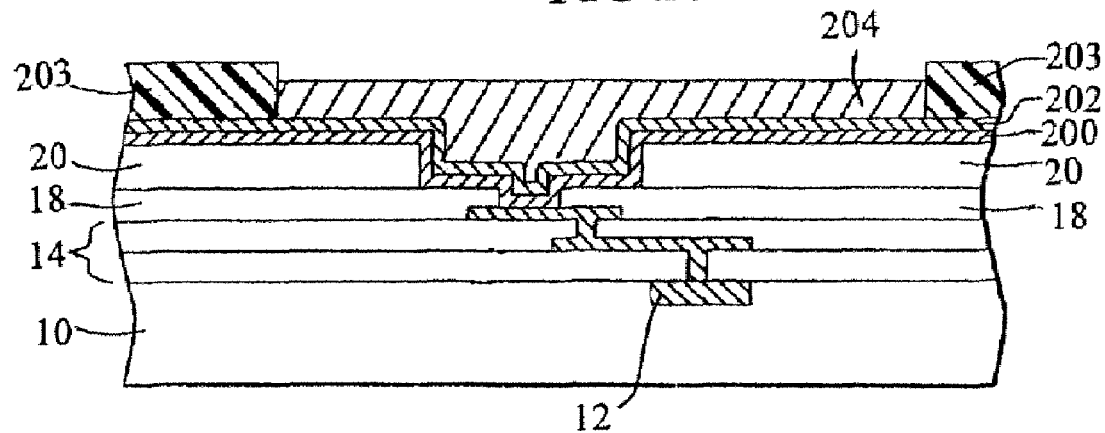

Referring to FIG. 2d, a metal layer 204, such as copper, gold, silver, palladium, platinum, rhodium, rhenium, ruthenium or nickel, having a thickness ranging from 1 micron to 100 microns, and preferably ranging from 2 microns to 10 microns, can be formed onto the seed layer 202 exposed by the openings in the thick photoresist layer 203 by using electroplating or electroless plating process. When the metal layer 204 has greater than 90 or even 99 weight percent of copper and formed by electroplating, the seed layer 202 preferably has greater than 90 or even 99 weight percent of copper.

When the metal layer 204 has greater than 90 or even 99 weight percent of gold and formed by electroplating, the seed layer 202 preferably has greater than 90 or even 99 weight percent of gold.

When the metal layer 204 has greater than 90 or even 99 weight percent of silver and formed by electroplating, the seed layer 202 preferably has greater than 90 or even 99 weight percent of silver.

When the metal layer 204 has greater than 90 or even 99 weight percent of palladium and formed by electroplating, the seed layer 202 preferably has greater than 90 or even 99 weight percent of palladium.

When the metal layer 204 has greater than 90 or even 99 weight percent of platinum and formed by electroplating, the seed layer 202 preferably has greater than 90 or even 99 weight percent of platinum.

When the metal layer 204 has greater than 90 or even 99 weight percent of ruthenium and formed by electroplating, the seed layer 202 preferably has greater than 90 or even 99 weight percent of ruthenium.

When the metal layer 204 has greater than 90 or even 99 weight percent of rheniumnum and formed by electroplating, the seed layer 202 preferably has greater than 90 or even 99 weight percent of rhenium.

When the metal layer 204 has greater than 90 or even 99 weight percent of nickel and formed by electroplating, the seed layer 202 preferably has greater than 90 or even 99 weight percent of nickel.

Figure 2E:
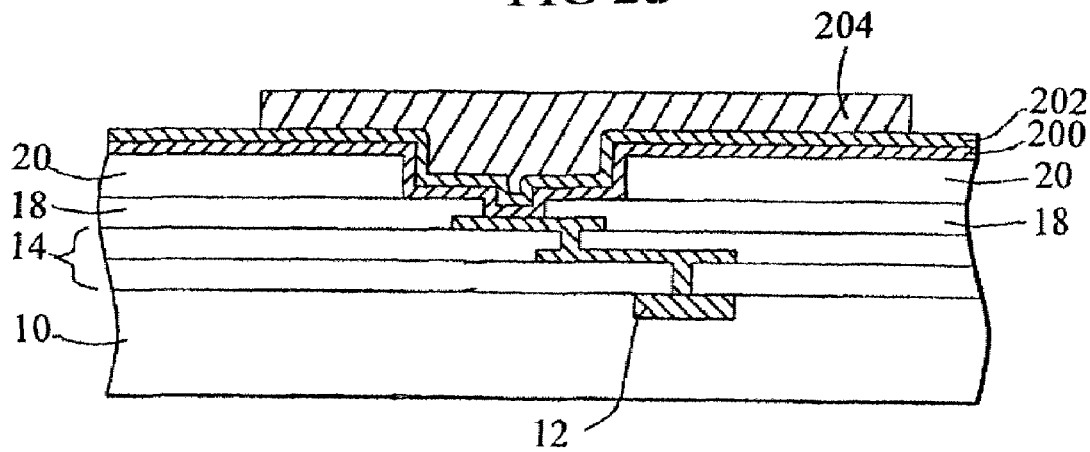
Figure 2F:
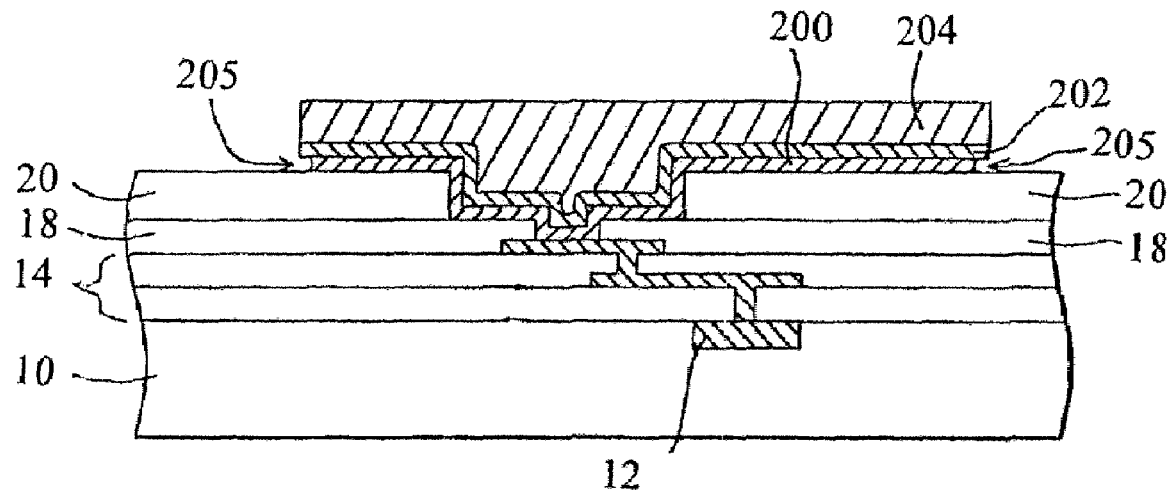

Next, Referring to the FIG. 2e, after forming the metal layer 204, the photoresist layer 203 can be removed. Thereafter, referring to the FIG. 2f, the seed layer 202 and adhesion/barrier layer 200 not under the metal layer 204 are sequently removed by etching process.

The adhesion/barrier layer 200 is removed by self-aligned wet etching process. An undercut 205 can be formed around the adhesion/barrier layer 200 and under the metal layer 204. The lateral depth of the undercut 205 basically ranges about from 0.03 microns to 2 microns and depends on the etching factors and etching time. An interface between the seed layer 202 formed by sputtering process and the metal layer 204 formed by electroplating process is a clear demarcation which can be observed by Transmission Electron microscope (TEM).

Figure 2G:
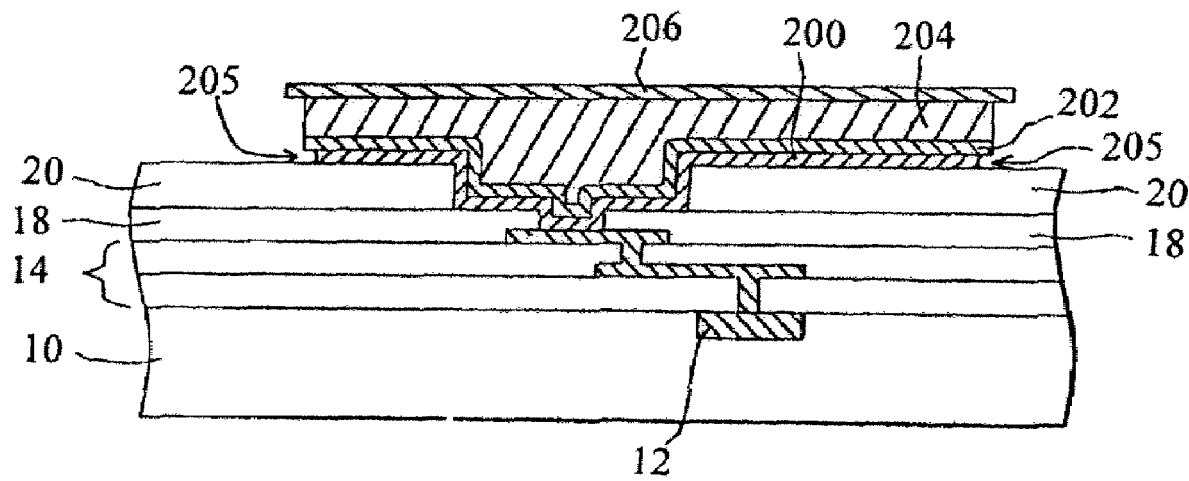

Referring to FIG. 2g, in the above mentioned process, if the material of the metal layer 204 is copper, another metal layer 206 can be formed onto the metal layer 204 in order to protect the metal layer 204 of copper from being corroded, wherein the material of the metal layer 206 may be gold, silver, palladium, platinum, rhodium, ruthenium, rhenium or nickel. The thickness of the metal layer 206 ranges, for example, from 1 micron to 100 microns, and preferably from 2 microns to 10 microns. The thickness of the metal layer 204 ranges, for example, from 1 micron to 100 microns, and preferably from 2 microns to 10 microns.

After the metal layer 204 is formed onto the seed layer 202 exposed by the openings in the photoresist layer 203, as shown in FIG. 2d, the metal layer 206 can be formed onto the metal layer 204 by using electroplating or electroless plating process. Next, a process for removing the photoresist layer 203 can be performed. Next, the seed layer 202 and adhesion/barrier layer 200 not under the metal layers 204 and 206 can be sequently removed by a wet etching process or a dry etching process. Thereby, the bottom surface of the metal layer 206 close to the edge thereof can be exposed after etching the the seed layer 202 and adhesion/barrier layer 200 not under the metal layers 204 and 206.

The thickness of the thick and wide metal line formed over the passivation layer 18 using above mentioned process ranges from 1 micron to 100 microns. The pitch between the neighboring wide and thick metal lines at same a same patterned metal layer can be greater than 2 microns.

Figure 2H:
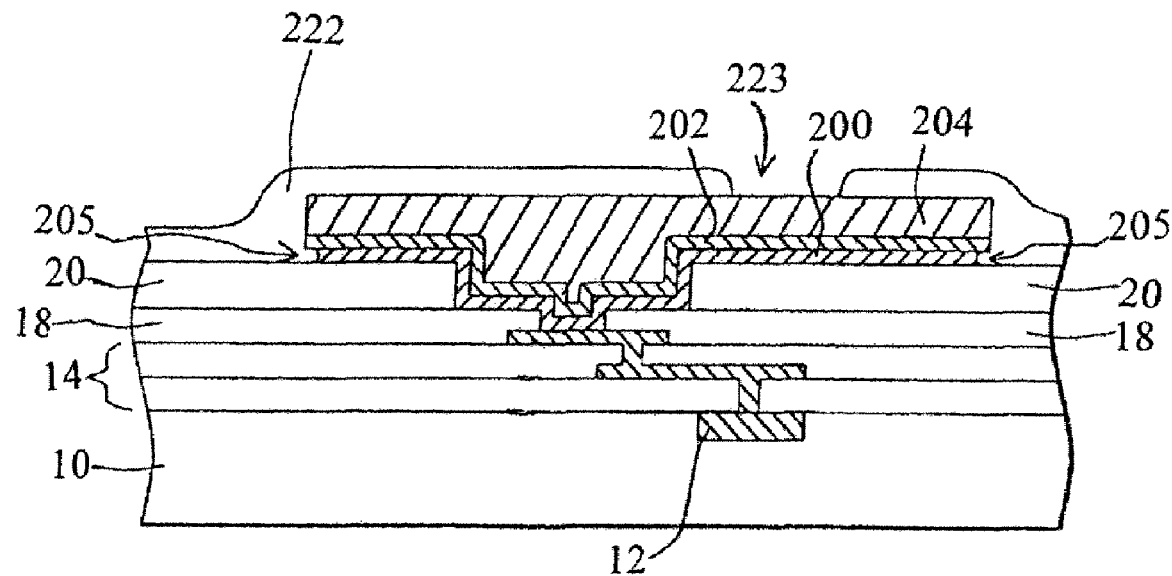

Referring to FIG. 2h, after forming the thick and wide metal line composed of the metal layers 200, 202 and 204 over the polymer layer 20, another polymer layer 222 can be formed onto the thick and wide metal line and the polymer layer 20 in order to protect the thick and wide metal line formed before, wherein the method of forming the polymer layer 222 can be referred to as the previous mentioned method of forming the polymer layer 20. The openings 223 in the polymer layer 222 may expose the bond pads of the thick and wide metal line. Next, tin-containing bumps, such as tin-lead alloy or tin-silver alloy, and gold bumps can be formed over the bond pads exposed by the openings 223 in the polymer layer 222, or gold wires formed by a wire bonding process can be bonded over the bond pads exposed by the openings 223 in the polymer layer 222.

Due to the projecting thick and wide metal line composed of the metal layers 200, 202 and 204, the polymer layer 222 can not be formed with a flat top surface. To resolve the issue, a process for planarizating the polymer layer 222 can cause the polymer layer 222 have a flat top surface, as shown in FIG. 2i, wherein the material of the polymer layer 222 may be, for instance, BenzoCycloButene (BCB), polyimide, parylene, porous dielectric or elastomer, etc.

Figure 2I:
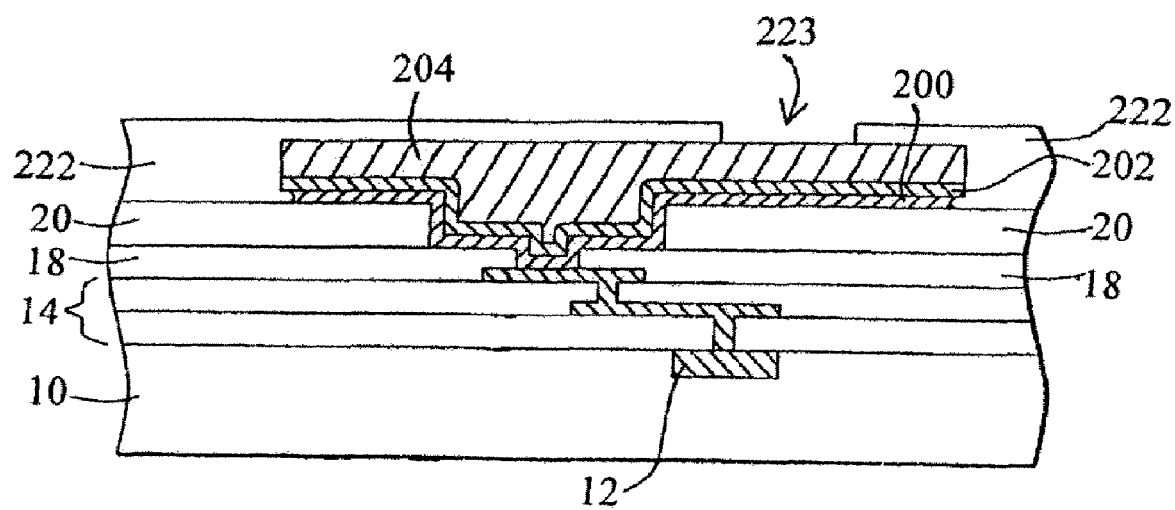

Referring to FIG. 2i, the detailed process, for example, is as follows: After forming the polymer layer 222 over the polymer layer 20 and over the thick metal line composed of the metal layers 200, 202 and 204 by spin-on coating process, the polymer layer 222 can be cured by a heating process, followed by planarizing the top surface of the polymer layer 222 using a Mechanical polishing process (MP) or Chemical mechanical polishing process (CMP), followed by forming the openings 223 in the polymer layer 222 using photolithography and etching processes, the openings 223 exposing the bond pads of the thick and wide metal line composed of the metal layers 200, 202 and 204.

Alternatively, after forming the polymer layer 222 over the polymer layer 20 and over the thick metal line composed of the metal layers 200, 202 and 204 by a spin-on coating process, the top surface of the polymer layer 222 can be planarized by using a Mechanical polishing process (MP) or a Chemical mechanical polishing process (CMP), followed by forming the openings 223 in the polymer layer 222 using photolithography and/or etching processes, the openings 223 exposing the bond pads of the thick and wide metal line composed of the metal layers 200, 202 and 204, followed by curing the polymer layer 222 using a heating process.

Alternatively, after forming the polymer layer 222 over the polymer layer 20 and over the thick metal line composed of the metal layers 200, 202 and 204 by spin-on coating process, the openings 223 in the polymer layer 222 are formed using photolithography and etching processes, the openings 223 exposing the bond pads of the thick and wide metal line composed of the metal layers 200, 202 and 204, followed by planarizing the top surface of the polymer layer 222 using a Mechanical polishing process (MP) or a Chemical mechanical polishing process (CMP), followed by curing the polymer layer 222 using a heating process.

Alternatively, after forming the polymer layer 222 over the polymer layer 20 and over the thick metal line composed of the metal layers 200, 202 and 204 by a spin-on coating process, the openings 223 may be formed in the polymer layer 222 using photolithography and/or etching processes, the openings 223 exposing the bond pads of the thick and wide metal line composed of the metal layers 200, 202 and 204, followed by curing the polymer layer 222 using a heating process, followed by planarizing the top surface of the polymer layer 222 using a Mechanical polishing process (MP) or a Chemical-mechanical polishing process (CMP).

In the above mentioned process for forming the flat polymer layer 222, the conditions of curing the polymer layer 222 can be referred to those for curing the polymer layer 20, as shown in FIG. 1b.

The method for forming the polymer layer 222 disclosed in FIGS. 2h and 2i can be employed to form a polymer layer on the thick and wide metal line composed of metal layers 20, 202, 204 and 206, as shown in FIG. 2g, over the passivation layer 18.

Alternatively, the above-mentioned thick metal line over the passivation layer 18 may only cover partial side wall of the openings in the polymer layer 20. The related process can be referred to the FIGS. 2j and 2k.

Figure 2J:
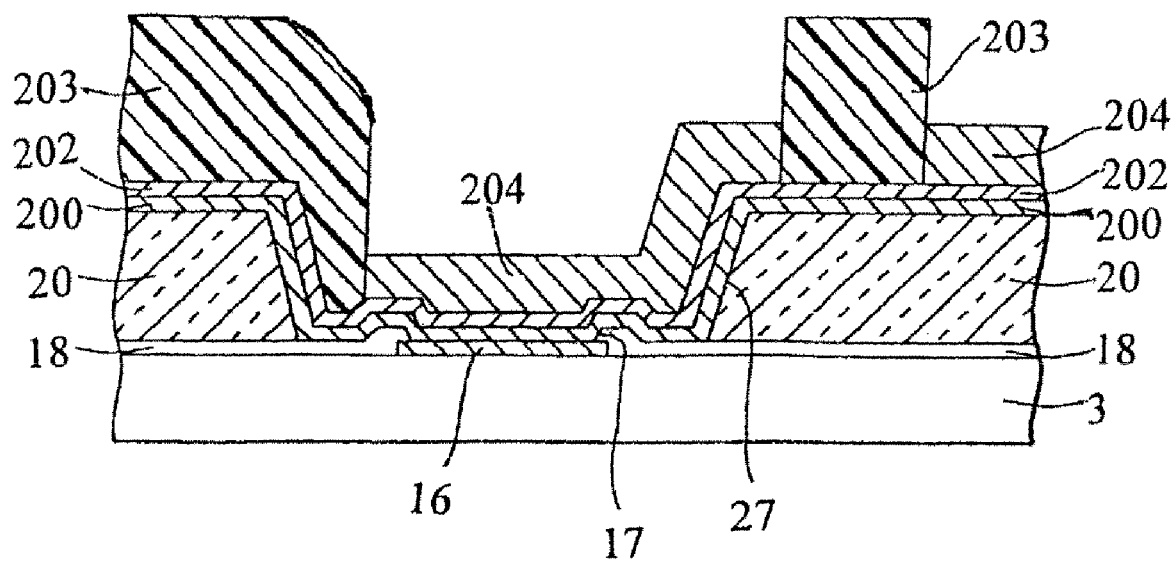

Referring to FIG. 2j, after forming the adhesion/barrier layer 200 and seed layer 202 onto the polymer layer 20, onto the side wall of the openings 27 in the polymer layer 20, and onto the electric bond pads 16 exposed by the openings of the passivation layer 18, A patterned photoresist layer 203 can be formed onto the seed layer 202. A part of the patterned photoresist layer 203 is located in the openings 27 in the polymer layer 20 and covers the seed layer 202 on the side wall of the openings 27, and then, the metal layer 204 can be formed on the seed layer 202 exposed by the openings in the photoresist layer 203.

In this embodiment, the method for forming the adhesion/barrier layer 200, the seed layer 202 and the metal layer 204 and their corresponding material and thickness can be referred to as the above-mentioned elements indicated by a same reference number, as shown in FIGS. 2a-2f.

Figure 2K:
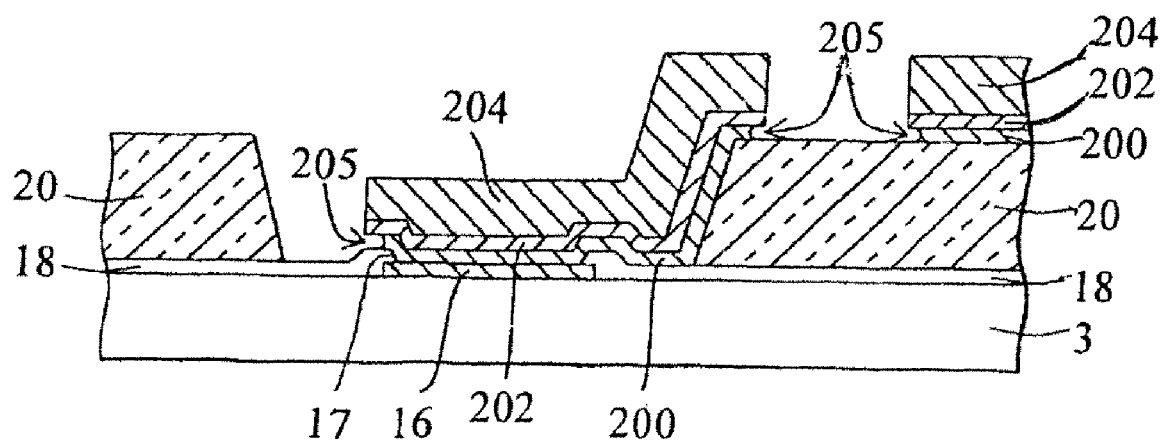

Referring to FIG. 2k, next, the patterned photoresist layer 203 can be removed, and then the seed layer 202 and adhesion/barrier layer 200 not under the metal layer 204 can be removed, wherein an undercut 205 exists below the seed layer and around the adhesion/barrier layer 200. In this embodiment, the size of the undercut 205 can be referred to the description of that shown in FIG. 2f. As a result, the thick metal line located on the passivation layer 18 can only cover a part of the side wall of the openings 27 in the polymer layer 20.

Besides, if the material of the metal layer 204 is copper, another metal layer 206 can be formed onto the metal layer 204 in order to protect the metal layer 204 of copper from being corroded, wherein the material of the metal layer 206 may be, for example, gold, silver, palladium, platinum, rhodium, ruthenium rhenium, or nickel. The thickness of the metal layer 206 ranges, for example, from 1 micron to 100 microns and the thickness of the metal layer 204 ranges, for example, from 1 micron to 100 microns, as shown in FIGS. 2l-2m.

Figure 2L:
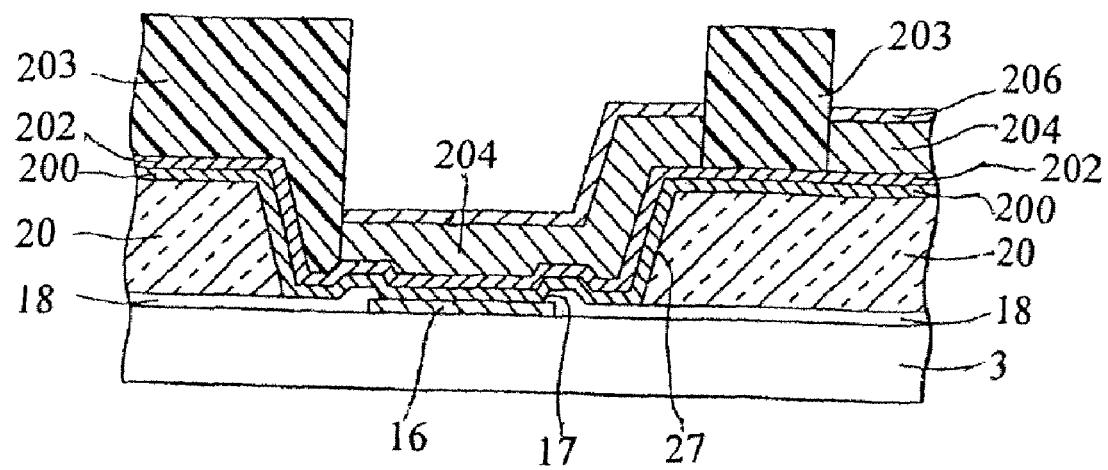
Figure 2M:
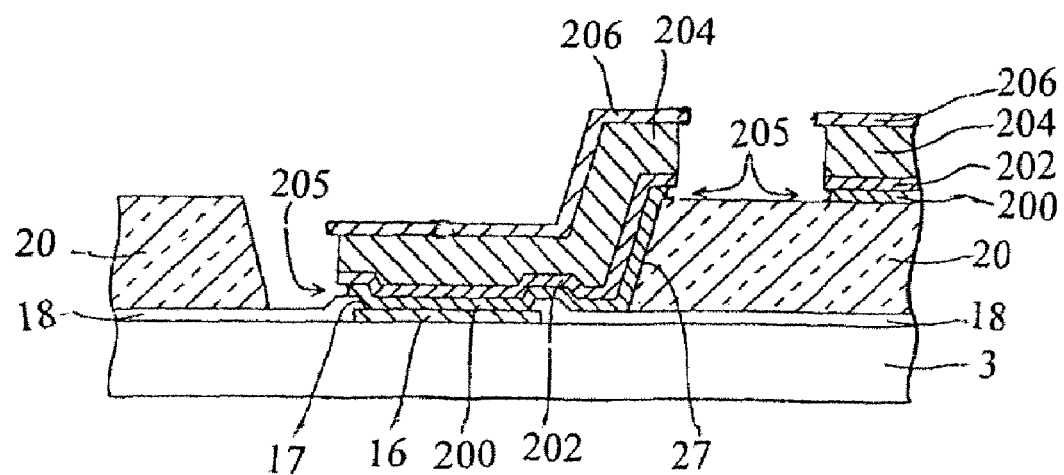

Referring to the FIG. 2l, after the metal layer 204 is formed onto the seed layer 202 exposed by the openings in the photoresist layer 203, as shown in FIG. 2j, the metal layer 206 can also be formed on the metal layer 204 using an electroplating or electroless plating process, followed by, referring to the FIG. 2m, removing the photoresist layer 203. Next, the patterned photoresist layer 203 can be removed, and then the seed layer 202 and adhesion/barrier layer 200 not under the metal layer 204 can be removed, wherein an undercut 205 exists below the seed layer and around the adhesion/barrier layer 200. In this embodiment, the method for forming the adhesion/barrier layer 200, the seed layer 202 and the metal layers 204 and 206 and their corresponding material and thickness can be referred to as the above-mentioned elements indicated by a same reference number, as shown in FIGS. 2a-2g.

Referring to the FIGS. 2j-2m, the greatest transverse dimension of the openings 27 in the polymer layer 20 is greater than that of the openings in the passivation layer 18, wherein the 1 greatest transverse dimension of the openings 17 in the passivation layer 18 ranges, for example, from 0.1 microns to 50 microns and, preferably, from 0.5 microns to 20 microns. The greatest transverse dimension of the openings 27 in the polymer layer 20 ranges, for example, from 1 micron to 100 microns, and preferably from 2 microns to 30 microns.

Figure 3A:
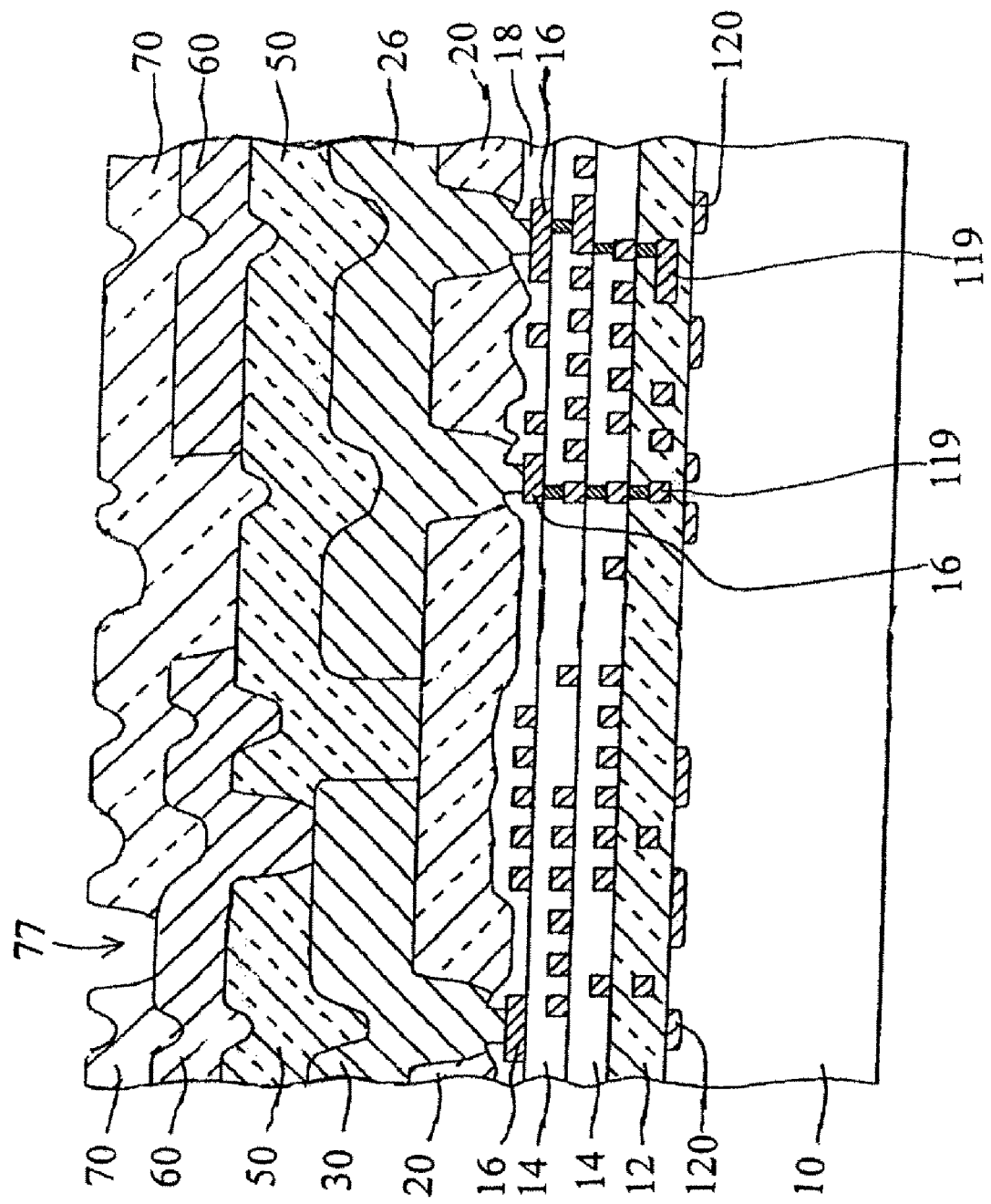
FIGS. 3a and 3b are schematically cross-sectional views of a semiconductor chip having multiple thick circuit layers over a passivation layer.
Figure 3B:
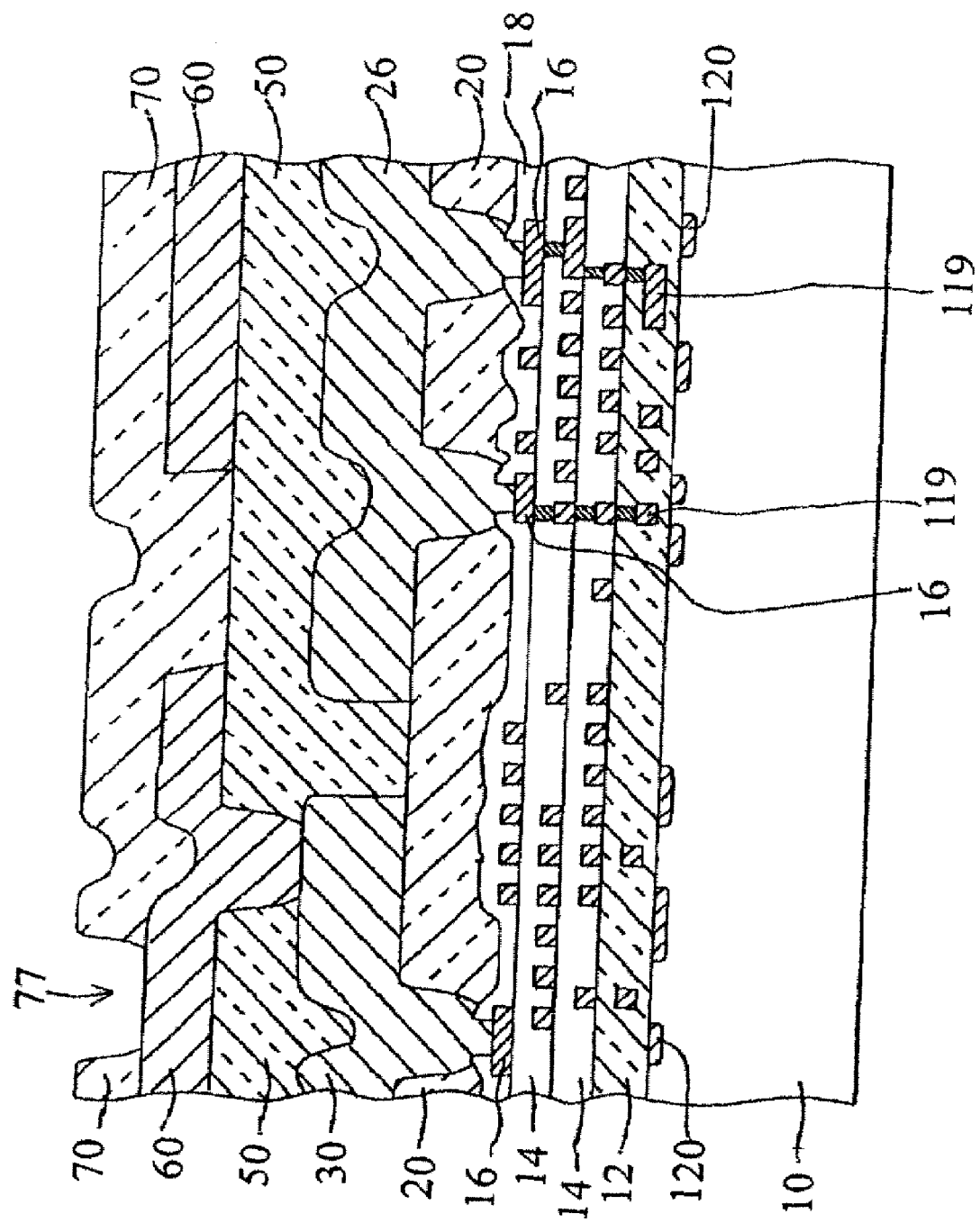

In an embodiment, multiple thick metal layers and multiple thick polymer layers may be formed over the passivation layer, as shown in FIGS. 3a and 3b. Referring to FIG. 3a, a polymer layer 20 is formed on the passivation layer 18. The method of forming the polymer layer 20 and the material thereof can be referred to the above disclosure of the polymer layer 20 shown in FIG. 1b. Next, a thick metal layer 30 is formed on the polymer layer 20 and connected to the electrical bond pads 16 through the openings in the polymer layer 20 and in the passivation layer 18. The method for forming the thick metal layer 30 and the structure thereof can be referred to the above disclosure of the thick metal layer as shown in FIGS. 2a-2g and 2j-2m.

Next, a polymer layer 50 is formed onto the polymer layer 20 and onto the thick metal layer 30, wherein the method for forming the polymer layer 50 and the structure thereof can be referred to the above disclosure of the polymer layer 20 shown in FIG. 1b. Next, a thick metal layer 60 is formed onto the polymer layer 50 and connected to the thick metal layer 30 through the openings of the polymer layer 50. The method for forming the thick metal layer 50 and the structure thereof can be referred to the above disclosure of the thick metal layer as shown in FIGS. 2a-2g and 2j-2m.

Next, a polymer layer 70 is formed onto the polymer layer 50 and onto the thick metal layer 60, wherein the method for forming the polymer layer 70 and the structure thereof can be referred to the above disclosure of the polymer layer 20 shown in FIG. 1b. Openings in the polymer layer 70 may expose the bonding pads of the thick metal layer 60. Next, a tin-containing bump or gold bump can be formed over the bonding pads of the thick metal layer 60. Alternatively, gold wires formed by a wirebonding process can be bonded over bonding pads the thick metal layer 60 exposed by the openings in the polymer layer 70. Thereby, the above-mentioned polymer layer and the above-mentioned thick metal layer can be alternately and repeatedly deposited to form multiple polymer layers and multiple thick metal layers over the passivation layer 18.

Figure 3C:
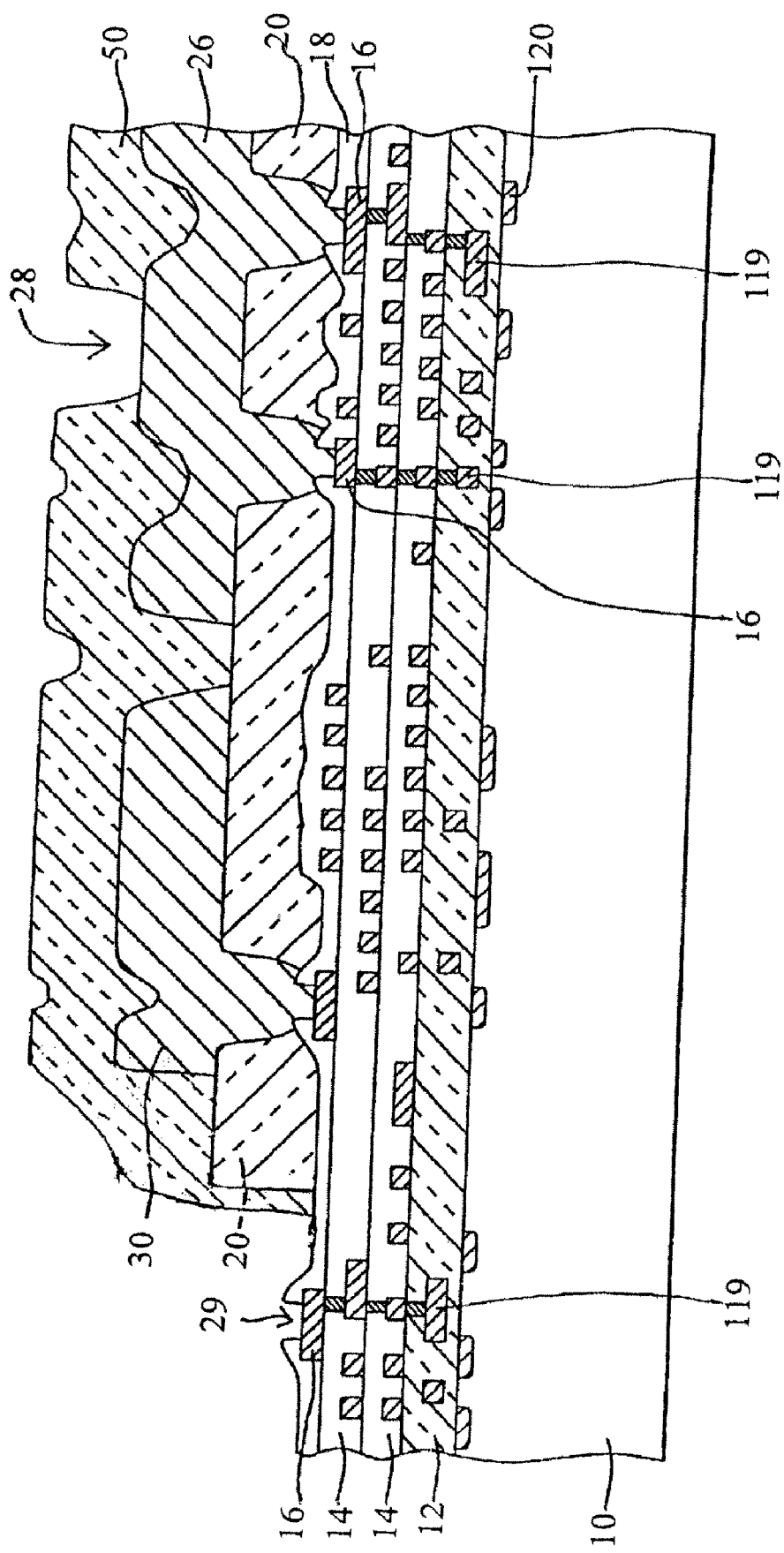
FIG. 3c is a schematically cross-sectional view showing a semiconductor chip having an exposed pad used to be wire-bonded thereto or to have a gold bump or solder bump formed thereon being connected to a thick circuit layer over a passivation layer through a trace under the passivation layer.

In another embodiment, referring to FIG. 3c, a polymer layer 20 is formed on the passivation layer 18. The method of forming the polymer layer 20 and the material thereof can be referred to the above disclosure of the polymer layer 20 shown in FIG. 1b. Next, a thick metal layer 30 is formed on the polymer layer 20 and connected to the electrical bond pads 16 through the openings in the polymer layer 20 and in the passivation layer 18. The method for forming the thick metal layer 30 and the structure thereof can be referred to the above disclosure of the thick metal layer as shown in FIGS. 2a-2g and 2j-2m. Next, a polymer layer 50 is formed onto the polymer layer 20 and onto the thick metal layer 30, wherein the polymer layer 50 covers the sidewall of the polymer layer 20. The polymer layer 50 can be formed by spin-coating a precursory polymer layer on the thick metal layer 30, on the polymer layer 20, on the passivation layer 18 and on the electrical contact pad 16 exposed by the opening 29 in the passivation layer 18, next patterning the polymer layer 50 to remove the precursory polymer layer on the passivation layer 18, to remove the precursory polymer layer on the electrical bonding pads 16 exposed by the opening 29 in the passivation layer 18, and to form an opening 28 in the precursory polymer layer exposing the bonding pad of the thick metal layer 30. The method for forming the polymer layer 50 and the structure thereof can be referred to the above disclosure of the polymer layer 20 shown in FIG. 1b. Next, a tin-containing bump or gold bump can be formed over the bonding pads of the thick metal layer 30 exposed by the openings 28 in the polymer layer 50, or over the bonding pad exposed by the openings 29 in the passivation layer 18. Alternatively, gold wires formed by a wirebonding process can be bonded over the bonding pads of the thick metal layer 30 exposed by the openings 28 in the polymer layer 50, or over the bonding pad exposed by the openings 29 in the passivation layer 18.

Referring to FIGS. 3a, 3b and 3c, the thick metal trace 26 of the thick metal layer 30 over the passivation layer may connect the gates of two MOS devices. The thick metal trace 26 may have a function to transmit a signal, or may be a power bus or a ground bus distributing power and connected to the power bus or ground bus of the thin-film metal layers under the passivation layer 18. The thick metal layers 30 and 60 formed over the passivation layer 18 may be used as a signal trace, power bus or ground bus, which leads an external circuitry, such as printed circuit board, connected with the thick metal layers 30 and 60 to be designed with simple routing.

Figure 3D:
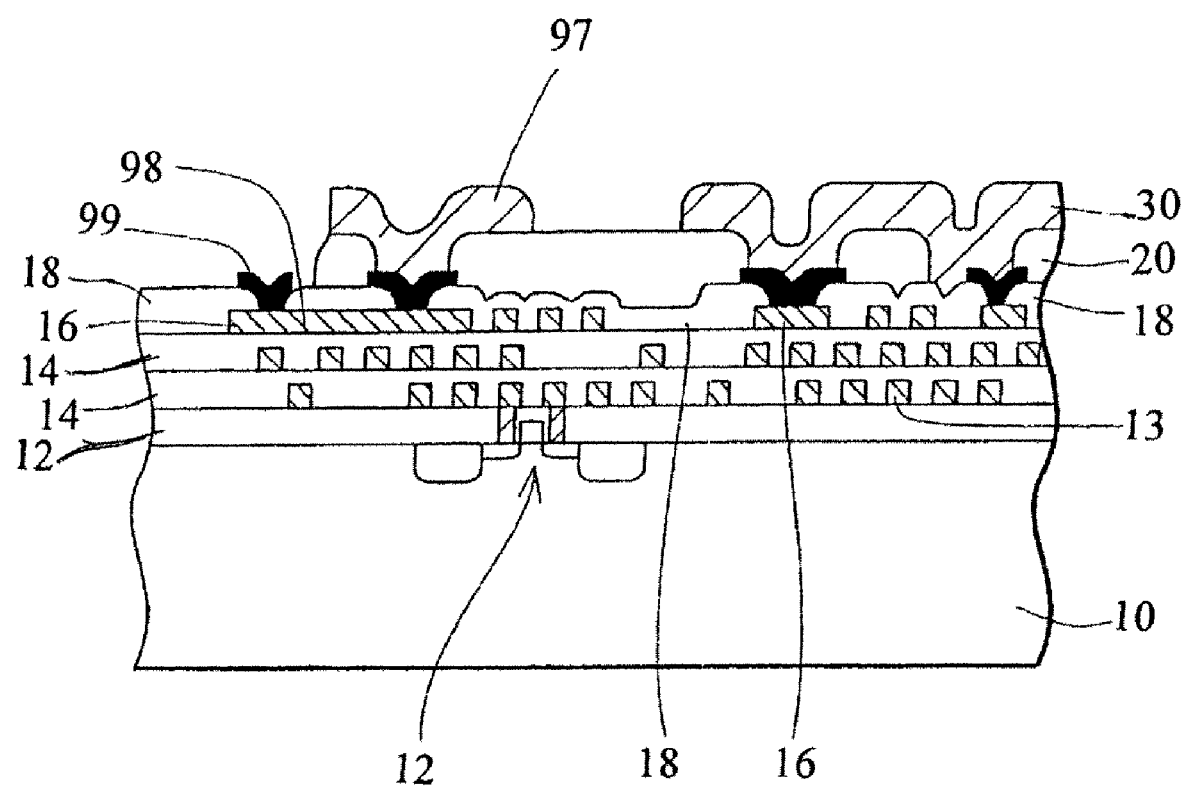

Referring to FIG. 3d, A metal cap 99 (the leftmost one) over the bonding pad exposed by the opening in the passivation layer 18 may be connected to the thick metal line 97 over the passivation layer 18 through an interconnection trace 98 under the passivation layer 18 and with a short distance. The interconnection trace 98 may be formed by, for example, sputtering aluminum or damascening copper. The routing length of the interconnection trace 98 ranges, for instance, from 50 microns to 1000 microns. After forming the thick metal layer 30, tin-containing bumps, such as tin-lead alloy or tin-silver alloy, gold bumps or wires formed by a wire bonding process can be formed onto the metal cap 99 and can connect the metal cap 99 to an external circuitry, such as printed circuit board.

Alternatively, as illustrated in FIGS. 3a, 3b, 3c and 3d, the step of forming the polymer layer 20 can be omitted and thereby the thick metal layer 30 can be formed directly onto and in contact with the passivation layer 18.

FIGS. 4a, 5a, 6a and 7a show the concept of fanning out bond pads, relocating bond pads, reducing the number of bond pads, and increasing the number of bond pads through the printed circuit board PCB, wherein the bond pads are, for example, used for transmitting signals, connecting ground voltage or power voltage. FIGS. 4b, 5b, 6b and 7b show the concept of fanning out bond pads, relocating bond pads, reducing the number of bond pads, and increasing the number of bond pads through the thick and wide metal lines over the passivation layer, wherein the bond pads are, for example, used for transmitting signals, connecting ground voltage or power voltage.

Figure 4A:
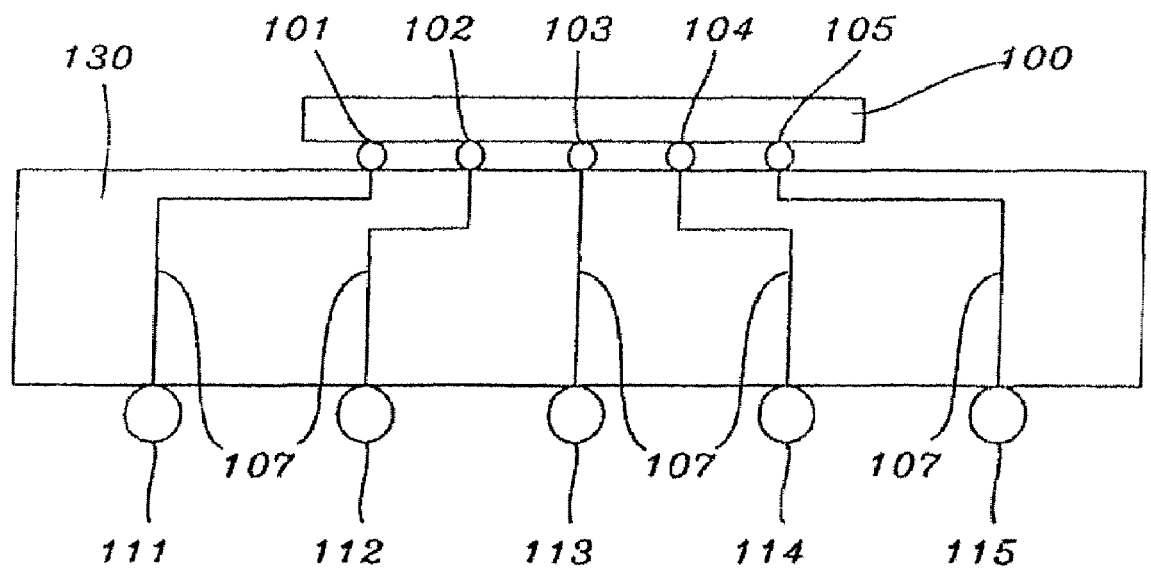
FIG. 4a shows the concept of fanning out a BGA substrate employed in a flip chip package.

FIG. 4a shows the concept of fanning out a BGA substrate employed in a flip chip package. For example, an Integrated Circuit 100 contains five tin-lead bumps 101-105. Through the metal traces 107 within the BGA substrate 130, the tin-lead bump 101 and the planted solder ball 111 having different input/output layouts from a bottom perspective view can be electrically connected with each other. The tin-lead bump 102 and the planted solder ball 112 having different input/output layouts from a bottom perspective view can be electrically connected with each other. The tin-lead bump 104 and the planted solder ball 114 having different input/output layouts from a bottom perspective view can be electrically connected with each other. The tin-lead bump 105 and the planted solder ball 115 having different input/output layouts from a bottom perspective view can be electrically connected with each other. The distance between the neighboring planted solder balls 111-115 is greater than that between the neighboring tin-lead bumps 101-105. The closer to the middle of the semiconductor chip 100 a planted solder ball is, the smaller the lateral distance from a bottom perspective view between the tin-lead bump and the planted solder ball connected with each other is. For instance, the lateral distance from a bottom perspective view between the tin-lead bump 103 and the planted solder ball 113 is smaller than that of the tin-lead bump 101 relating to the planted solder ball 111.

Figure 5A:
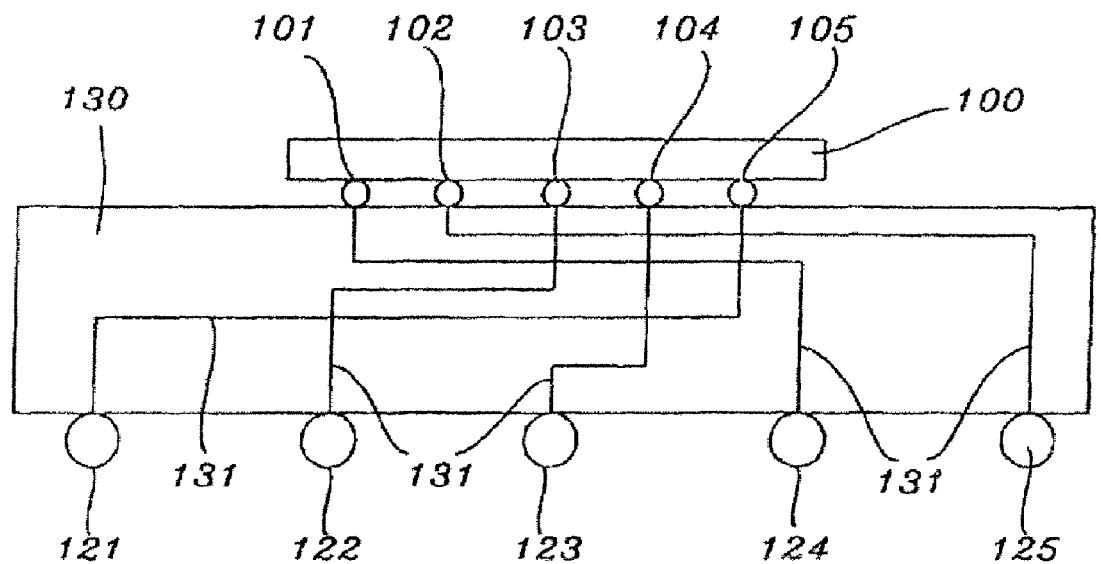
FIG. 5a shows the concept of relocating input/output contact points applied for the connection with a BGA substrate in a flip chip package.

FIG. 5a shows the concept of relocating input/output contact points applied for the connection with a BGA substrate in a flip chip package. For example, an Integrated Circuit 100 contains five tin-lead bumps 101-105. Through the metal traces 131 within the BGA substrate 130, the positions of the tin-lead bumps 101-105 can be relocated to other positions of the planted solder balls 124, 125, 122, 123 and 121, respectively. For example, the leftmost tin-lead bump 101 can be connected to the second right planted solder ball 124 under the BGA substrate 130 through one of the metal traces 131 within the BGA substrate 130.

Figure 6A:
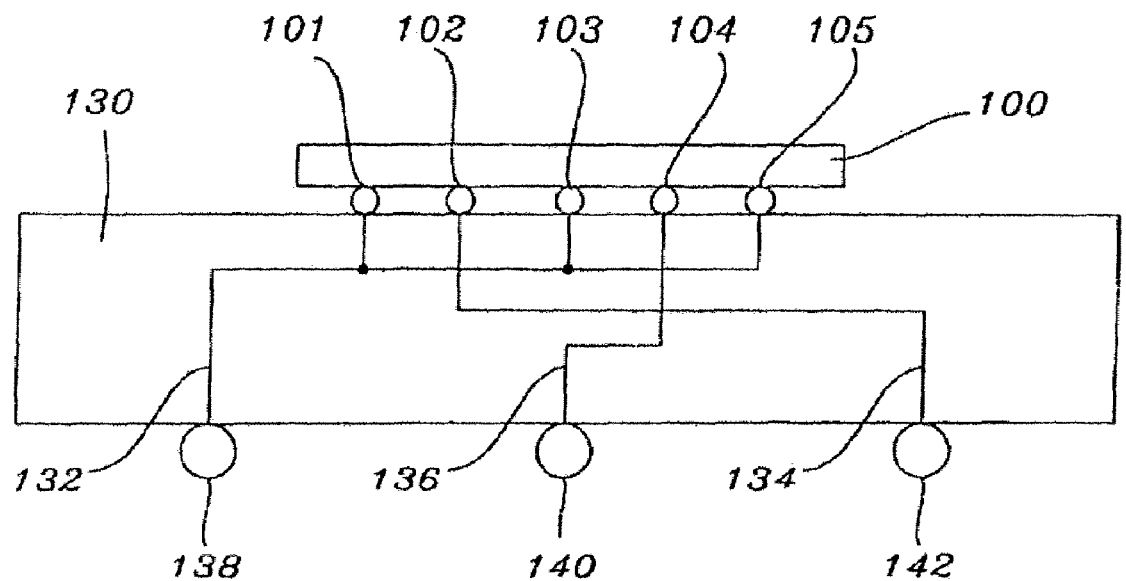
FIG. 6a shows the concept of reducing the total number of the input/output count applied for the connection with a BGA substrate in a flip chip package.

FIG. 6a shows the concept of reducing the total number of the input/output count applied to the connection with a BGA substrate in a flip chip package. For example, an Integrated Circuit 100 contains five tin-lead bumps 101-105, wherein the tin-lead bumps 101-105 can be connected to a BGA substrate 130. As shown in FIG. 6a, the BGA substrate 130 contains three trace units 132, 134 and 136 used for, for instance, the power distribution, ground distribution and signal distribution of the IC, respectively.

The tin-lead bumps 101, 103 and 105 can be connected to a planted solder ball 138 under the BGA substrate 130 through the trace unit 132 within a BGA substrate 130. Other tin-lead bumps 102 and 104 can be relocated to other planted solder balls 142 and 140, respectively. In this embodiment, through the BGA substrate, the total number of the Input/Output contact points used to be connected to the IC 100 can be reduced from 5 to 3.

Figure 7A:
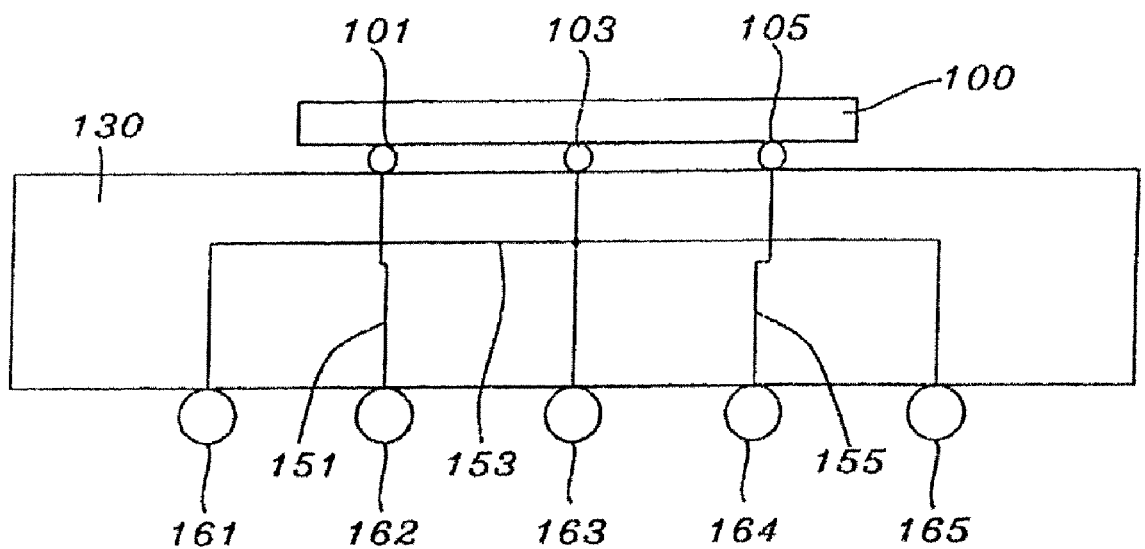
FIG. 7a shows the concept of enhancing the Input/Output contact points applied to the connection with a BGA substrate in a flip chip package.

FIG. 7a shows the concept of enhancing the Input/Output contact points applied to the connection with a BGA substrate in a flip chip package. For example, an IC 100 contains three tin-lead bumps 101-103. As shown in FIG. 7a, the BGA substrate 130 contains three trace units 151, 153 and 155, which are used for the power distribution, ground distribution and signal distribution, respectively.

The tin-lead bump 103 can be connected to three planted solder balls 161, 163 and 165 under the BGA substrate through the trace unit 153 within the BGA substrate 130. Other tin-lead bumps 101 and 105 can be connected to other planted solder balls 162 and 164, respectively. In this embodiment, the total number of the Input/Output contact points used to be connected to the IC 100 can be enhanced from 3 to 5.

The above mentioned functions of the BGA substrate 130 including fanning out layout, relocating layout, reducing the total number of Input/Output counts and enhancing the total number of Input/Output counts, can be realized through forming the above mentioned thick metal lines over the passivation layer 4. According to FIGS. 4b, 5b, 6b and 7b, the concepts of fanning out bond pads, relocating bond pads, reducing or enhancing the total number of Input/Output counts can be realized by forming the above-mentioned thick metal line over the passivation layer 4, mentioned as follows.

Figure 4B:
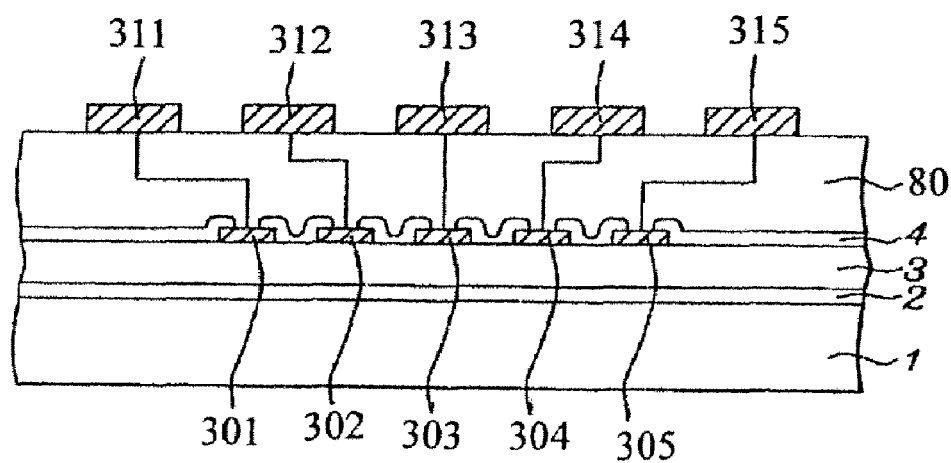
FIG. 4b shows that the thick metal line has the function of fanning out bond pads.

The thick metal lines formed over the passivation layer 4 may have the function of fanning out bond pads, as shown in FIG. 4b. FIG. 4b shows that the thick metal line has the function of fanning out bond pads. The metal bond pads 301-305 exposed by the openings in the passivation layer 4 can be fanned out to external contact points 311-315 respectively through the above mentioned thick metal lines over the passivation layer 4. Multiple tin-lead bumps, gold bumps or wires formed by a wirebonding process can be connected to the external contact points 311-315.

The metal bond pads 301-305 exposed by the openings in the passivation layer 4 can be arranged as an array. In this embodiment, only one row of the array is shown. The metal bond pads 301-305 can be fanned out to external contact points 311-315 in sequence through the above mentioned thick metal lines over the passivation layer 4. The fanned out external contact points 311-315 can also be arranged in an array. This embodiment shows only one row 311-315 of the array of the external contact points. The distance between the neighboring external contact points 311-315 can be greater than that between the neighboring metal bond pads 301-305. The closer to the middle of the semiconductor chip an external contact point is, the smaller the lateral distance from a bottom view between the external contact point and the metal bond pad connected with each other is. For example, the lateral distance from a bottom perspective view between the external contact point 313 and the metal bond pad 303 is smaller than that between the external contact point 311 and the metal bond pad 301.

Figure 5B:
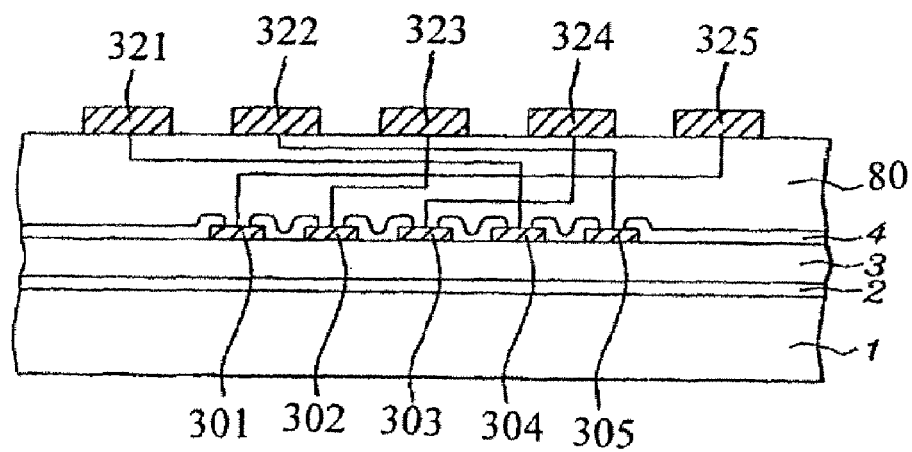
FIG. 5b shows that the above-mentioned thick metal lines have the function of relocating input/output positions and sequence.

The above-mentioned thick metal line formed over the passivation layer 4 may have the function of relocating input/output positions and sequence, as shown in FIG. 5b. FIG. 5b shows that the above-mentioned thick metal lines have the function of relocating input/output positions and sequence. Through the previous mentioned thick metal lines over the passivation layer 4, the metal bond pads 301-305 exposed by the openings of the passivation layer 4 can be connected respectively to the external contact points 325, 323, 324, 321 and 322 whose positions and sequence are different from those of the metal bond pads 301-305. Tin-containing bumps, such as tin-lead alloy or tin-silver alloy, or gold bumps can be formed over the external contact points 321-325. Alternatively, wires formed by a wirebonding process can be bonded over the external contact points 321-325. The distance between the neighboring external contact points 321-325 can be greater than that between the neighboring metal bond pads 301-305.

Figure 6B:
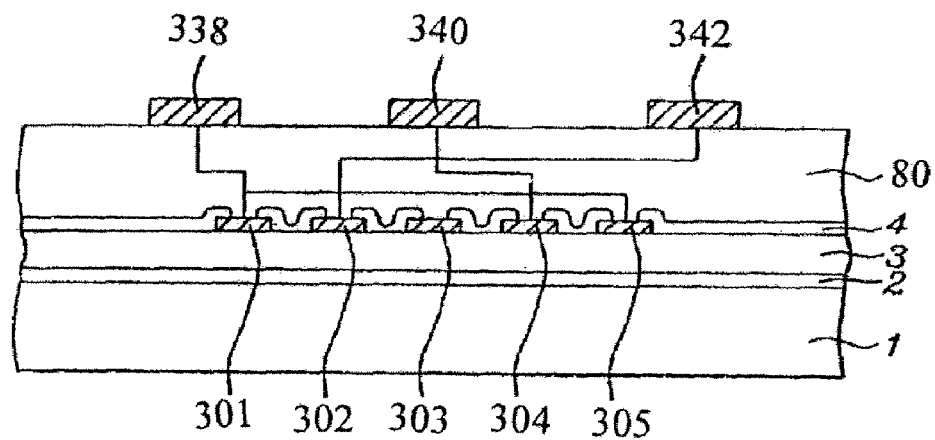
FIG. 6b shows that the thick metal lines have the function of reducing the total number of the input/output count.

The thick metal lines formed over the passivation layer 4 may have a function of reducing the total number of the input/output count of a semiconductor chip, as shown in FIG. 6b. FIG. 6b shows that the thick metal lines have the function of reducing the total number of the input/output count. Through the previous mentioned thick metal lines over the passivation layer 4, the metal bond pads 301 and 305 exposed by the openings of the passivation layer 4 can be connected respectively to one external contact point 338 in order to perform the same function, such as being used for distribution of power voltage, distribution of ground voltage or distribution of signal. The metal bond pads 302 and 304 can be connected respectively to the external contact points 342 and 340. Tin-containing bumps, such as tin-lead alloy or tin-silver alloy, or gold bumps can be formed over the external contact points 338, 340 and 342. Alternatively, wires formed by a wirebonding process can be bonded over the external contact points 338, 340 and 342. In this embodiment, the total number of the external contact points 338, 340 and 342 can be less than that of the metal bond pads 301-305 exposed by the openings in the passivation layer 4. Thereby, the total number of the input/output count for the semiconductor chip can be reduced.

Figure 7B:
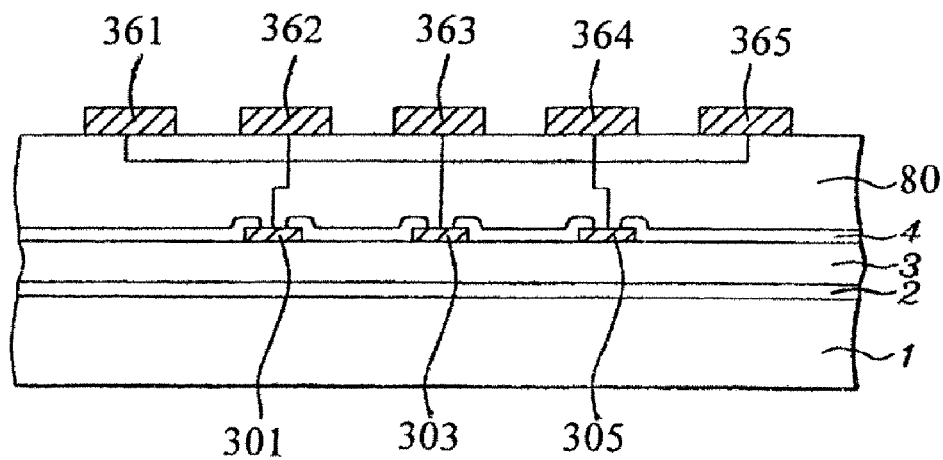
FIG. 7b shows that the thick metal lines have the function of enhancing the total number of the input/output count for a semiconductor chip.

The thick metal lines formed over the passivation layer 4 may have the function of enhancing the total number of the input/output count for a semiconductor chip, as shown in FIG. 7b. FIG. 7b shows that the thick metal lines have the function of enhancing the total number of the input/output count for a semiconductor chip. Through the previous mentioned thick metal lines over the passivation layer 4, one metal bond pad 303 exposed by the openings in the passivation layer 4 can be connected to multiple external contact points 361, 363 and 365 in order to perform the same function, such as being used for the distribution of power voltage, the distribution of ground voltage or the distribution of signal. The metal bond pads 301 and 305 can be connected respectively to the external contact points 362 and 364. Tin-containing bumps, such as tin-lead alloy or tin-silver alloy, or gold bumps can be formed over the external contact points 361-365. Alternatively, wires formed by a wirebonding process can be bonded over the external contact points 361-365. In this embodiment, the total number of the external contact points 361-365 is more than that of the metal bond pads 301, 303 and 305 exposed by the openings in the passivation layer 4. Thereby, the total number of the input/output count for the semiconductor chip can be increased.

Figure 8A:
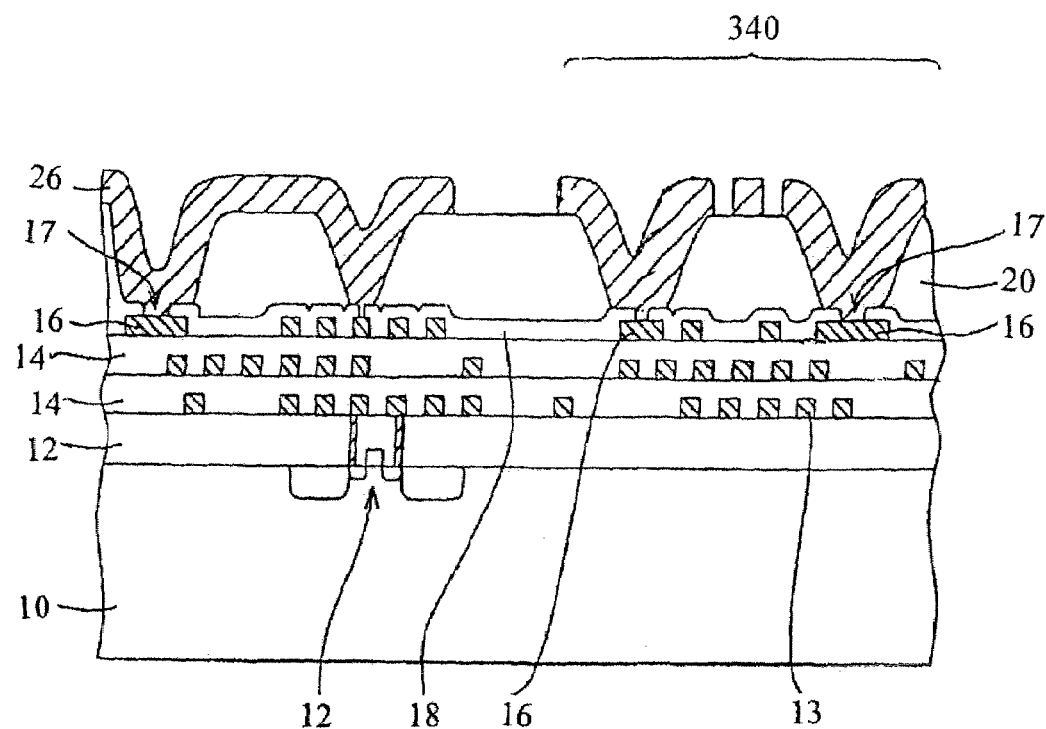
FIGS. 8a and 8b are schematically cross-sectional views showing a semiconductor chip having an inductor over a passivation layer.

In other cases, the above mentioned process of forming the thick metal line over the passivation layer can be used to form an inductor over the passivation layer, as shown in FIG. 8a, wherein the inductor is a horizontally spread coil, for example. After forming a polymer layer 20 onto the passivation layer 18, a thick metal layer can be formed onto the polymer layer 20, whose material and the method for forming the same can be referred to as those of the polymer layer 20 shown in FIG. 1b.

Next, the thick metal layer containing a thick metal line 26 and an inductor 340 is formed on the polymer layer 20 and connected to the electrical bond pads 16 through the openings in the polymer layer 20 and in the passivation layer 18. The detailed structure of the thick metal layer over the passivation layer 18 and the method for forming the same can be referred to as those of the thick metal layer shown in FIGS. 2a-2g and 2j-2m.

In this case, the inductor 340 is a form of a plane, which is parallel to the top surface of the semiconductor substrate 10. The magnetic field created by the inductor or coil 340 is directed in an upper direction vertical to the top surface of the semiconductor substrate 10. The interconnecting structure 14, the passivation layer 18 and the thick polymer layer 20 leads the inductor 340 to be far away from the silicon substrate 10, and thereby an eddy current effect in the semiconductor substrate 10, induced by the inductor 340, can be declined. Therefore, the inductor 340 may have an enhanced quality factor. The inductor 340 can be formed by electroplating metal with low resistance, such as gold, silver or copper, as illustrated in FIGS. 2a-2g and 2j-2m. The thickness of the turns of the inductor 340 can be, for instance, greater than 1 micron and preferably ranges from 2 microns to 10 microns. The space between the neighboring turns of the inductor 340 can be, for instance, greater than 4 microns, and in general, ranges from 0.5 microns to 50 microns. In addition, another polymer layer can be formed on the thick metal line 26 and the inductor 340.

Referring to FIG. 8a, the inductor 340 may have two contact points, both of which are connected to the electrical bond pads 16 exposed by openings in the passivation layer 18. Alternatively, the inductor 340 may have two contact points, one of which is connected to the electrical bond pad 16 exposed by an opening in the passivation layer 18 and the other one of which is connected to an external circuitry, such as printed circuit board or semiconductor chip, through a tin-lead bump, gold bump or a wire formed by a wire bonding process. Alternatively, the inductor 340 may have two contact points, both of which are connected to an external circuitry through tin-lead solder bumps, gold bumps or wires formed by a wire bonding process.

Figure 8B:
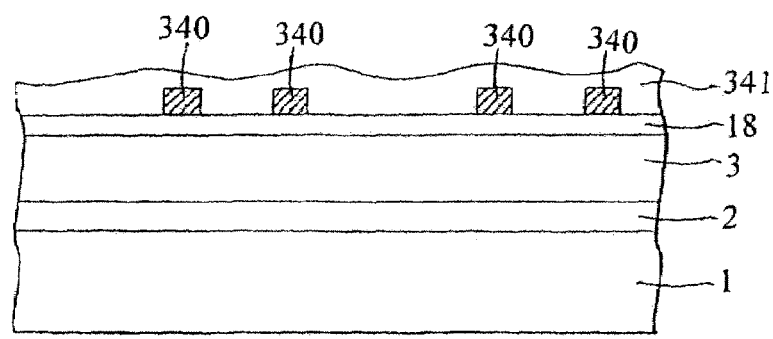

Referring to FIG. 8a, the inductor 340 is formed over the polymer layer 20 and the passivation layer 18. Alternatively, the polymer layer 20 can be saved such that the inductor 340 can be formed directly onto and in touch with the passivation layer 18, as shown in FIG. 8b. The detailed structure of the inductor 340 and the method for forming the same can be referred to as those of the thick metal layer shown in FIGS. 2a-2g and 2j-2m. After forming the inductor 340, a polymer layer 341 can be formed onto the inductor 340 and the passivation layer 18. The material of the polymer 341 and the method of forming the polymer 341 can be referred to as those of the polymer layer 20 shown in FIG. 1b.

Figure 9A:
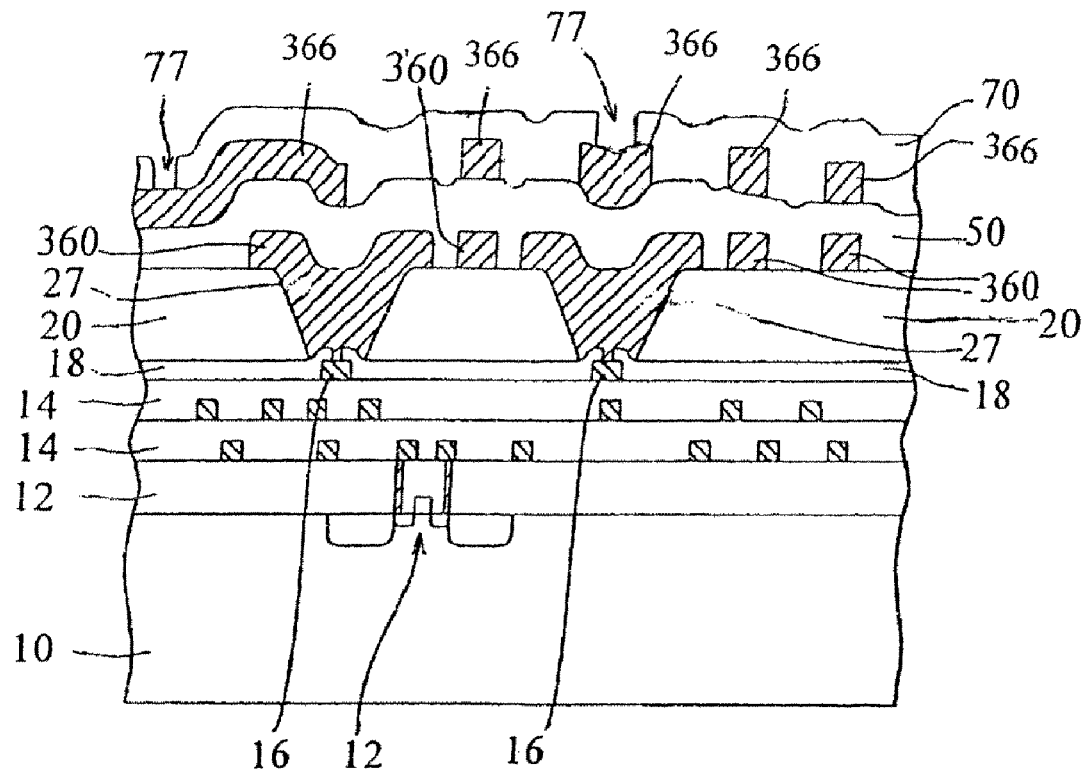
FIGS. 9a-9d are schematically cross-sectional views showing a semiconductor chip having a transformer over a passivation layer.
Figure 9B:
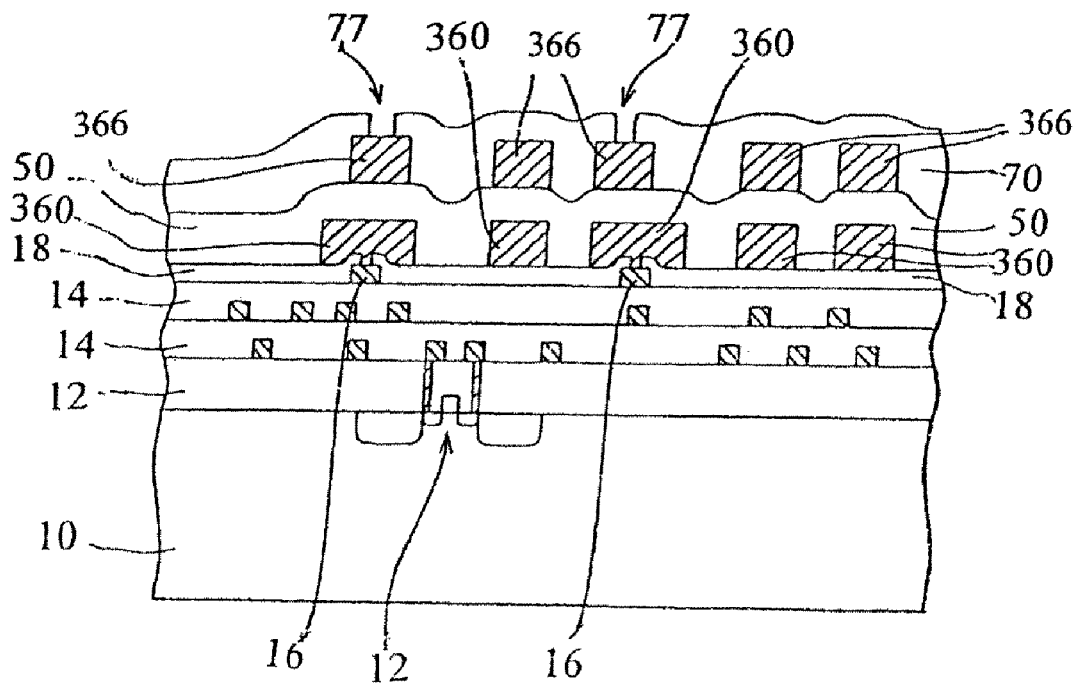

FIGS. 9a-9b show a cross-sectional view of a transformer formed over the passivation layer. The transformer is provided with a bottom coil 360 and a top coil 362, wherein the bottom coil 360 and the top coil 362 can be formed, for example, by using the process for forming the metal line shown in FIGS. 2a-2f or 2j-2k. Alternatively, both are formed by using the process for forming the metal line shown in FIGS. 2g or 2l-2m. Alternatively, the bottom coil 360 is formed, for example, by using the process for forming the metal line shown in FIGS. 2a-2f or 2j-2k and the top coil 362 is formed, for instance, by using the process for forming the metal line shown in FIG. 2g or FIGS. 2l-2m. Alternatively, the bottom coil 360 is formed, for example, by using the process for forming the metal line shown in FIG. 2g or FIGS. 2l-2m and the top coil 362 is formed, for example, by using the process for forming metal line shown in FIGS. 2a-2f or 2j-2k.

Two contact points connected to the bottom coil 360 are connected, for example, to the metal bond pads 16 exposed by the openings in the passivation layer 18. Two contact points connected to the top coil 362 can be connected, for instance, to an external circuitry, such as a printed circuit board (PCB), or another semiconductor chip, through tin-lead bumps or gold bumps formed on the two contact points, or alternatively through gold wires formed by a wire bonding process.

Figure 9C:
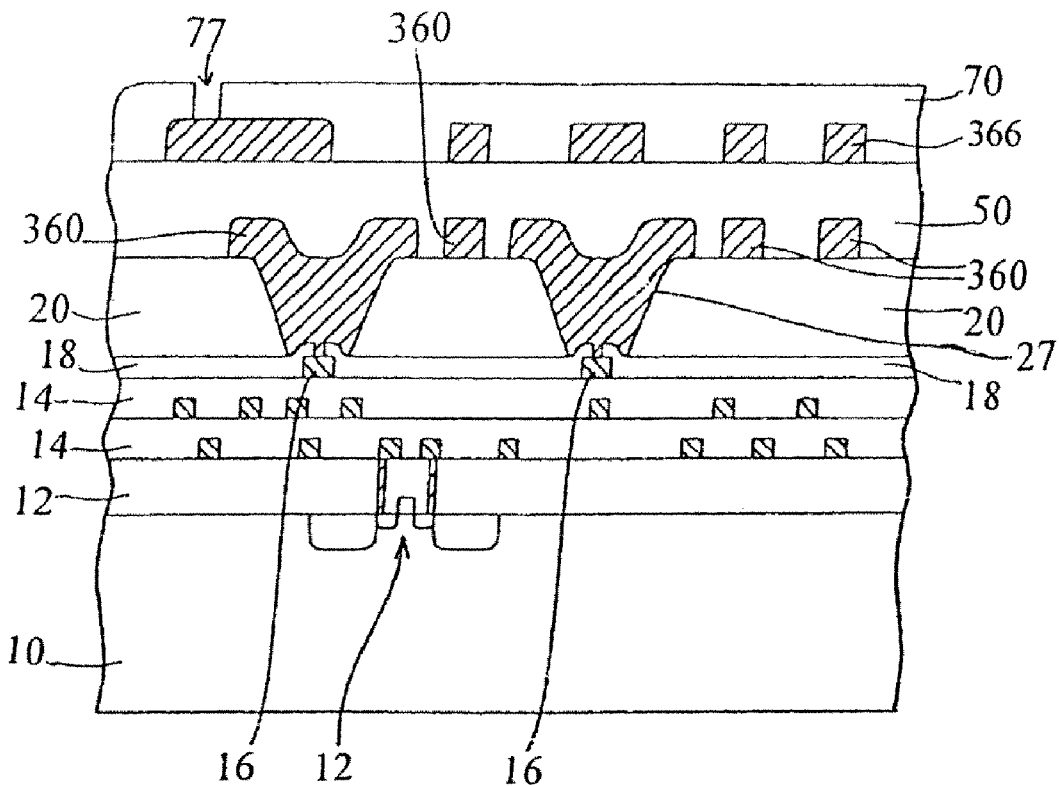

In this embodiment, the bottom coil 360 can be formed, for instance, on the polymer layer 20 on the passivation layer 18, as shown in FIGS. 9a and 9c, wherein the material of the polymer layer 20 and the method for forming the same can be referred to as those of the polymer 20 shown in FIG. 1b. Alternatively, the polymer layer 20 can be saved such that the bottom coil 360 can be formed directly onto and in touch with the passivation layer 18, as shown in FIGS. 9b and 9d.

Figure 9D:
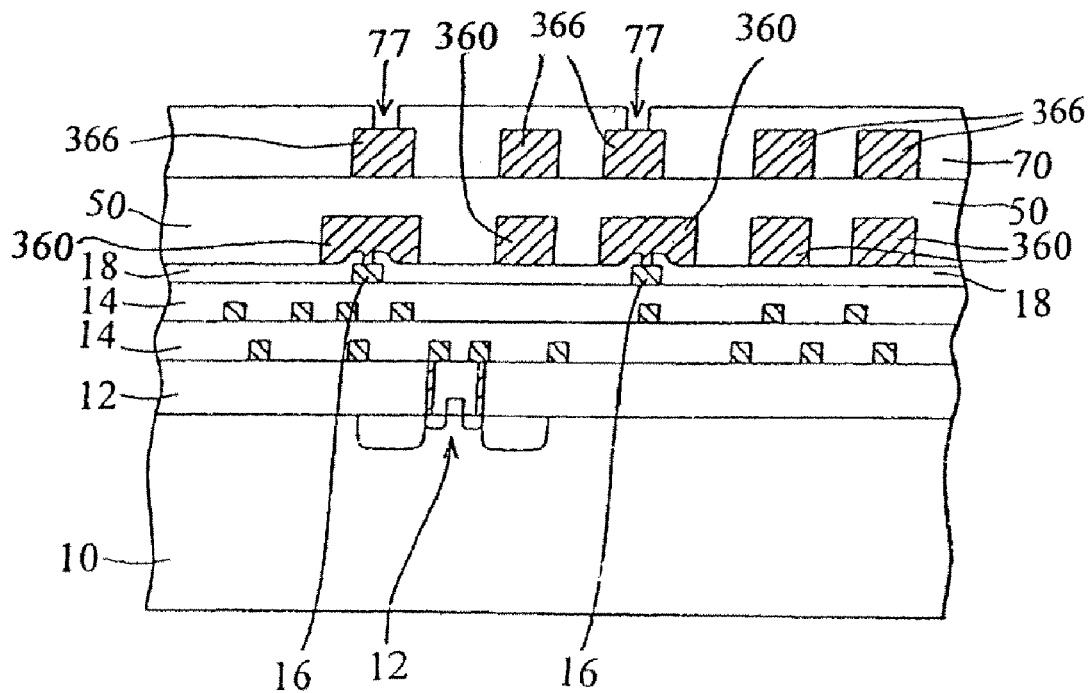

After forming the bottom coil 360 onto the passivation layer 18 or onto the polymer layer 20, a polymer layer 50 can be formed onto the bottom coil 360, as shown in FIGS. 9a-9d. If a high-precision process is not needed for forming the transformer or coupler, the material and the method of forming the polymer layer 50 can be referred to those of the polymer layer 20 shown in FIG. 1b and the above mentioned step of planarizing the top surface of the polymer layer 50 can be saved. The polymer layer 50 is provided with a relatively uneven top surface. Because the following-formed top coil 362 is formed onto the uneven top surface of the polymer layer 50, the transformer or coupler can not reach a relatively high precision, as shown in FIGS. 9a and 9b. If a high-precision process is needed for forming the transformer or coupler, the material of the polymer layer 50 and the method for forming the same can be referred to as those of the polymer layer 222 shown in FIG. 2i. The step of planarizing the top surface of the polymer layer 50 can be performed by a Mechanical Polishing (MP) process or a Chemical Mechanical Polishing (CMP) process. Because the following formed top coil 362 is formed onto the flat top surface of the polymer layer 50, the transformer can reach a relatively high precision, as shown in FIGS. 9c and 9d.

After forming the top coil 360 onto the polymer layer 50, a polymer layer 70 can be formed on the top coil 362, as shown in FIGS. 9a-9d. Openings 77 in the polymer layer 70 expose two contact points connected to the top coil 362. Through tin-lead bumps or gold bumps formed on the two contact points exposed by the openings 77, or through gold wires formed by a wire bonding process bonded onto the two contact points exposed by the openings 77, the top coil 362 can be connected to, for example, an external circuitry, such as a printed circuit board (PCB) or another semiconductor wafer. The material of the polymer layer 70 and the method for forming the same can be referred to as those of the polymer layer 20 shown in FIG. 1b and the step of planarizing the top surface of the polymer layer 70 can be omitted. Thereby, the polymer layer 70 is provided with a relatively uneven top surface, as shown in FIGS. 9a and 9b. The material of the polymer layer 70 and the method for forming the same can be referred to as those of the polymer layer 222 shown in FIG. 2i and the step of planarizing the top surface of the polymer layer 70 can be performed by a Mechanical Polishing (MP) process MP or a Chemical Mechanical Polishing (CMP) process, as shown in FIGS. 9c and 9d.

Figure 10A:
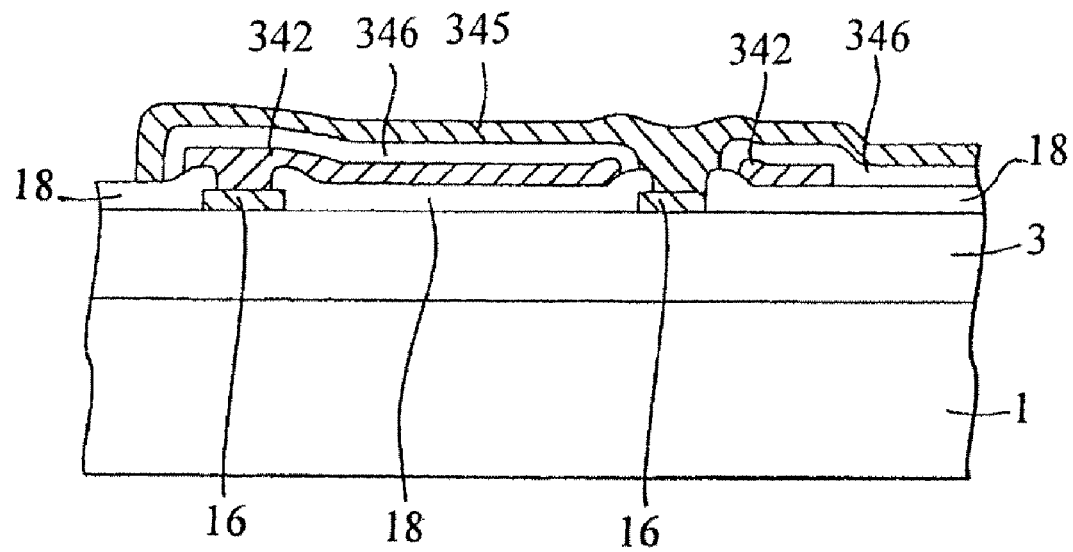
FIGS. 10a-10c are schematically cross-sectional views showing a semiconductor chip having a capacitor over a passivation layer.
Figure 10B:
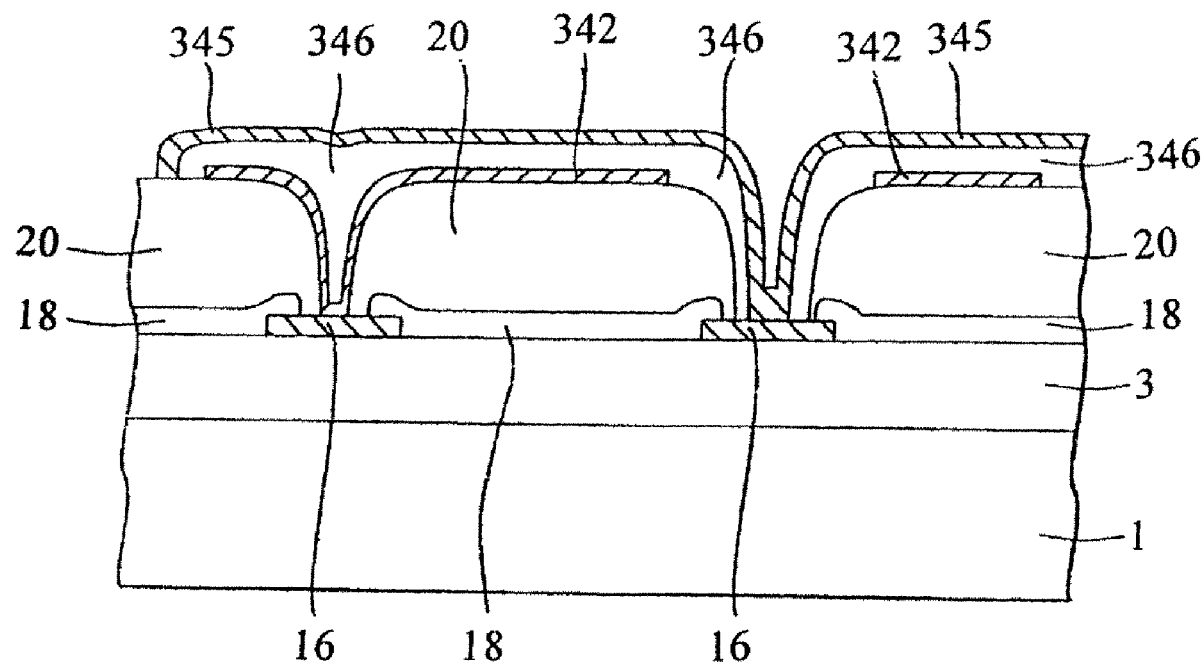
Figure 10C:
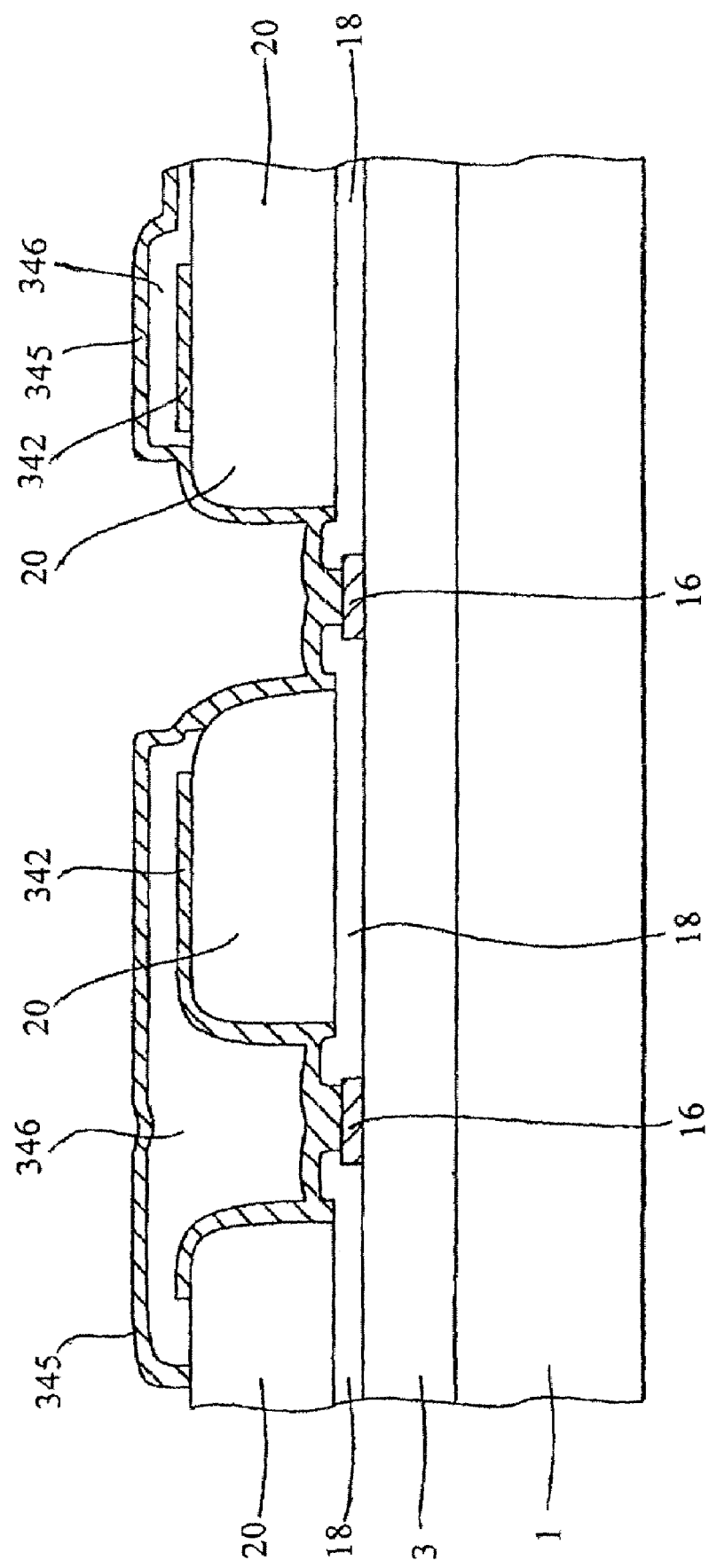

FIGS. 10a-10c show cross-sectional views of capacitors formed over a semiconductor wafer, wherein the capacitor is formed on the passivation layer 18 or on the polymer layer 20. The capacitor comprises a bottom electrode 342, a dielectric layer for capacitor 346 and a top electrode 345, wherein the method of forming the top electrode 345 and the bottom electrode 342 can be referred to as the process for forming the thick metal line shown in FIGS. 2a-2f or FIGS. 2l-2m. Alternatively, the method of forming the top electrode 345 and the bottom electrode 342 can be referred to as the process for forming the thick metal line shown in FIG. 2g or FIGS. 2l-2m. Alternatively, the method of forming the bottom electrode 342 can be referred to as the process for forming the thick metal line shown in FIGS. 2a-2f or FIGS. 2j-2k, and the method of forming the top electrode 345 can be referred to as the process for forming the thick metal line shown in FIG. 2g or FIGS. 2l-2m. Alternatively, the method of forming the bottom electrode 342 can be referred to as the process for forming the thick metal line shown in FIG. 2g or FIGS. 2l-2m, and the method of forming the top electrode 345 can be referred to as the process for forming the thick metal line shown in FIGS. 2a-2f or FIGS. 2j-2k.

A dielectric layer for capacitor 346 is formed, for example, by a chemical vapor deposition (CVD) process or by a physical vapor deposition (PVD) process. The material of the dielectric layer for capacitor 346 is, for example, titanium dioxide ($TiO_2$), tantalum pentoxide ($Ta_2O_5$), a polymer material, silicon nitride ($Si_3N_4$) or silicon oxide ($SiO_2$), tetraethyl orthosilicate (TEOS), strontium titanate, and etc. The dielectric layer for capacitor 346 may have a thickness ranging, for example, from 500 Angstroms to 50,000 Angstroms.

In this embodiment, the bottom electrode 342 is formed, for example, on the polymer layer 20 on the passivation layer 18, as shown in FIGS. 10b and 10c, wherein the material of the polymer layer 20 and the process for forming the same can be referred to as those of the polymer layer 20 shown in FIG. 1b; Alternatively, the step of forming the polymer layer 20 can be saved such that the bottom electrode 342 can be formed directly onto and in touch with the passivation layer 18, as shown in FIG. 10a. In this case, a polymer layer can be optionally formed on the top electrode 345 of the capacitor to protect the capacitor. The material of the polymer layer on the top electrode 345 and the method for forming the same can be referred to those of the polymer layer 20 shown in FIG. 1b.

Referring to FIGS. 10a-10c, the bottom electrode 342 and the top electrode 345 of the capacitor are connected to the electrical bond pads 16 exposed by the openings in the passivation layer 18. Alternatively, the bottom electrode 342 of the capacitor is connected to one of the electrical bond pads 16 exposed by the openings in the passivation layer 18, and the top electrode 345 of the capacitor is connected to an external circuitry through a tin-lead bump, a gold bump or a wire formed by a wire bonding process and is not connected to the electrical bond pads 16 exposed by the openings in the passivation layer 18.

Alternatively, the top electrode 345 of the capacitor is connected to one of the electrical bond pad 16 exposed by the openings in the passivation layer 18, and the bottom electrode 342 of the capacitor is connected to an external circuitry through a tin-lead bump, a gold bump or a wire formed by a wire bonding process and is not connected to the electrical bond pads 16 exposed by the openings in the passivation layer 18. Alternatively, both of the bottom electrode 342 and the top electrode 345 of the capacitor can be connected to an external circuitry through a tin-lead bump, a gold bump or a wire formed by a wire bonding process and can not be connected to the electrical bond pads 16 exposed by the openings within the passivation layer 18.

Referring to the FIGS. 10a-10c, the capacitor is formed over the passivation layer 18 and far away from the semiconductor substrate 1, so the parasitic capacitance between the capacitor and the semiconductor substrate 1 can be declined. Moreover, the two electrodes 342 and 345 with great thicknesses and great areas can be formed by using the previously mentioned process such that the resistance of the two electrodes 342 and 345 of the capacitor can be reduced. As a result, it can be applied especially in a wireless product.

Referring to the FIGS. 10b and 10c, the polymer layer 20 can be formed onto the passivation layer 18. The openings are formed in the polymer layer 20 using a photolithography process and expose the electrical bond pads 16. As shown in FIG. 10b, at least one of the openings in the polymer layer 20 has a traverse dimension or width less than that of the underlying aligned opening in the passivation layer 18. The polymer layer 20 covers a part of the electrical bond pads 16 exposed by the openings in the passivation layer 18.

Alternatively, as shown in FIG. 10c, at least one of the openings in the polymer layer 20 has a traverse dimension or width greater than that of the underlying aligned opening in the passivation layer 18. The openings in the polymer layer 20 expose the whole area of the underlying aligned electrical bond pads 16 exposed by the openings in the passivation layer 18.

Due to the disposition of the polymer layer 20 between the capacitor and the passivation layer 18, the capacitor can be moved upwards in a distance same as the thickness of the polymer layer 20, so that the capacitor can be farther away from the semiconductor substrate 1. As a result, the parasitic capacitance between the bottom electrodes 342 of the capacitor and the semiconductor substrate 1 can be declined.

Figure 11A:
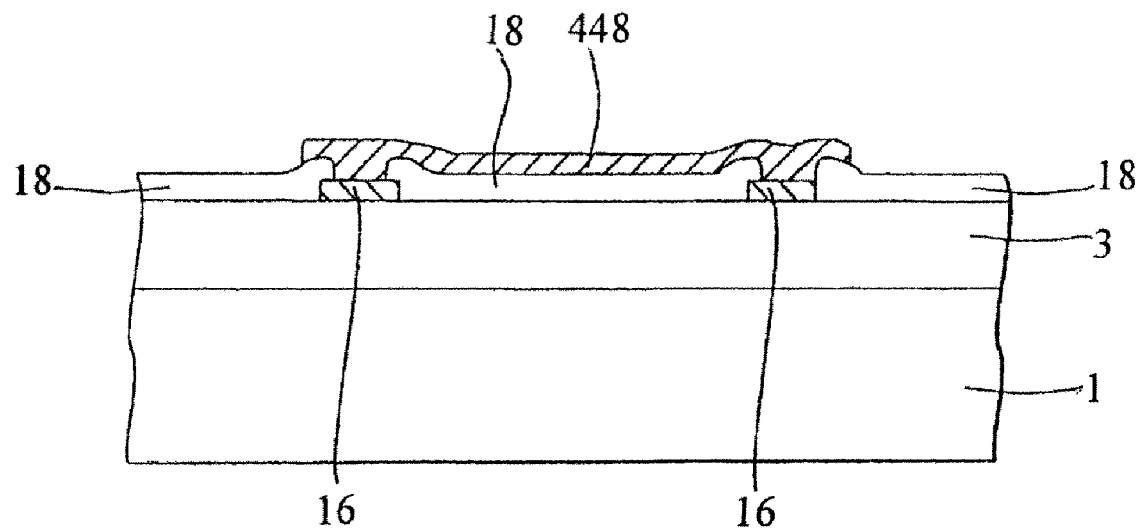
FIGS. 11a-11c are schematically cross-sectional views showing a semiconductor chip having a resistor over a passivation layer.
Figure 11B:
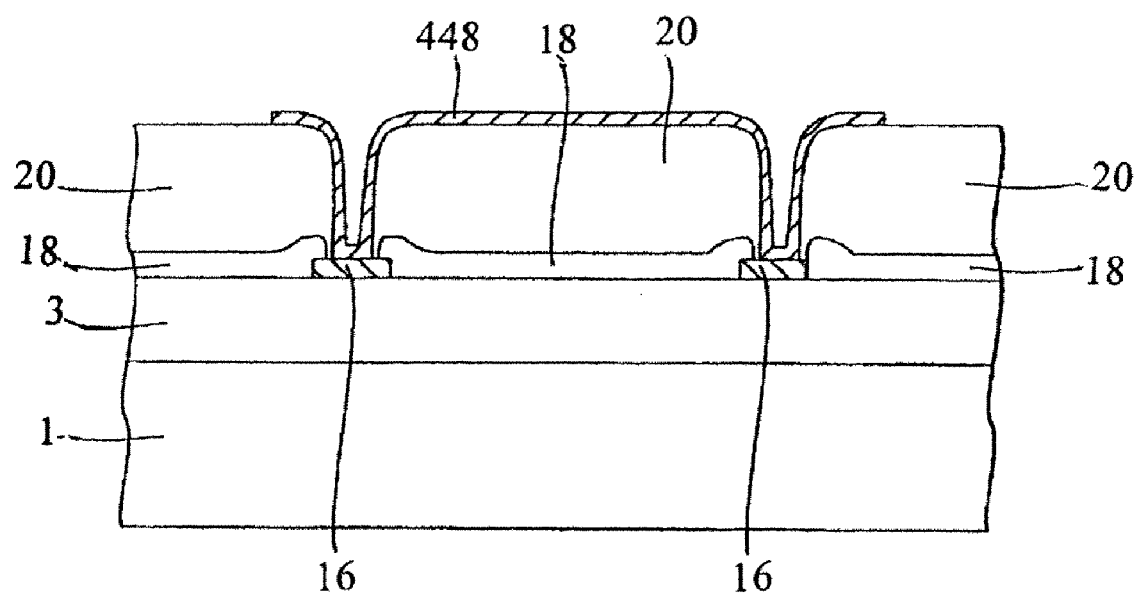
Figure 11C:
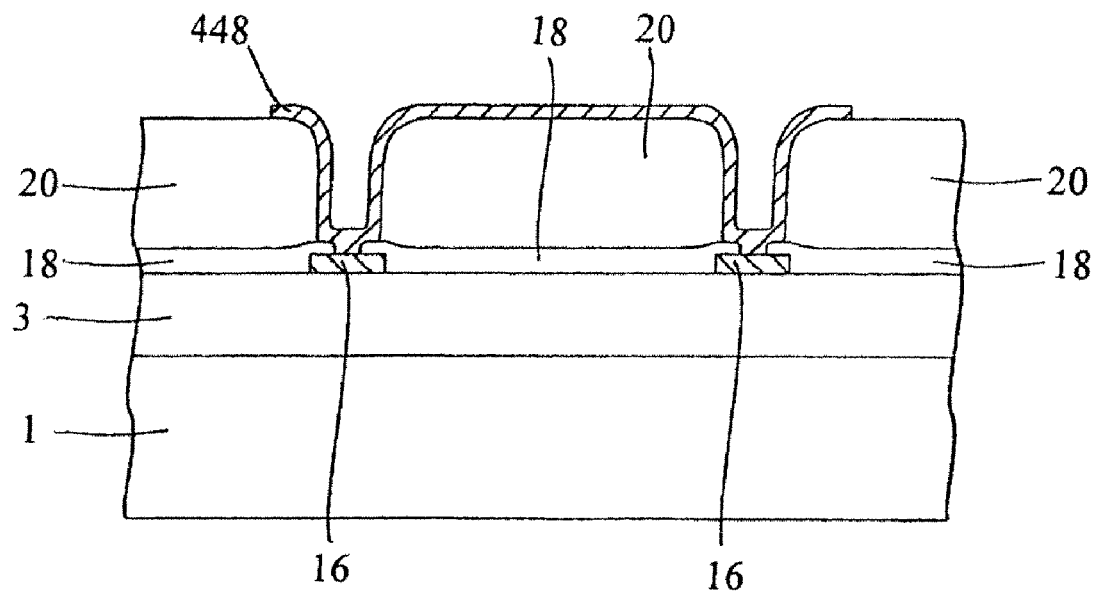

FIGS. 11a-11c show cross-sectional views of a resistor formed over the semiconductor chip, wherein the resistor 448 is formed on the passivation layer 18 or on the polymer layer 20. The resistor is made of the material which can provide resistance and through which a current can flow.

The resistor 448 can be formed by depositing a metal layer, such as tantalum nitride (TaN), a nickel chromium alloy (NiCr), a nickel tin alloy (NiSn), tungsten (W), a titanium tungsten alloy (TiW), titanium nitride (TiN), chromium (Cr), titanium (Ti), nickel (Ni), or tantalum silicon compound (TaSi), on the passivation layer 18 or on the polymer layer 20 using a physical vapor deposition (PVD) process or a chemical vapor deposition (CVD) process. A nickel chromium alloy can provide a preferred temperature coefficient of resistance, which can be small even up to 5 ppm/° C. The length, thickness and width of the resistor 448 can be variously designed according to various applications.

Referring to FIGS. 11b and 11c, after forming the polymer layer 20 onto the passivation layer 18, the resistor 448 can be formed on the polymer layer 20. The resistor 448 can be connected to the electric bond pads 16 exposed by the openings in the passivation layer 18 and in the polymer layer 20, wherein the material of the polymer layer 20 and the method for forming the same can be referred to as those of the polymer layer 20 shown in FIG. 1b.

Due to the disposition of the polymer layer 20 between the resistor 448 and the passivation layer 18, the distance between the resistor 448 and the semiconductor substrate 1 can be increased in the extent of approximately the thickness of the polymer layer 20. Therefore, the parasitic capacitance between the resistor 448 and the semiconductor substrate 1 can be declined. As a result, the performance of the resistor 448 can be improved. Because the loss of the parasitic capacitance can be reduced, the electrical performance can be enhanced in high frequency operation. Alternatively, the the polymer layer 20 can also be saved, and the resistor 448 can be formed directly on and in touch with the passivation layer 18, as shown in FIG. 11a. Besides, a polymer layer can be optionally formed on the resistor 448 to protect the resistor 448, and the material of the polymer layer and the method for forming the same can be referred to as those of the polymer layer 20 shown in FIG. 1b.

Referring to FIGS. 11a-11c, the resistor 448 has two contact points both connected to the electrical bond pads 16 exposed by the openings in the passivation layer 18. Alternatively, one of two contact points of the resistor 448 can be connected to one of the electrical bond pads 16 exposed by the openings of the passivation layer 18 and the other one of the two contact points of the resistor 448 can be connected to an external circuitry through a tin-lead solder bump, a gold bump or a wire formed by a wire bonding process and not to the electrical bond pads 16 exposed by the openings in the passivation layer 18. Alternatively, both of the contact points of the resistor 448 can be connected to an external circuitry through tin-lead bumps, gold bumps or wires formed by a wire bonding process and not to the electrical bond pads 16 exposed by the openings in the passivation layer 18.

Figure 12A:
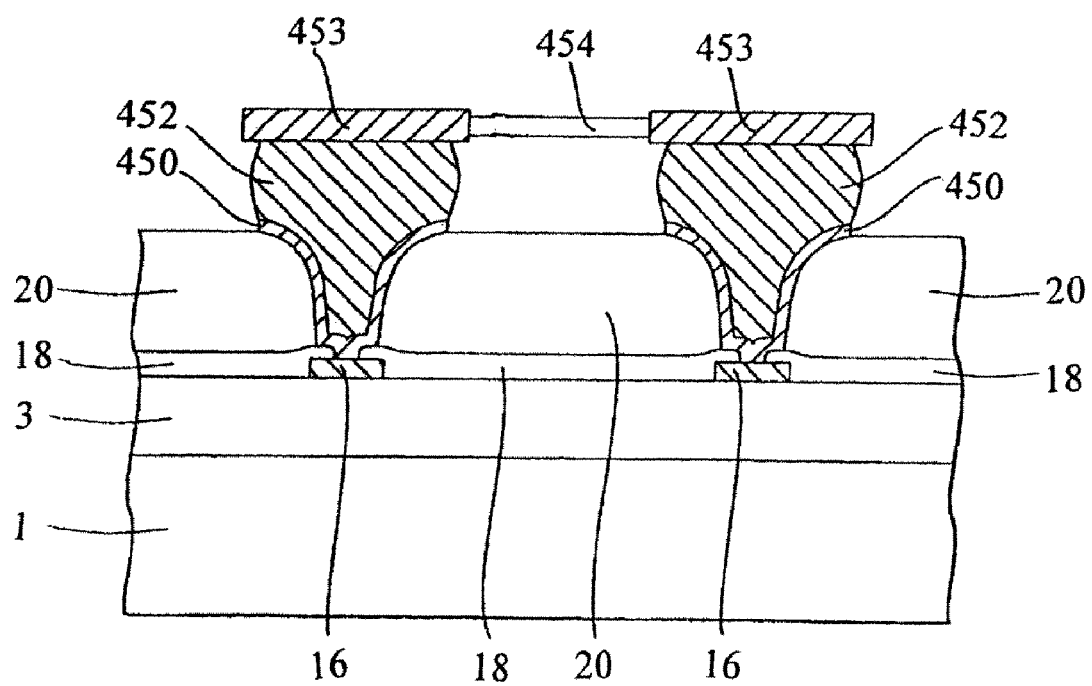
FIG. 12a is a schematically cross-sectional view showing a semiconductor chip having a discrete passive device over a passivation layer.
Figure 12B:
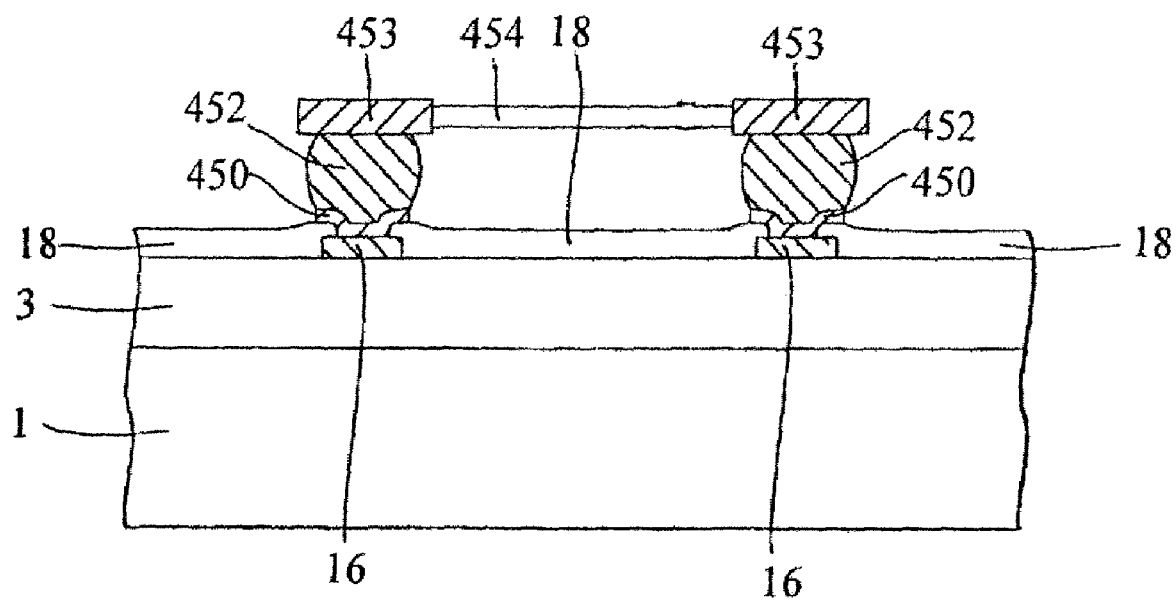
FIG. 12b is a schematically cross-sectional view showing a semiconductor chip having a discrete passive device over a passivation layer.

FIGS. 12a and 12b show a preformed passive component bonded over a semiconductor chip. In an embodiment, solder bumps 452 can be first formed over the electrical bond pads 16, and then a preformed passive component 454 can be joined with the solder bumps 452. The preformed passive component 454 may be a preformed inductor, a capacitor, or a preformed resistor.

A metal layer 450 can be formed on the electrical bond pads 16 exposed by the openings in the passivation layer 18. Next, the solder bumps 452 can be formed on the metal layer 450 using an electroplating process, a ball-plating process, or a screen printing process. In order to join the preformed passive components 454 to the solder bumps 452, a flux can be first sprayed on the solder bumps 452. When a reflow process is performed, the preformed passive components 454 can be joined to the solder bumps 452. Alternatively, the preformed passive component 454 may contain a solder layer 453 to be joined with the solder bumps 452, and thereby the joint between the preformed passive components 454 and the underlying semiconductor wafer can be strengthened.

Referring to FIGS. 12a and 12b, in case that the solder bumps 452 are formed by an electroplating process, a adhesion/barrier layer, such as titanium or chromium, can be first formed on the electrical bond pads 16, and/or on the passivation layer 18, and/or on the polymer layer 20 of a semiconductor wafer by a sputtering process. Next, a seed layer, such as copper, can be formed on the adhesion/barrier layer by a sputtering process. Next, a photoresist layer is formed on the seed layer, wherein openings in the photoresist layer expose the seed layer over the electrical bond pads 16. Next, a copper layer can be formed on the seed layer exposed by the openings in the photoresist layer by an electroplating process. Next, a nickel layer can be formed on the copper layer in the openings in the photoresist layer by an electroplating process. Next, a solder layer 452, such as a tin-lead alloy or a tin-silver alloy, having a thickness of between 5 microns and 500 microns is formed on the nickel layer in the openings in the photoresist layer by an electroplating process.

Next, the photoresist layer can be removed. Next, the seed layer and the adhesion/barrier layer not under the patterned solder layer 452 can be removed. In this case, the metal layer 450 comprises the sputtered adhesion/barrier layer, the sputtered seed layer and the electroplated copper layer and the electroplated nickel layer, wherein the thickness of the metal layer 450 between the solder bumps 452 and the electrical bond pads 16 ranges, for instance, from 0.1 microns to 20 microns. Next, the preformed passive component 454 can be joined with the solder bumps 452 using a heating process. Next, the semiconductor wafer can be cut into multiple semiconductor chips.

Referring to FIGS. 12a and 12b, in case that the solder bumps 452 are formed by a screen printing process or by a ball planting process, an adhesion/barrier layer, such as titanium or chromium, can be formed on the electrical bond pads 16, and/or on the passivation layer 18, and/or on the polymer layer 20 of a semiconductor wafer by a sputtering process. Next, a seed layer, such as copper, can be formed on the adhesion/barrier layer by a sputtering process. Next, a photoresist layer is formed on the seed layer, wherein openings in the photoresist layer expose the seed layer over the electrical bond pads 16. Next, a copper layer can be formed on the seed layer exposed by the openings in the photoresist layer by an electroplating process. Next, a nickel layer can be formed on the copper layer in the openings in the photoresist layer by an electroplating process. Next, a gold layer, a platinum layer or a palladium layer can be formed on the nickel layer in the openings in the photoresist layer by an electroplating process. Next, the photoresist layer can be removed. Next, the seed layer and the adhesion/barrier layer not under the patterned copper layer, not under the patterned nickel layer and not under the patterned gold layer, platinum layer or palladium layer can be removed.

In this case, the metal layer 450 is constructed from the sputtered adhesion/barrier layer, the sputtered seed layer, the electroplated copper layer, the electroplated nickel layer and the electroplated gold layer. Subsequently, multiple solder bumps 452, such as tin lead alloy or tin silver alloy, having a thickness of between 5 microns and 300 microns can be formed on the gold layer, platinum layer or palladium layer of the metal layer 450 by using a screen printing process or a ball-planting process. The thickness of the metal layer 450 between the solder bumps 452 and the electrical bond pads 16 may range from 0.1 microns to 20 microns.

In this case, the gold layer of the metal layer 450 for connecting the solder bumps 452 is preferably not too thick, but ranges, for example, from 0.05 microns to 1 micron. Thereby, it can be avoided that too much gold diffuses from the gold layer of the metal layer 450 into the solder bumps 452. Therefore, the brittleness caused by tin-gold alloy can be avoided.

Alternatively, referring to FIGS. 12a and 12b, solder bumps 452 can be first formed on the preformed passive component 454, and then the solder bumps 452 can be joined with the electrical bond pads 16, if the above-mentioned metal layer 450 is not formed, or with the above-mentioned metal layer 450 having an electroplated copper layer, an electroplated nickel layer on the electroplated copper layer, and an electroplated gold, platinum or palladium layer on the electroplated nickel layer, as mentioned above. The process for forming the metal layer 450 can be referred to the above paragraphs illustrating forming the metal layer 450 in case that the solder bumps 452 are formed by a screen-printing process or a ball-planting process.

Figure 13A:
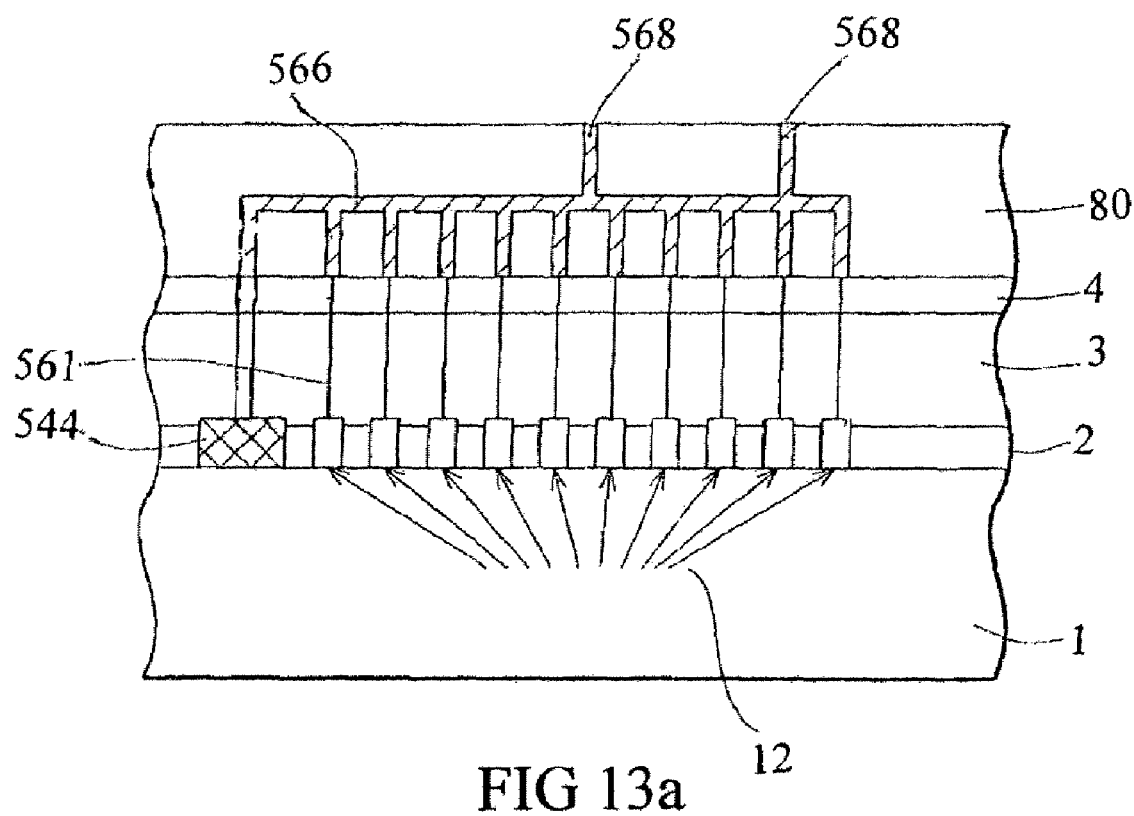
FIGS. 13a-13c show circuitry architectures having a thick circuit trace or plane over a passivation layer connecting an ESD circuit and multiple internal circuits.
Figure 13B:
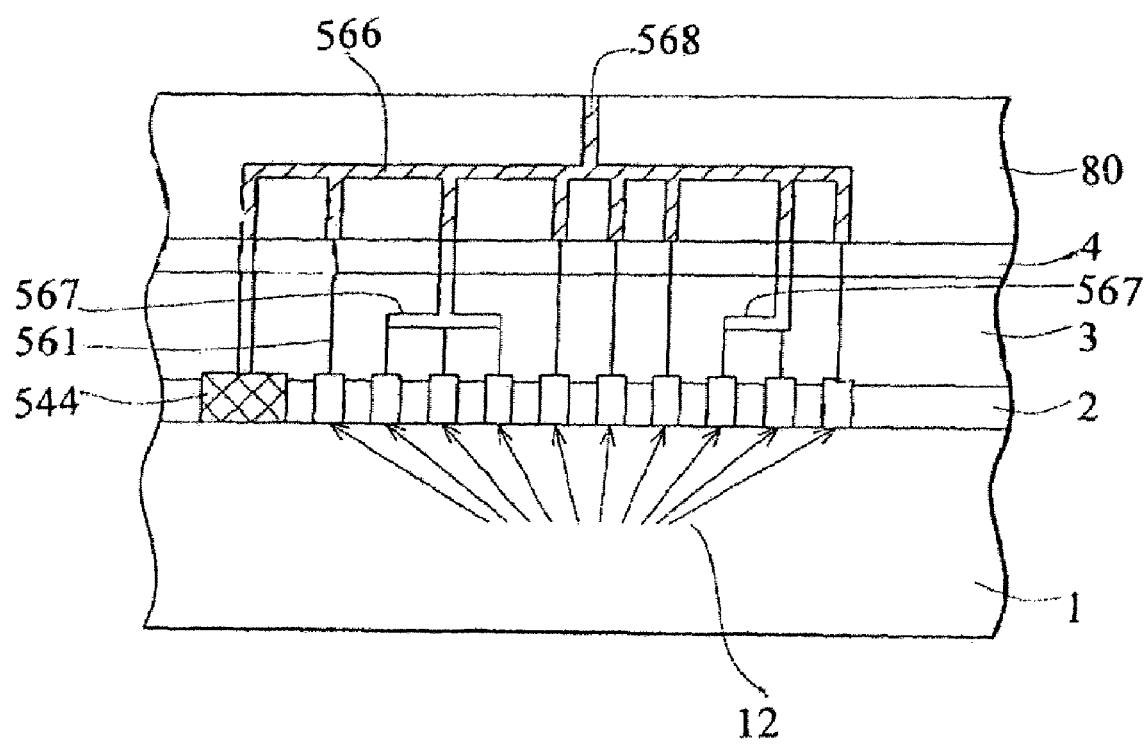
Figure 13C:
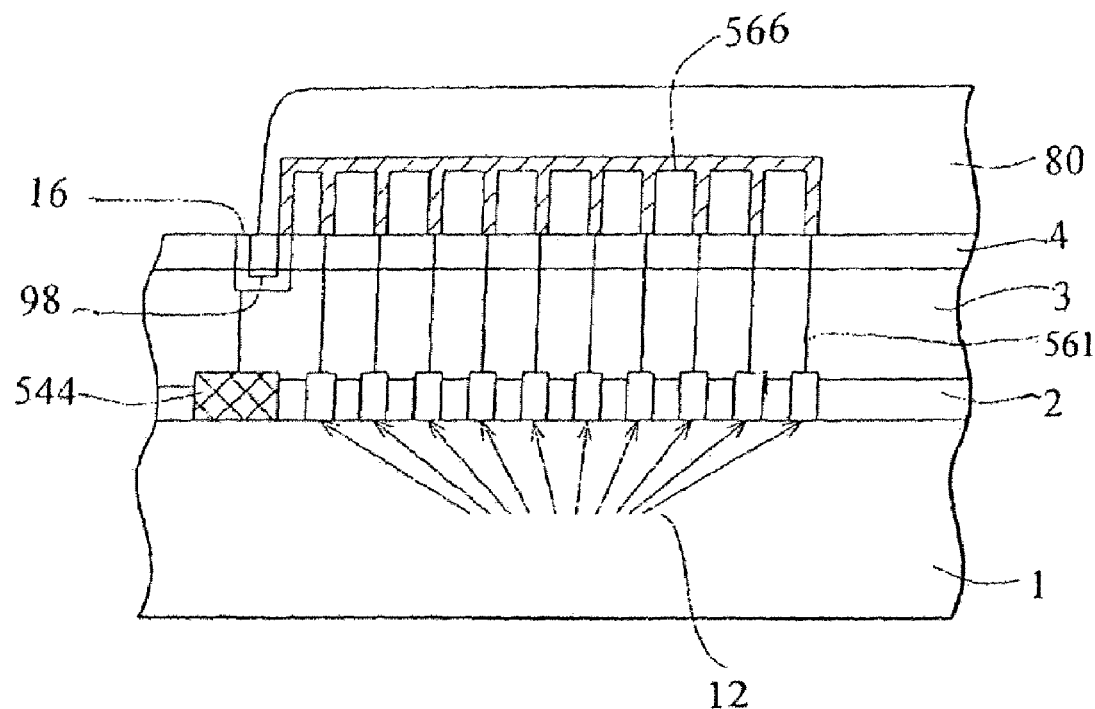

In the following, a routing designed using the above-mentioned thick metal layer over the passivation layer is introduced. FIGS. 13a-13c show a circuitry architecture distributing a power voltage or a ground voltage. Multiple semiconductor devices 12 are formed in and on a semiconductor substrate 1. These semiconductor devices 12 may be NMOS components, PMOS components and CMOS components. Each semiconductor device 12 comprises multiple nodes, which can be connected to another one or to a power/ground bus used to distribute a power voltage (Vdd) or a ground voltage (Vss). Each semiconductor device 12 typically includes a power node, a ground node and a signal node. An electrostatic discharge (ESD) protection circuit 544 is formed in and on the semiconductor substrate 1 and used to protect the semiconductor devices 12 from being damaged by suddenly electrostatic discharge. The semiconductor devices 12 and the electrostatic discharge (ESD) protection circuit 544 are formed in a device layer 2 on the semiconductor substrate 1.

An IC interconnection structure 3 is formed over the device layer 2. Multiple metal traces 561 of the IC interconnection layer 3 can be connected to the semiconductor devices (internal circuits) 12 and the electrostatic discharge protection circuit 544. A passivation layer 4 is deposited over the IC interconnection layer 3 and openings in the passivation layer 4 expose the electrical bond pads of the IC interconnection structure 3. The structure under the passivation layer 4 can be referred to that under the passivation layer 4 shown in FIG. 1a. The internal circuits 12 may have a NMOS transistor having a ratio of the effective channel width to the effective channel length ranging from 0.1 to 5, and preferably ranging from 0.2 to 2. The internal circuits 12 may have a PMOS transistor having a ratio of the effective channel width to the effective channel length ranging from 0.2 to 10, and preferably ranging from 0.1 to 5.

A post passivation layer 80 having the previously mentioned thick metal line layer and thick polymer layer is located over the passivation layer 4, wherein the detailed structure of the post passivation layer 80 and the method for forming the same can be referred to as those shown in FIGS. 1b and 3a-3d. A thick and wide interconnection bus 566 of the post passivation layer 80 may be composed of one or more thick metal layers formed as the process shown in FIG. 2a-2m. The thick and wide interconnection bus 566 is formed directly on the passivation layer 4 or on a thick polymer layer which is over the passivation layer 4. The thick and wide interconnection bus 566 is connected to metal traces 561 in the IC interconnection structure 3. The electrostatic discharge (ESD) protection circuit 544 can be connected in parallel to the power nodes of the multiple semiconductor devices (internal circuits) 12 through the thick and wide interconnection bus 566, wherein the thick and wide interconnection bus 566 can be, for example, a power bus or a power plane.

Alternatively, the electrostatic discharge protection circuit 544 can be electrically connected in parallel to the ground nodes of the multiple semiconductor devices (internal circuits) 12 through the thick and wide interconnection bus 566, wherein the thick and wide interconnection bus 566 can be, for example, a ground bus or a ground plane.

Referring to FIGS. 13a and 13b, tin-lead bumps or gold bumps can be formed on one or multiple pads 568 of the thick and wide interconnection bus 566, so that the thick and wide interconnection bus 566 can be electrically connected to a power point or a ground point of an external circuitry of a printed circuit board. Alternatively, a wire formed by a wire bonding process can connect one or multiple nodes 568 of the thick and wide interconnection net 566, so that the thick and wide interconnection net 566 can be electrically connected to a power point or a ground point of an external circuitry, such as a printed circuit board, through the nodes 568. Multiple of the nodes 568 are preferred, leading the thick and wide interconnection bus 566 to distribute a power voltage or a ground voltage much steadily.

In the present invention, Each node 568 connected to an external power source or an external ground reference can be connected to a different individual electrostatic discharge protection circuit 544. Alternatively, multiple of the nodes 568 connected to an external power source or an external ground reference can be connected to a same electrostatic discharge protection circuit 544. As a result, multiple of the nodes 568 connected to an external power source or an external ground reference may share a same electrostatic discharge protection circuit 544. Thereby, the electricity for providing for all electrostatic discharge protection circuit in an IC chip can be reduced.

Referring to FIG. 13c, the electrical bond pads 16 exposed by the openings in the passivation layer 4 can be electrically connected to the thick and wide interconnection bus 566 over the passivation layer 4 through a thin-film line 98 under the passivation layer 4. Tin-lead bumps or gold bumps can be formed on the electrical bond pads. Alternatively, wires formed by a wire bonding process can be connected to the electrical bond pads. The thick and wide interconnection bus 566 is connected not directly to an external circuitry, but connected to an external circuitry through the thin-film line 98 under the passivation layer 4, wherein the length of the thin-film line 98 ranges, for example, from 50 microns to 1000 microns. After forming the thick and wide interconnection bus 566, the electrical bond pads are exposed to be connected with tin-lead bumps, gold bumps or wires by a wirebonding process.

Referring to FIG. 13b, The IC interconnection structure 3 includes multiple inner interconnection traces 567 under the passivation layer 4. The inner interconnection traces 567 connect multiple of the semiconductor devices (internal circuits) 12. The thick and wide interconnection trace 566 connects multiple of the inner interconnection traces 567. A part of the semiconductor devices (internal circuits) 12 can be connected to the thick and wide interconnection net 566 over the passivation layer 4 not through the inner interconnection traces 567 under the passivation layer 4, as shown in FIG. 13b. Alternatively, all of the semiconductor devices (internal circuits) 12 in an IC chip can be connected to the thick and wide interconnection net 566 over the passivation layer 4 not through the inner interconnection traces 567 under the passivation layer 4, as shown in FIGS. 13a and 13c.

Referring to the FIGS. 13a-13c, the thick and wide interconnection trace 566 over the passivation layer 4, acting as power buses or ground buses, may be substituted for the thin and fine inner interconnection trace under the passivation layer 4, a part of the thin and fine inner interconnection trace under the passivation layer 4 can be saved. As a result, the parasitic capacitance created by the thin and fine inner interconnection trace under the passivation layer 4 may have a reduced impact on the semiconductor devices. The thick and wide interconnection trace 566 over the passivation layer 4 has a relatively good performance of bearing the impact caused by the change of an external voltage.

Referring to the FIGS. 13a-13c, the electrostatic discharge (ESD) protection circuit 544 and multiple semiconductor devices 12 can be connected with each other in parallel through the thick and wide interconnection trace 566 over the passivation layer 4. Because the interconnection net 566 over the passivation layer 4 is thick and wide, the emergence of an unpredictable power surge can be reduced.

Alternatively, when a semiconductor chip is connected to another one through tin-lead bumps, the semiconductor chip may have a bond pad exposed by an opening in the passivation layer, which is electrically connected to the power or ground nodes of the semiconductor devices, but not to the electrostatic discharge (ESD) protection circuit in the semiconductor chip or in the another one. Alternatively, the bond pad exposed by an opening in the passivation layer may be electrically connected to the power or ground nodes of the semiconductor devices and to the electrostatic discharge (ESD) protection circuit with a smaller size in the semiconductor chip or in the another one.

Referring to FIGS. 14a-14h, the interconnection trace 566 over the passivation layer 4 is used, for example, for transmitting a clock signal, an address signal, a data signal, a logic signal or an analog signal. A semiconductor device (internal circuit) 12 typically includes a power node, a ground node and a signal node. In this case, the thick and wide interconnection trace 566 is connected to the signal node of the semiconductor device 12. Alternatively, the thick and wide interconnection trace 566 can be used for transmitting a power voltage or a ground voltage output from semiconductor device 12 servicing as a voltage regulator. These semiconductor devices 12 are formed in and on the semiconductor substrate 1. These semiconductor devices 12 may be NMOS components, PMOS components or CMOS components. An electrostatic discharge (ESD) protection circuit 544, a driver, receiver, or Input/Output circuit and the semiconductor devices 12 are formed in the device layer 2 on the semiconductor substrate 1. The electrostatic discharge protection circuit 544 is used for protecting the semiconductor devices 12 from being damaged by a sudden electrostatic discharge.

An IC interconnection structure 3 is over the device layer 2. Multiple inner interconnection traces 561 of the IC interconnection layer 3 are connected to the semiconductor devices 12, the electrostatic discharge (ESD) protection circuit 544 and the driver, receiver or Input/Output lines 545. The passivation layer 4 is on the IC interconnection structure 3. Openings in the passivation layer 4 expose the electrical bond pads of the IC interconnection layer 3. The structure of the semiconductor chip under the passivation layer 4 in the present embodiment can be referred to as that shown in FIG. 1a.

A post passivation layer 80 having the structure of the previously mentioned thick metal line layer and the thick polymer layer is on the passivation layer 4. The detailed structure of the post passivation layer 80 and the process for forming the same can be referred to as those shown in FIGS. 1b and 3a-3d. The thick and wide interconnection trace 566 of the post passivation layer 80 may be constructed from, for example, one thick patterned metal layer or multiple thick patterned metal layers, between which a polymer insulating layer is provided. The thick and wide interconnection trace 566 can be formed, for instance, directly on and in touch with the passivation layer 4 or on the thick polymer layer over the passivation layer 4. The thick and wide interconnection trace 566 is connected to the inner interconnection traces 561 of the IC interconnection structure 3. The electrostatic discharge (ESD) protection circuit 544 can be electrically connected in parallel to the driver, receiver or Input/Output circuit 545.

Referring to FIGS. 14a-14d, the post passivation layer 80 may have multiple bond pads 570 exposed by openings in a polymer layer. Tin-lead bumps or gold bumps can be formed on the bond pads 570 and used for electrical connection between the bond pads 570 and an external circuitry. Alternatively, wires formed by a wire bonding process can be bonded to the bond pads 570 and used for electrical connection between the bond pads 570 and an external circuitry. The electrostatic discharge (ESD) protection circuit 544 is connected to an inner interconnection traces 561 connected to the bond pad 570 for being connected to an external circuitry, so that the damage to the semiconductor devices 12 in the semiconductor chip can be avoided while an unpredicted power surge occurs.

After a clock signal or other signal transmitted from an external circuit through the bond pad 570 is processed by the receiver 545, it can be distributed through the wide and thick interconnection trace 566 over the passivation layer 4 to one or more of the semiconductor devices 12. Alternatively, a signal output from a semiconductor device 12 can be transmitted through the wide and thick interconnection net 566 over the passivation layer 4 to the driver 545 and then the signal, after being amplified through the driver 545, can be transmitted to an external circuitry through the bond pad 570.

The wide and thick interconnection trace 566 is not electrically connected upwards to an external circuitry. The routing distance between the bond pad 570 and the driver, receiver or Input/Output circuit 545 can be farther than that between the bond pad 570 and the electrostatic discharge (ESD) protection circuit 544, wherein the routing distance between the bond pad 570 and the driver, receiver or Input/Output circuit 545 ranges, for example, from 100 microns to 1 centimeter, and preferably ranges from 100 microns to 3000 microns. Besides, the space between the neighboring bond pads 570 ranges, for instance, from 100 microns to 1 centimeter, and preferably ranges from 100 microns to 1000 microns.

Referring to FIGS. 14e-14h, a tin-lead bump or gold bump can be formed on the electrical bond pad 16 exposed by an opening in the passivation layer 4 and is used for electrically connecting the electrical bond pad 16 to an external circuitry. Alternatively, a wire formed by a wire bonding process can be bonded on the electrical bond pad 16 exposed by an opening in the passivation layer 4 and is used for electrically connecting the electrical bond pad 16 to an external circuitry. The electrostatic discharge (ESD) protection circuit 544 is connected to the inner interconnection traces 561 connected to the electrical bond pad 16, thereby the damage to the semiconductor devices (internal circuits) 12 within the semiconductor chip can be avoided while an unpredictable power surge occurs.

After a clock signal, address signal, data signal, logic signal or analog signal transmitted from an external circuitry through the electrical bond pad 16 is processed by the receiver 545, it can be distributed to the semiconductor devices (internal circuits) 12 through the wide and thick interconnection trace 566 over the passivation layer 4. Alternatively, a signal output from a semiconductor device 12 can be transmitted to the driver lines 545 through the wide and thick interconnection trace 566 over the passivation layer 4, and then the signal, after being amplified through the driver 545, can be transmitted to an external circuitry through the electrical bond pad 16.

The wide and thick interconnection trace 566 is not electrically connected upwards to an external circuitry. After forming the wide and thick interconnection trace 566, the electrical bond pad 16 is exposed to be connected to an external circuitry through solder bumps, such as tin-lead alloy or tin-silver alloy, gold bumps or wires formed by a wirebonding process. The routing length between the electrical bond pad 16 and the driver, receiver or Input/Output circuits 545 can be farther than the routing length between the electrical bond pad 16 to the electrostatic discharge (ESD) protection circuit 544, wherein the routing length between the electrical bond pad 16 and the driver, receiver or Input/Output circuits 545 ranges, for example, from 100 microns to 1 centimeter, and preferably ranges from 100 microns to 3000 microns. The space between the neighboring electrical bond pads 16 ranges, for instance, from 100 microns to 1 centimeter, and preferably ranges from 100 microns to 500 microns.

Referring to FIGS. 14b, 14d, 14f and 14h, the IC interconnection structure 3 includes multiple inner interconnection traces 567 under the passivation layer 4. The inner interconnection traces 567 may connect multiple of the semiconductor devices 12 (internal circuits). The inner interconnection traces 567 can be connected to the thick and wide interconnection trace 566 over the passivation layer 4. The thick and wide interconnection trace 566 over the passivation layer 4 may connect the semiconductor devices 12 through the inner interconnection traces 567 under the passivation layer 4. Alternatively, the thick and wide interconnection trace 566 over the passivation layer 4 may connect the semiconductor devices (internal circuits) 12 not through the inner interconnection traces 567 under the passivation layer 4, as shown in FIGS. 14a, 14c, 14e and 14g.

If the trace connecting the off-chip driver or receiver 545 to the semiconductor devices (internal circuits) 12 has a long distance or a great loading, an intra-chip driver or receiver 580 may be needed, as shown in FIGS. 14c, 14d, 14g and 14h. The so-called intra-chip driver or receiver 580 is used to process the signal transmission between the semiconductor devices (internal circuits) 12 within the chip, or is used to process the signal transmission between an off-chip driver or receiver and the semiconductor devices (internal circuits) 12, wherein the so-called off-chip driver or receiver 545 is used to process the signal transmission between the intra-chip driver or receiver 580 and an external circuit. These intra-chip drivers or receivers 580 typically have a smaller size than the off-chip driver or receiver 545. The intra-chip driver or receivers 580 have smaller sensing amplifiers, smaller latched input circuits and smaller cascade stage than the off-chip driver or receiver 545.

Referring to FIGS. 14c, 14d, 14g and 14h, a current passing through the thick and wide interconnection trace 566 is smaller than a current passing through the electrical metal pad 570. A current passing through the interconnection between the intra-chip drivers or receivers 580 and the internal circuits 12 is smaller than a current passing through the thick and wide interconnection trace 566. For example, the current passing through the thick and wide interconnection trace 566 ranges from 5 milliamperes to 5 amperes, and preferably from 10 milliamperes to 100 milliamperes. The current passing through the interconnection between the intra-chip drivers or receivers 580 and the internal circuits 12 ranges from 500 microamperes to 10 milliamperes, and preferably from 700 microamperes to 2 milliamperes.

Referring to FIGS. 14c, 14d, 14g and 14h, the off-chip drivers or receivers 545 may have a NMOS transistor having a ratio of the effective channel width to the effective channel length ranging from 20 to 20,000, and preferably ranging from 30 to 300. The off-chip drivers or receivers 545 may have a PMOS transistor having a ratio of the effective channel width to the effective channel length ranging from 40 to 40,000, and preferably ranging from 60 to 600. The intra-chip drivers or receivers 580 may have a NMOS transistor having a ratio of the effective channel width to the effective channel length ranging from 1.5 to 30, and preferably ranging from 2.5 to 10. The intra-chip drivers or receivers 580 may have a PMOS transistor having a ratio of the effective channel width to the effective channel length ranging from 3 to 60, and preferably ranging from 5 to 20. The internal circuits 12 may have a NMOS transistor having a ratio of the effective channel width to the effective channel length ranging from 0.1 to 5, and preferably ranging from 0.2 to 2. The internal circuits 12 may have a PMOS transistor having a ratio of the effective channel width to the effective channel length ranging from 0.2 to 10, and preferably ranging from 0.1 to 5.

The sensitivity of the receiver is influenced by the sensing amplifier, the latched input circuits or the cascade stage. The intra-chip driver or receiver 580 is provided without any electrostatic discharge (ESD) protection circuit and any Input/Output citcuit. Alternatively, if the interconnection between the off-chip driver, receiver or I/O circuit 545 and the internal circuits 12 has a lower routing length, the intra-chip driver and receiver 580 can be saved, as shown in FIGS. 14a, 14b, 14e and 14f.

Referring to FIGS. 14a, 14b, 14e and 14f, a current passing through the thick and wide interconnection trace 566 is smaller than a current passing through the electrical metal pad 570. For example, the current passing through the thick and wide interconnection trace 566 ranges from 5 milliamperes to 5 amperes, and preferably from 10 milliamperes to 100 milliamperes.

Referring to FIGS. 14a, 14b, 14e and 14f, the off-chip drivers or receivers 545 may have a NMOS transistor having a ratio of the effective channel width to the effective channel length ranging from 20 to 20,000, and preferably ranging from 30 to 300. The off-chip drivers or receivers 545 may have a PMOS transistor having a ratio of the effective channel width to the effective channel length ranging from 40 to 40,000, and preferably ranging from 60 to 600. The internal circuits 12 may have a NMOS transistor having a ratio of the effective channel width to the effective channel length ranging from 0.1 to 5, and preferably ranging from 0.2 to 2. The internal circuits 12 may have a PMOS transistor having a ratio of the effective channel width to the effective channel length ranging from 0.2 to 10, and preferably ranging from 0.1 to 5.

Referring to FIGS. 14c, 14d, 14g and 14h, a signal, after being twice processed by the drivers or receivers 545 and 580, can be transmitted between the semiconductor devices or internal circuits 12 and an external circuit. Alternatively, a signal, after being once processed by the driver or receiver 545, can be transmitted between the semiconductor devices or internal circuits 12 and an external circuit, as shown in FIGS. 14a, 14b, 14e and 14f.

FIG. 14i shows a circuitry having two drivers, receivers or Input/Output circuits 545 connected to an electrostatic discharge (ESD) protection circuit 544 through a thick and wide interconnection trace 566, and thereby the two drivers, receivers or Input/Output circuits 545 share the same electrostatic discharge (ESD) protection circuit 544. Each driver, receiver or Input/Output circuit 545 is connected to the semiconductor devices (internal circuits) 12 under the passivation layer 4 through the thick and wide metal trace 566 over the passivation layer 4. The drivers, receivers or Input/Output circuits 545 and the electrostatic discharge (ESD) protection circuit 544 can be connected to an external circuit through the bond pad 570 provided by a patterned metal layer of the post passivation layer 80 and over an electrical bond pad exposed an opening in the passivation layer 4.

Referring to FIG. 14i, a current passing through the thick and wide interconnection traces 566 connecting the internal circuits 12 and the off-chip driver, receiver, I/O circuits 545 is smaller than a current passing through the electrical metal pad 570. For example, the current passing through the thick and wide interconnection traces 566 connecting the internal circuits 12 and the off-chip driver, receiver, I/O circuits 545 ranges from 5 milliamperes to 5 amperes, and preferably from 10 milliamperes to 100 milliamperes.

Referring to FIG. 14i, the off-chip drivers or receivers 545 may have a NMOS transistor having a ratio of the effective channel width to the effective channel length ranging from 20 to 20,000, and preferably ranging from 30 to 300. The off-chip drivers or receivers 545 may have a PMOS transistor having a ratio of the effective channel width to the effective channel length ranging from 40 to 40,000, and preferably ranging from 60 to 600. The internal circuits 12 may have a NMOS transistor having a ratio of the effective channel width to the effective channel length ranging from 0.1 to 5, and preferably ranging from 0.2 to 2. The internal circuits 12 may have a PMOS transistor having a ratio of the effective channel width to the effective channel length ranging from 0.2 to 10, and preferably ranging from 0.1 to 5.

Figure 14A:
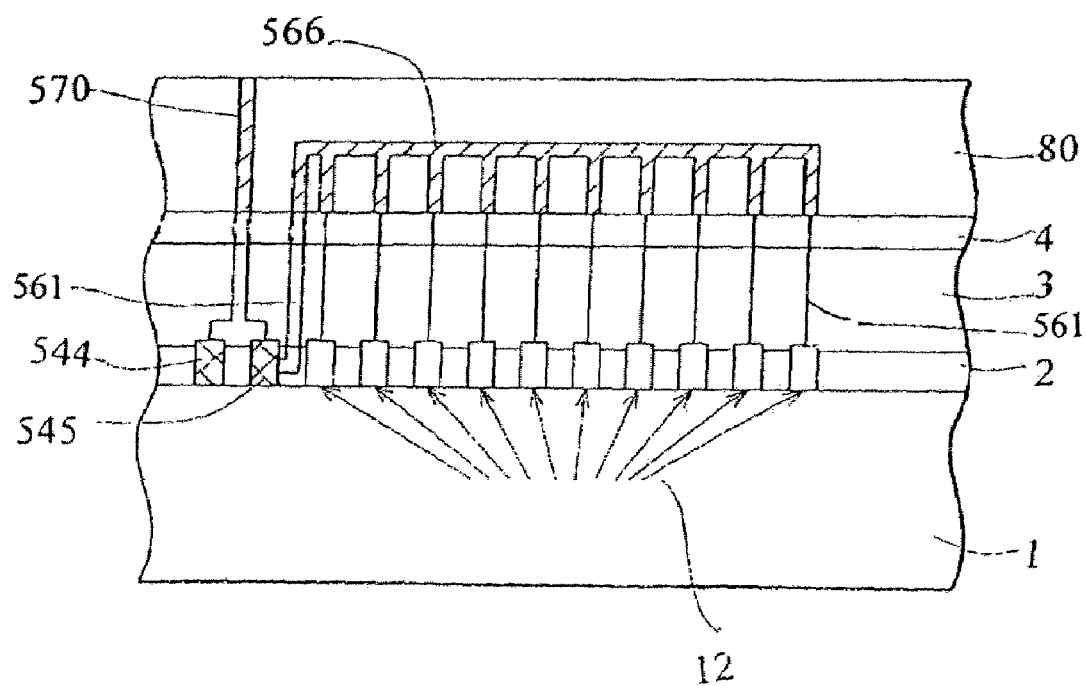
Figure 14B:
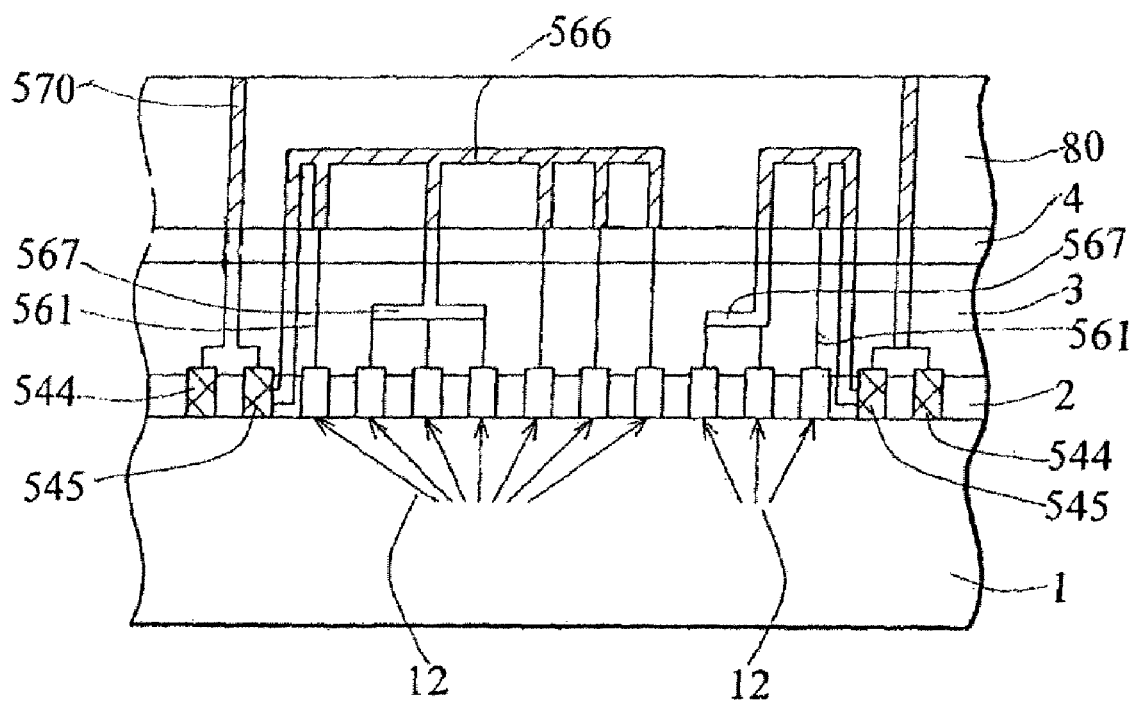
Figure 14C:
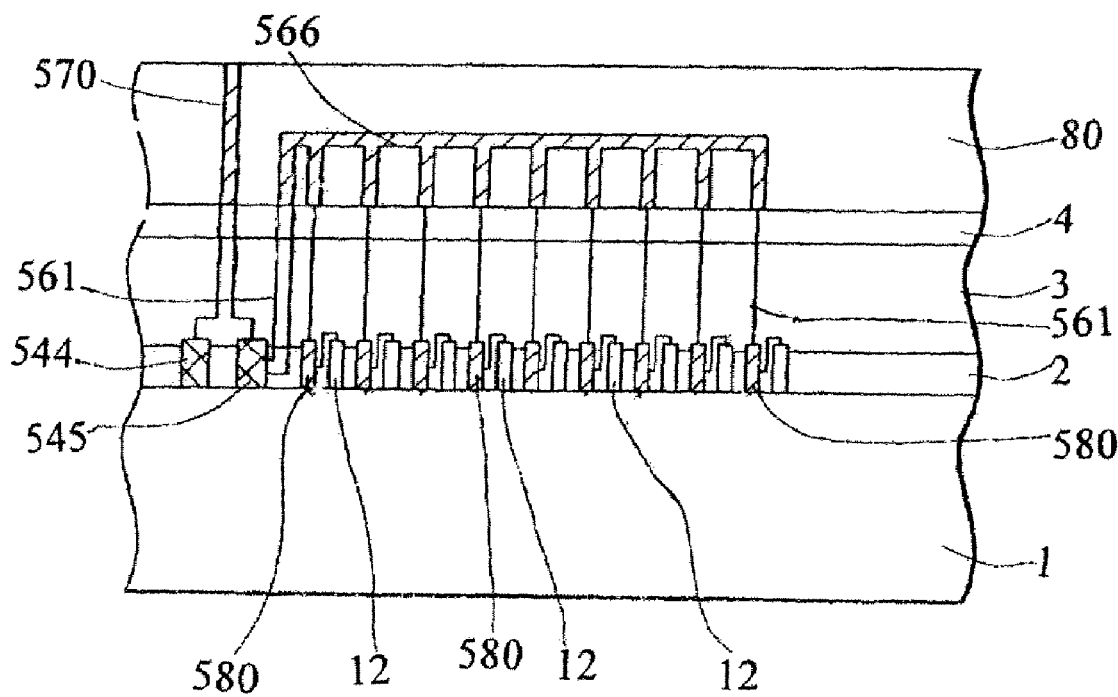
Figure 14D:
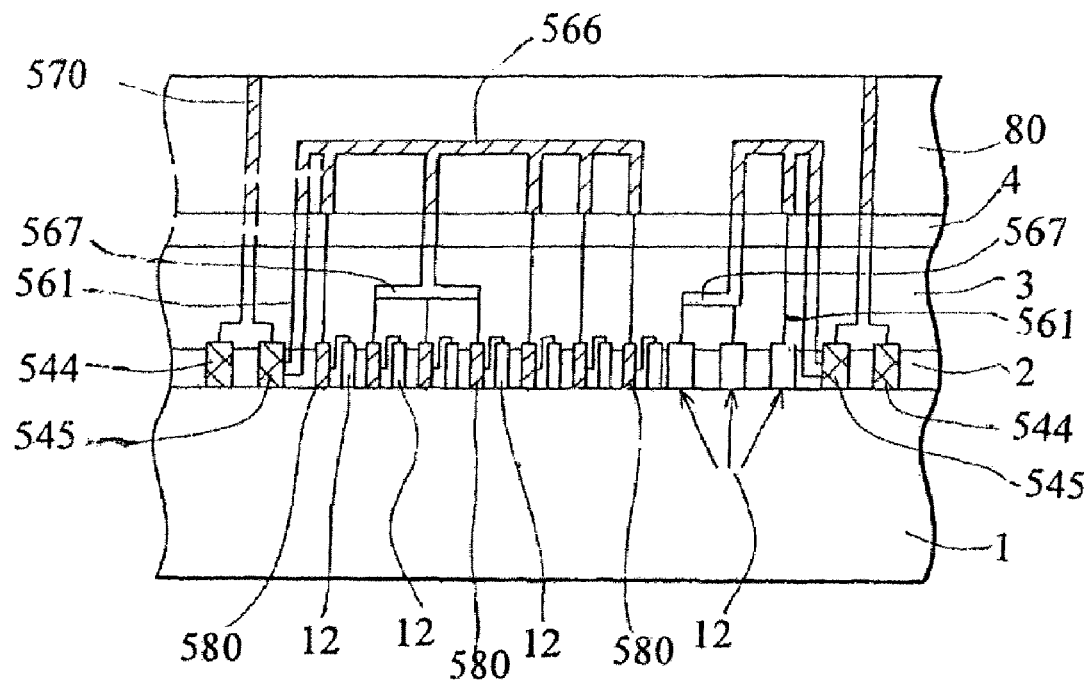
Figure 14E:
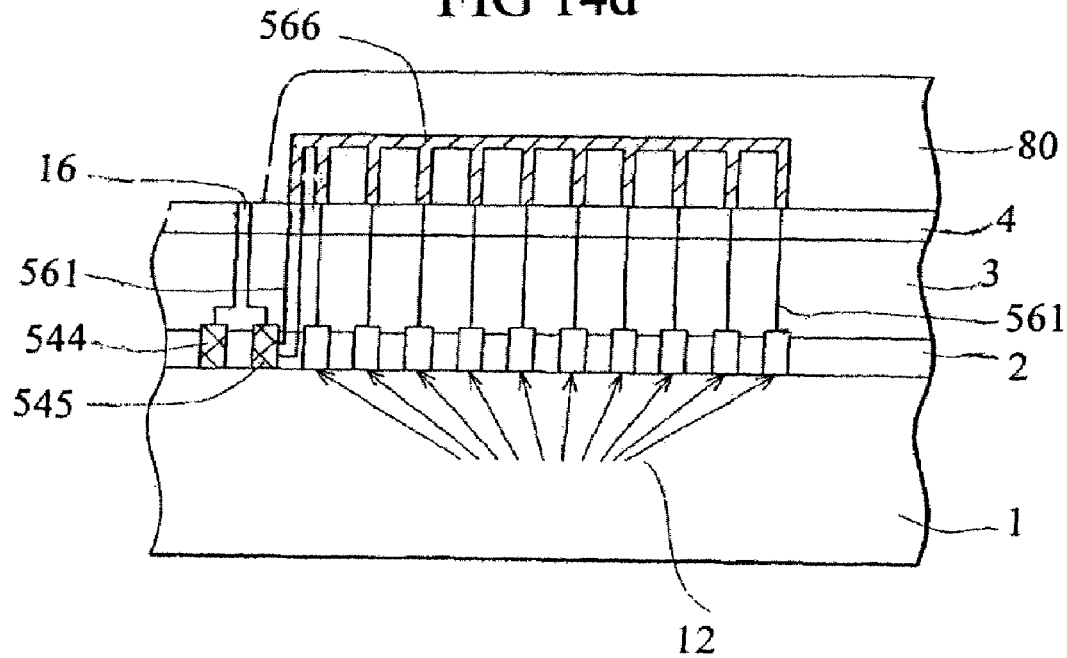
Figure 14F:
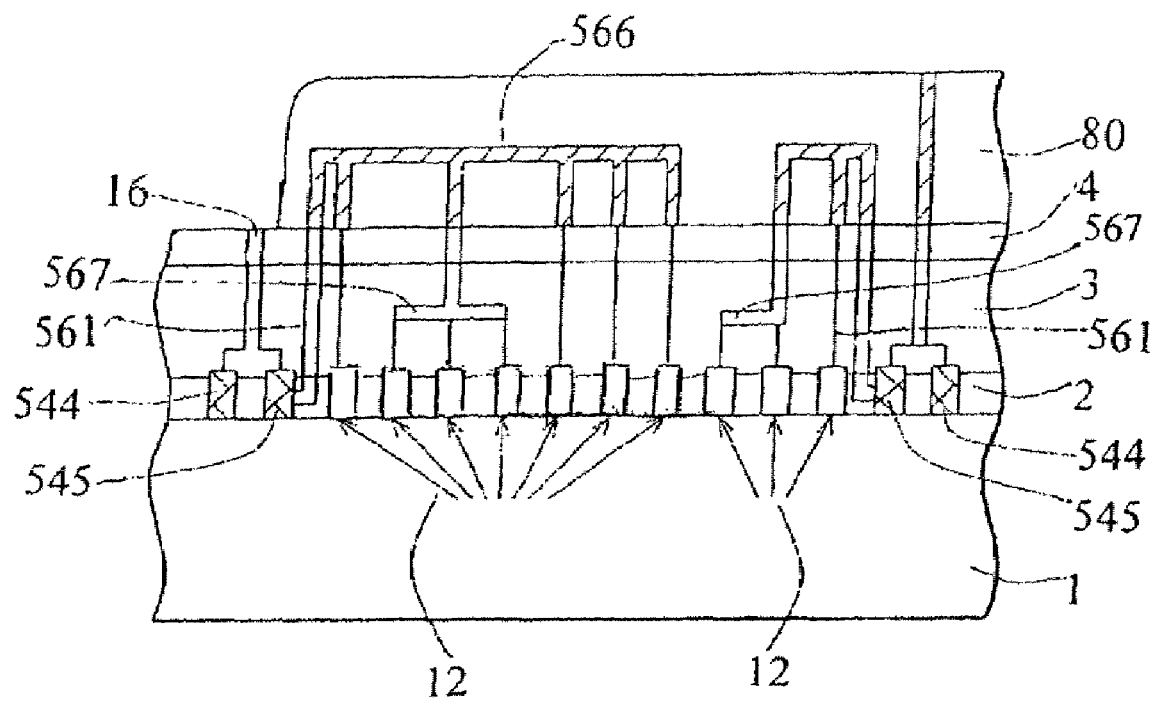
Figure 14G:
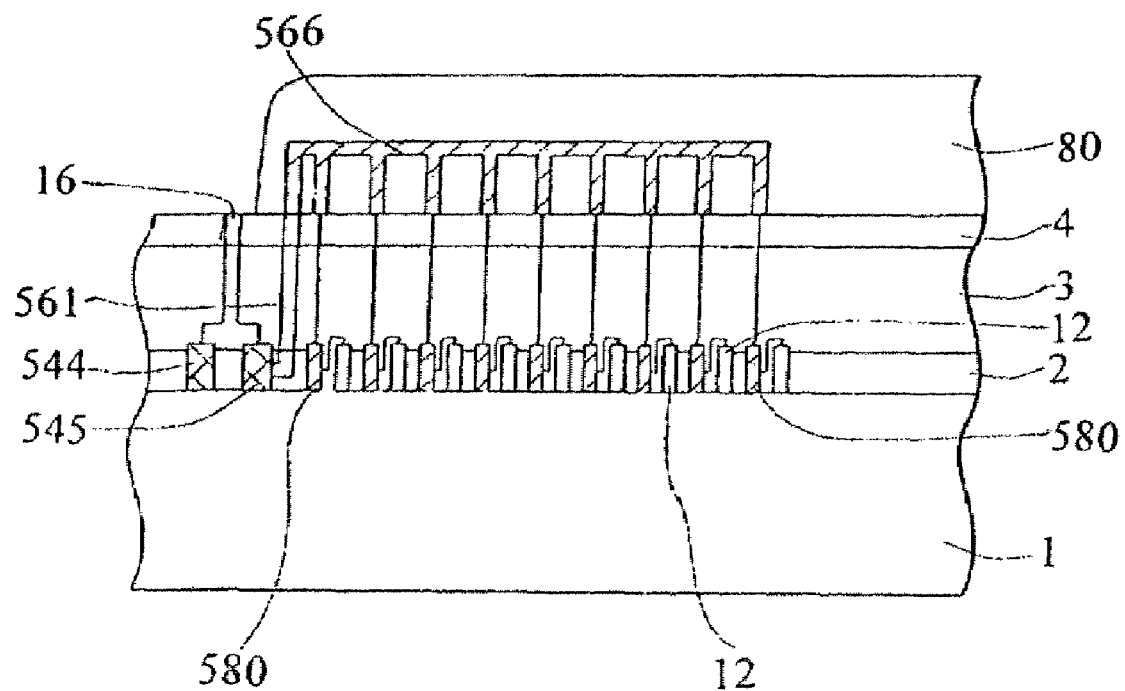
Figure 14H:
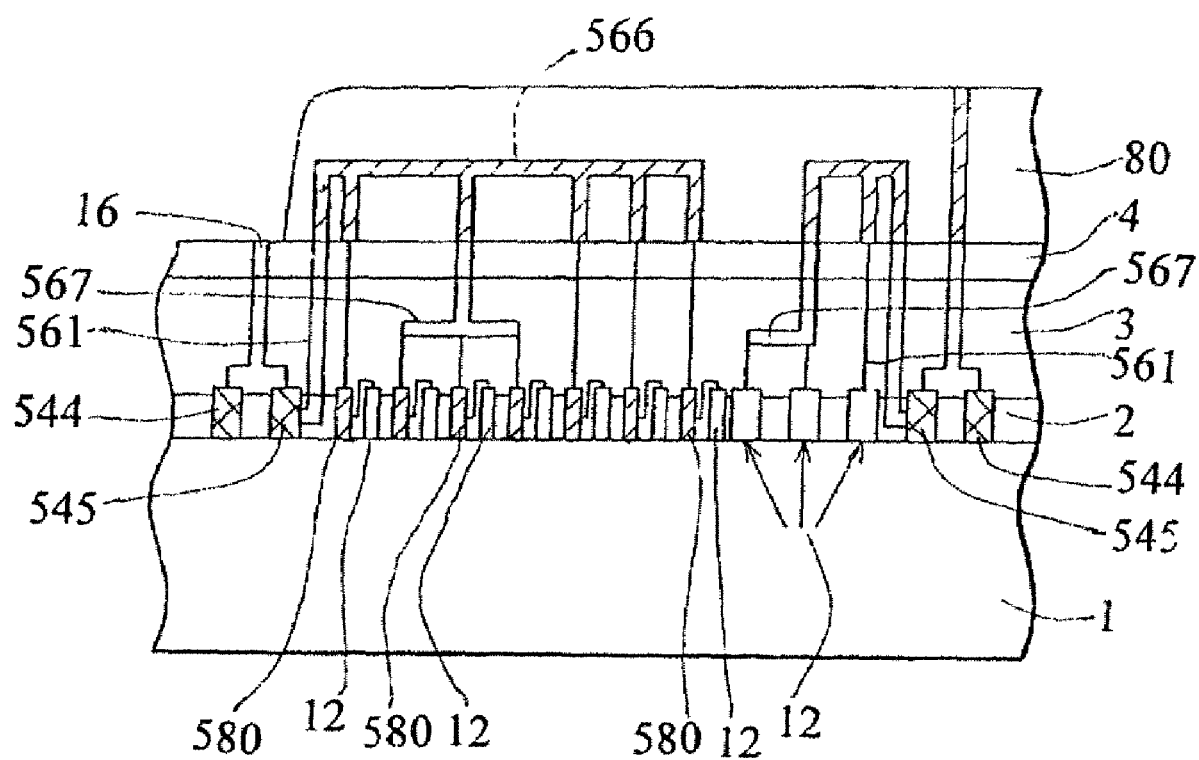
Figure 14J:
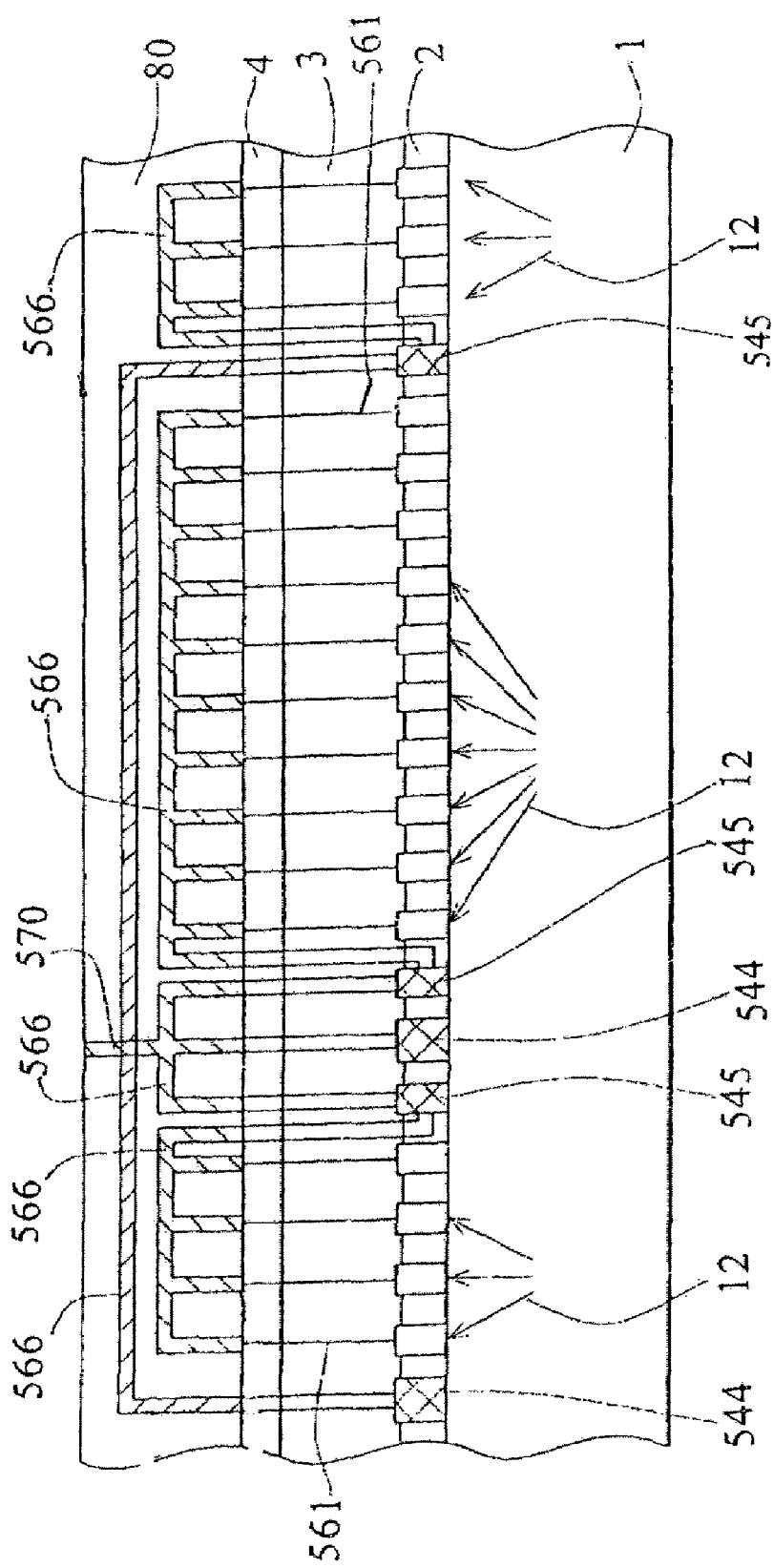

Alternatively, multiple drivers, receivers or Input/Output circuits 545 can be connected to one or more electrostatic discharge (ESD) protection circuits 544 through the thick and wide metal traces 566 over the passivation layer 4. As shown in FIG. 14j, three drivers, receivers or Input/Output circuits 545 and two electrostatic discharge (ESD) protection circuits 544 are connected with one another through multiple thick and wide interconnection traces 566 with low resistance located over the passivation layer 4. The thick and wide interconnection traces 566 can be constructed from two patterned circuit layers between which a polymer layer is provided. The drivers, receivers or Input/Output circuits 545 are connected to the semiconductor devices (internal circuits) 12 through the thick and wide metal traces 566 over the passivation layer 4.

Referring to FIG. 14j, a current passing through the thick and wide interconnection traces 566 connecting the internal circuits 12 and the off-chip driver, receiver, I/O circuits 545 is smaller than a current passing through the electrical metal pad 570. For example, the current passing through the thick and wide interconnection traces 566 connecting the internal circuits 12 and the off-chip driver, receiver, I/O circuits 545 ranges from 5 milliamperes to 5 amperes, and preferably from 10 milliamperes to 100 milliamperes.

Referring to FIG. 14j, the off-chip drivers or receivers 545 may have a NMOS transistor having a ratio of the effective channel width to the effective channel length ranging from 20 to 20,000, and preferably ranging from 30 to 300. The off-chip drivers or receivers 545 may have a PMOS transistor having a ratio of the effective channel width to the effective channel length ranging from 40 to 40,000, and preferably ranging from 60 to 600. The internal circuits 12 may have a NMOS transistor having a ratio of the effective channel width to the effective channel length ranging from 0.1 to 5, and preferably ranging from 0.2 to 2. The internal circuits 12 may have a PMOS transistor having a ratio of the effective channel width to the effective channel length ranging from 0.2 to 10, and preferably ranging from 0.1 to 5.

Figure 15A:
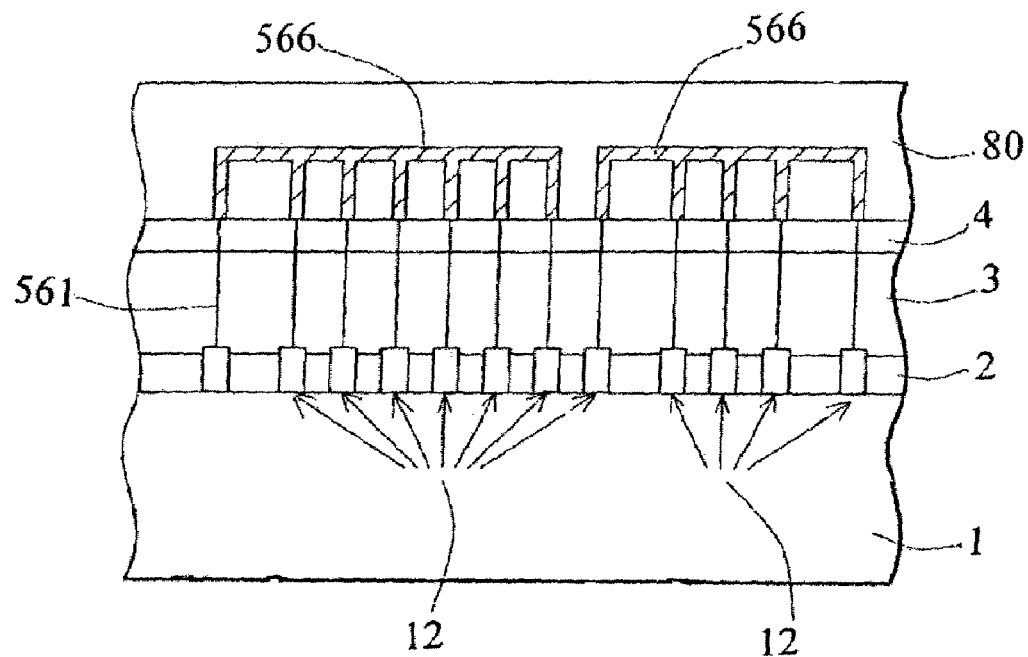
FIGS. 15a-15d show circuitry architectures having a thick circuit trace or plane over a passivation layer connecting multiple internal circuits or connecting multiple intra-chip drivers or receivers.
Figure 15B:
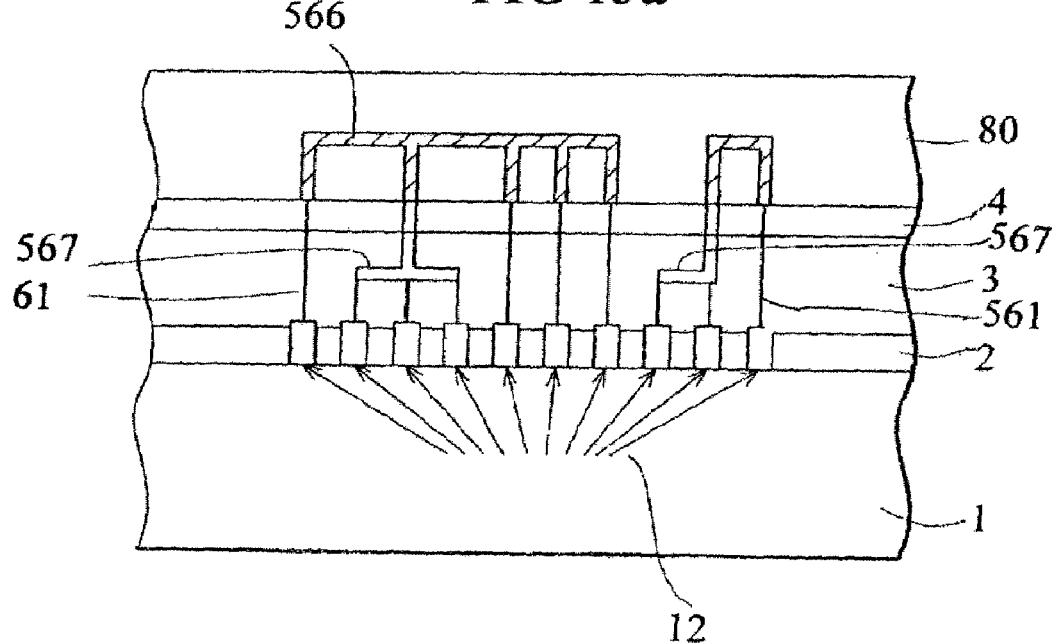

Referring to the FIGS. 15a-15d, multiple semiconductor devices (internal circuits) 12 are connected with one another through the wide and thick interconnection traces 566 over the passivation layer 4. In this embodiment, the semiconductor devices (internal circuits) 12 are not connected to an external circuit through the wide and thick interconnection trace 566, so no electrostatic discharge (ESD) protection circuit or Input/Output circuits in the device layer 2 is connected to the wide and thick interconnection trace 566, wherein the wide and thick interconnection trace 566 can be used to transmit a clock signal. If the interconnection between the semiconductor devices (internal circuits) 12 has a short routing length, a signal not being processed by a driver or receiver can be transmitted from one of the internal circuits to another one of the internal circuits through the wide and thick interconnection trace 566, as shown in FIGS. 15a and 15b.

Referring to FIGS. 15a and 15b, the current passing through the thick and wide interconnection traces 566 connecting the internal circuits 12 ranges from 50 microamperes to 2 milliamperes, and preferably from 100 microamperes to 1 milliamperes. The internal circuits 12 may have a NMOS transistor having a ratio of the effective channel width to the effective channel length ranging from 0.1 to 5, and preferably ranging from 0.2 to 2. The internal circuits 12 may have a PMOS transistor having a ratio of the effective channel width to the effective channel length ranging from 0.2 to 10, and preferably ranging from 0.1 to 5.

Figure 15C:
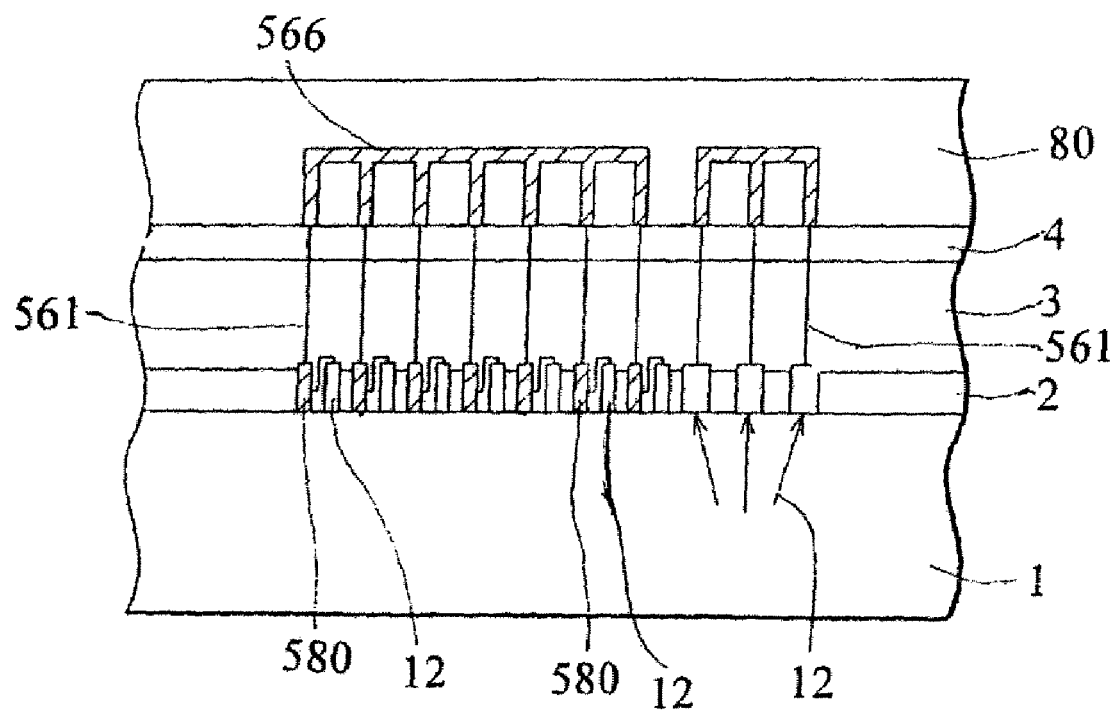
Figure 15D:
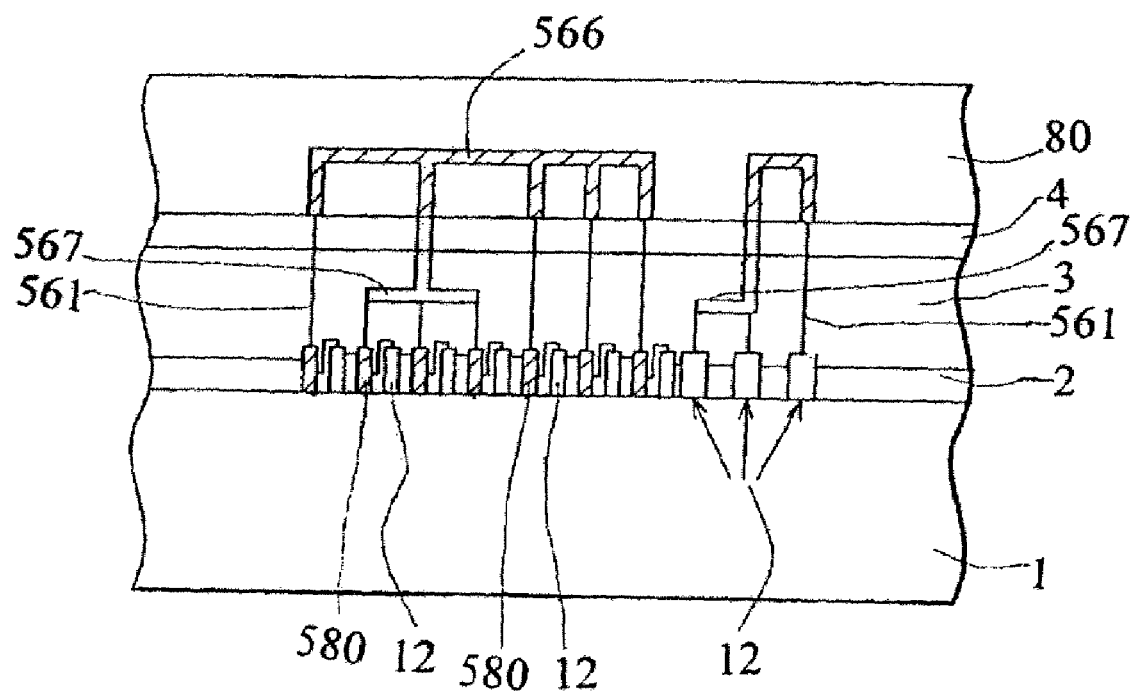

If the interconnection between the semiconductor devices (internal circuits) 12 has a long routing length, receivers or drivers 580 can be provided in the device layer 2 to process the signal, as shown in FIGS. 15c and 15d. In this embodiment, the wide and thick interconnection trace 566 connect the semiconductor devices (internal circuits) 12 through the receiver or the driver 580, as shown in FIGS. 15c and 15d. The receiver or the driver 580 is smaller than that used to process the signal transmitted to or from an external circuitry.

Referring to FIGS. 15c and 15d, a current passing through the thick and wide interconnection metal trace 566 ranges from 500 microamperes to 10 milliamperes, and preferably from 700 microamperes to 2 milliamperes.

Referring to FIGS. 15c and 15d, the intra-chip drivers or receivers 580 may have a NMOS transistor having a ratio of the effective channel width to the effective channel length ranging from 1.5 to 30, and preferably ranging from 2.5 to 10. The intra-chip drivers or receivers 580 may have a PMOS transistor having a ratio of the effective channel width to the effective channel length ranging from 3 to 60, and preferably ranging from 5 to 20. The internal circuits 12 may have a NMOS transistor having a ratio of the effective channel width to the effective channel length ranging from 0.1 to 5, and preferably ranging from 0.2 to 2. The internal circuits 12 may have a PMOS transistor having a ratio of the effective channel width to the effective channel length ranging from 0.2 to 10, and preferably ranging from 0.1 to 5.

Referring to FIGS. 15b and 15d, an IC interconnection structure 3 includes multiple inner interconnection traces 567. Multiple semiconductor devices 12 under the passivation layer 4 can be connected with each other through the inner interconnection traces 567. The thick and wide interconnection trace 566 over the passivation layer 4 is connected to the inner interconnection traces 567. The thick and wide interconnection trace 566 over the passivation layer 4 may connect some of the semiconductor devices (internal circuits) 12 not through the inner interconnection traces 567 under the passivation layer 4. Alternatively, it is possible that the thick and wide interconnection trace 566 over the passivation layer 4 may connect all semiconductor devices (internal circuits) 12 not through the inner interconnection traces 567 under the passivation layer 4, as shown in FIGS. 15a and 15c.

Figure 16:
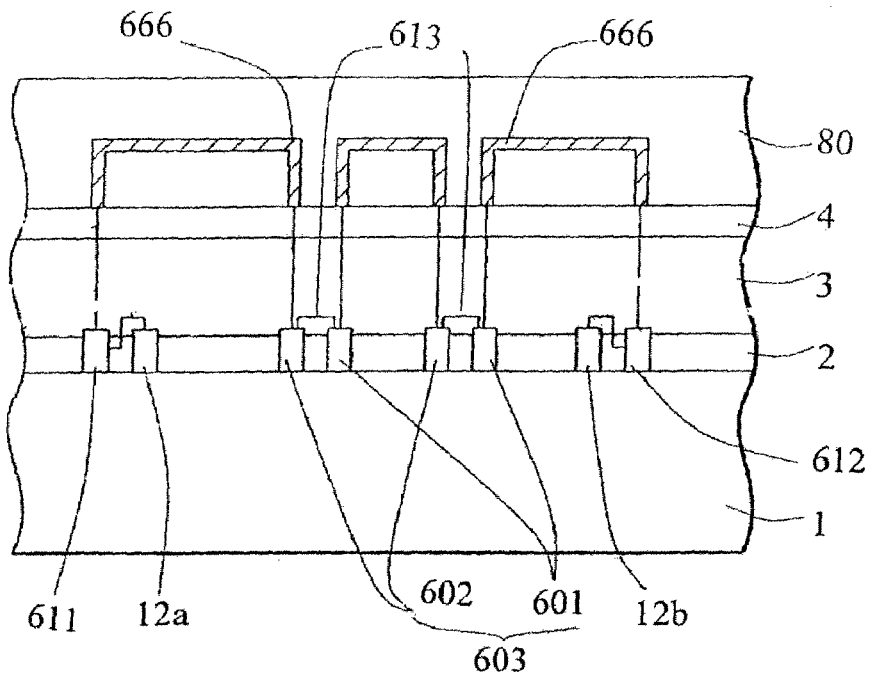
FIG. 16 shows a circuitry architecture having a thick circuit trace or plane over a passivation layer connecting multiple repeaters.

FIG. 16 shows a circuitry having a series of drivers/receivers 601, 602 or transceivers 603 to transmit a signal from a semiconductor device (internal circuit) 12a to another semiconductor device (internal circuit) 12b through thick and wide interconnection trace 666 over the passivation layer 4. If the interconnection between the internal circuits 12a and 12b has a long routing length, a series of repeaters or transceivers 603 each having a driver 601 and a receiver 602 connected with each other through a metal trace 613 under the passivation layer 4 can be provided in the device layer 12. A post-passivation layer 80 having thick and wide interconnection traces 666 is formed over the passivation layer 4. Two repeaters or transceivers 603 can be connected through the thick and wide interconnection trace 666 over the passivation layer 4.

After a signal is output from the semiconductor device 12a and then processed by the driver 601, the signal can be transmitted to a series of repeaters or transceivers 603 through the thick and wide interconnection traces 666 over the passivation layer 4. Thereafter, the signal can be transmitted to the receiver 602 through the thick and wide interconnection trace 666 over the passivation layer 4. Next, the signal, after being processed by the receiver 602, can be transmitted to the semiconductor device 12b. In this case, the structure of the semiconductor chip under the passivation layer 4 can be referred to as that of the semiconductor chip under the passivation layer shown in FIG. 1a. The post passivation layer 80 having the structure of the thick metal line layer 666 and thick polymer layer is located over the passivation layer 4. The detailed structure of the post passivation layer 80 and the method for forming the same can be referred to as those shown in FIGS. 1b and 3a-3d. The thick and wide interconnection 666 within the post passivation layer 80 is constructed of, for example, one thick patterned circuit layer or multiple thick patterned metal layers. The thick and wide interconnection trace 666 can be formed directly on and in touch with the passivation layer 4 or on the polymer layer on the passivation layer 4.

As to the chip routing design for electrical interconnection between the semiconductor devices, the following standard is introduced to judge whether a driver or a receiver is necessary should be installed. If the interconnection between the semiconductor devices (internal circuits) 12a and 12b has a routing length of less than D, it is unnecessary to install a driver or a receiver to process the signal passing through the interconnection between the semiconductor devices (internal circuits) 12a and 12b. If the interconnection between the semiconductor devices (internal circuits) 12a and 12b has a routing length of greater than D, it is necessary to install intra-chip drivers 601 or intra-chip receivers 602, or repeater 603 to process the signal passing through the interconnection between the semiconductor devices (internal circuits) 12a and 12b. The thick and wide interconnection trace 666 does not need to be connected with an electrostatic discharge (ESD) protection circuit and an Input/Output circuit.

Referring to FIG. 16, a current passing through the thick and wide interconnection metal trace 566 connecting the driver 611 and repeater 603 ranges from 500 microamperes to 10 milliamperes, and preferably from 700 microamperes to 2 milliamperes. A current passing through the thick and wide interconnection metal trace 566 connecting the repeaters 603 ranges from 500 microamperes to 10 milliamperes, and preferably from 700 microamperes to 2 milliamperes. A current passing through the thick and wide interconnection metal trace 566 connecting the repeater 603 and receiver 612 ranges from 500 microamperes to 10 milliamperes, and preferably from 700 microamperes to 2 milliamperes. A current passing through the interconnection metal trace connecting the driver 611 and the internal circuit 12a ranges from 50 microamperes to 2 milliamperes, and preferably from 100 microamperes to 1 milliamperes. A current passing through the interconnection metal trace connecting the receiver 612 and the internal circuit 12b ranges from 50 microamperes to 2 milliamperes, and preferably from 100 microamperes to 1 milliamperes.

Referring to FIG. 16, the drivers 601 and 611 may have a NMOS transistor having a ratio of the effective channel width to the effective channel length ranging from 1.5 to 30, and preferably ranging from 2.5 to 10. The drivers 601 and 611 may have a PMOS transistor having a ratio of the effective channel width to the effective channel length ranging from 3 to 60, and preferably ranging from 5 to 20. The receivers 602 and 612 may have a NMOS transistor having a ratio of the effective channel width to the effective channel length ranging from 1.5 to 30, and preferably ranging from 2.5 to 10. The receivers 602 and 612 may have a PMOS transistor having a ratio of the effective channel width to the effective channel length ranging from 3 to 60, and preferably ranging from 5 to 20. The internal circuits 12a and 12b may have a NMOS transistor having a ratio of the effective channel width to the effective channel length ranging from 0.1 to 5, and preferably ranging from 0.2 to 2. The internal circuits 12a and 12b may have a PMOS transistor having a ratio of the effective channel width to the effective channel length ranging from 0.2 to 10, and preferably ranging from 0.1 to 5.

Figure 17:
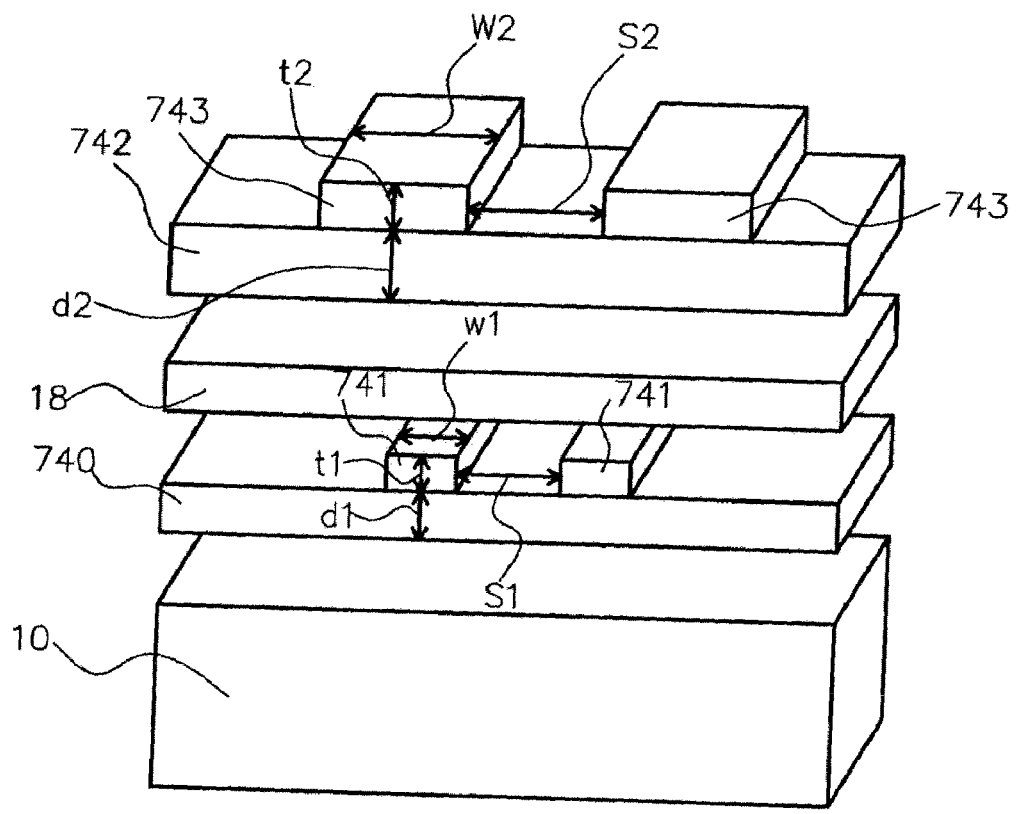
FIG. 17 shows a semiconductor chip having a thick circuit layer over a passivation layer.

In the prevent invention, the above-mentioned thick and wide metal trace over the passivation layer provides relatively good electrical performance as mentioned below. Referring to FIG. 17, an inner structure of the semiconductor chip of the present invention is shown. A structure between the semiconductor substrate 10 and the passivation layer 18 can be referred to as the description of the IC interconnection structure shown in FIG. 1a, wherein reference number 741 and 751 indicates fine-line metal traces of two different thin-film metal layers under the passivation layer 18, and reference number 740 indicates a thin-film insulating layer between the fine-line metal traces 741 and 751. Multiple thick and wide metal traces 743 and 753 are formed over the passivation layer 4. A polymer layer 742 is provided over the passivation layer 18 and between the thick and wide metal traces 743 and 753. The material of the polymer layer 742 and the method for forming the same can be referred to as those of the polymer layer 20 shown in FIG. 1b. The structure of the thick and wide metal traces 743 and 753 and the method for forming the same can be referred to as those of the thick and wide metal traces shown in FIGS. 2a-2g and 2j-2m.

Referring to FIG. 17, the thick and wide metal traces 743 and 753 may be composed of an adhesion/barrier layer, a seed layer and one or more electroplated metal layers. The thickness t2 of one of the thick and wide metal traces 743 over the passivation layer 18 is greater than the thickness t1 of one of the fine-line metal traces 741 of the thin-film metal layer under the passivation layer 18 by from 2 times to 1000 times. The thick and wide metal trace 743 is formed to interconnect multiple electrical bond pads exposed by openings in the passivation layer 18. The width w2 of one of the thick and wide metal traces 743 is greater than the width w1 of one of the fine-line metal traces 741 of the thin-film metal layer under the passivation layer 18 by from 2 times to 1000 times. The thickness t2 of one of the thick and wide metal traces 743 ranges, for example, from 2 microns to 100 microns, and preferably from 3 to 15 microns. The width w2 of one of the thick and wide metal traces 743 is equal to or greater than 2 microns. The space s2 between the neighboring thick and wide metal traces 743 is equal to or greater than 2 microns. The thick and wide metal trace 743 may have a lower resistance.

In a first case, referring to FIG. 17, as to the structure under the passivation layer 18, one of the fine-line metal traces 741 has a thickness t1 of about 2 microns, and a width w1 of about 10 microns and spaces from another neighboring one of the fine-line metal traces 741 by a space S1 of about 10 microns. The thin-film insulating layer 740 between the fine-line metal traces 741 and 751 has a thickness d1 of about 2 microns. The material of the thin-film insulating layer 740 is silicon dioxide ($SiO_2$). As to the structure over the passivation layer 18, one of the thick and wide metal traces 743 has a thickness t2 of about 5 microns and a width w2 of about 10 microns, and spaces from another neighboring one of the thick and wide metal traces 743 by a space S2 of about 10 microns. The polymer layer 742 has a thickness d2 of about 5 microns. The material of the polymer layer 742 is polyimide. According to the above mentioned conditions, the resistance of one of the thick and wide metal traces 743 over the passivation layer 18 may be smaller than that of one of the fine-line metal traces 741 by up to 2.5 times. The product of the resistance created by one of the thick and wide metal traces 743 times the capacitance created by said one of the thick and wide metal traces 743 can be smaller than the product of the resistance created by one of the fine-line metal traces 741 times the capacitance created by said one of the fine-line metal traces 741 by 6.25 times or by about 5 times.

In a second case, referring to FIG. 17, as to the structure under the passivation layer 18, one of the fine-line metal traces 741 has a thickness t1 of about 1 microns, and a width w1 of about 10 microns and spaces from another neighboring one of the fine-line metal traces 741 by a space S1 of about 2 microns. The thin-film insulating layer 740 between the fine-line metal traces 741 and 751 has a thickness d1 of about 0.5 microns. The material of the thin-film insulating layer 740 is silicon dioxide ($SiO_2$). As to the structure over the passivation layer 18, one of the thick and wide metal traces 743 has a thickness t2 of about 5 microns and a width w2 of about 10 microns, and spaces from another neighboring one of the thick and wide metal traces 743 by a space S2 of about 10 microns. The polymer layer 742 has a thickness d2 of about 5 microns. The material of the polymer layer 742 is polyimide. According to the above mentioned conditions, the resistance of one of the thick and wide metal traces 743 over the passivation layer 18 may be smaller than that of one of the fine-line metal traces 741 by up to 5 times. The product of the resistance created by one of the thick and wide metal traces 743 times the capacitance created by one of the thick and wide metal traces 743 can be smaller than the product of the resistance created by one of the fine-line metal traces 741 times the capacitance created by said one of the fine-line metal traces 741 by 50 times.

In a third case, referring to FIG. 17, as to the structure under the passivation layer 18, one of the fine-line metal traces 741 has a thickness t1 of about 0.4 microns, and a width w1 of about 0.2 microns and spaces from another neighboring one of the fine-line metal traces 741 by a space S1 of about 0.2 microns. The thin-film insulating layer 740 between the fine-line metal traces 741 and 751 has a thickness d1 of about 0.4 microns. The material of the thin-film insulating layer 740 is silicon dioxide ($SiO_2$). As to the structure over the passivation layer 18, one of the thick and wide metal traces 743 has a thickness t2 of about 5 microns and a width w2 of about 10 microns, and spaces from another neighboring one of the thick and wide metal traces 743 by a space S2 of about 10 microns. The polymer layer 742 has a thickness d2 of about 5 microns. The material of the polymer layer 742 is polyimide. According to the above mentioned conditions, the resistance of one of the thick and wide metal traces 743 over the passivation layer 18 may be smaller than that of one of the fine-line metal traces 741 by up to 625 times. The product of the resistance created by one of the thick and wide metal traces 743 times the capacitance created by said one of the thick and wide metal traces 743 can be smaller than the product of the resistance created by one of the fine-line metal traces 741 times the capacitance created by said one of the fine-line metal traces 741 by 2500 times.

In a fourth case, referring to FIG. 17, as to the structure under the passivation layer 18, one of the fine-line metal traces 741 has a thickness t1 of about 0.4 microns, and a width w1 of about 0.2 microns and spaces from another neighboring one of the fine-line metal traces 741 by a space S1 of about 0.2 microns. The thin-film insulating layer 740 between the fine-line metal traces 741 and 751 has a thickness d1 of about 0.4 microns. The material of the thin-film insulating layer 740 is silicon dioxide ($SiO_2$). As to the structure over the passivation layer 18, one of the thick and wide metal traces 743 has a thickness t2 of about 10 microns and a width w2 of about 10 microns, and spaces from another neighboring one of the thick and wide metal traces 743 by a space S2 of about 40 microns. The polymer layer 742 has a thickness d2 of about 10 microns. The material of the polymer layer 742 is polyimide. According to the above mentioned conditions, the resistance of one of the thick and wide metal traces 743 over the passivation layer 18 may be smaller than that of one of the fine-line metal traces 741 by up to 1250 times. The product of the resistance created by one of the thick and wide metal traces 743 times the capacitance created by said one of the thick and wide metal traces 743 can be smaller than the product of the resistance created by one of the fine-line metal traces 741 times the capacitance created by said one of the fine-line metal traces 741 by 6.25 times or by about 10,000 times.

According to the above mentioned discussion, the product of the resistance created by one of the thick and wide metal traces 743 times the capacitance created by said one of the thick and wide metal traces 743 can be smaller than the product of the resistance created by one of the fine-line metal traces 741 times the capacitance created by said one of the fine-line metal traces 741 by 6.25 times or by from 5 times to 10,000 times, and preferably by from 100 times to 10000 times. The product of the resistance created by one of the thick and wide metal traces 743 times the capacitance created by said one of the thick and wide metal traces 743 can be referred to Table 1 in case that polyimide and BenzoCycloButene (BCB) are used as the material for the polymer layer 742 between the thick and wide metal traces 743 and 753, respectively.

THE PRESENT INVENTION HAS THE FOLLOWING ADVANTAGES

1) Because the thick and wide metal trace over the passivation layer has a low resistance and the thick polymer layer over the passivation layer has a great thickness and a low coefficient of capacitance, the RC product of the resistance created by the thick and wide metal trace times the capacitance created by it can be improved. Therefore, a response of a signal passing through the thick and wide metal trace can be enhanced and the performance of the IC can be improved.

2) Expensive equipments with high precise used for conventionally fabricating sub-micron IC in a relatively strict clean room of Class 10 or less, for example, are not needed to be used to form the thick and wide metal traces over the passivation layer. However, the thick and wide metal traces are formed in a clean room with a relatively unstrict clean level of Class 100 or more, for example, using relatively cheap equipments with low precise. Therefore, the production cost can be reduced.

3) The thick and wide metal traces over the passivation layer can be employed to integrate power buses, ground buses and clock distribution network.

4) In a system-on-chip (SOC) design, the thick and wide metal trace can be employed to connect circuits far away apart from each other or one another and with different functions. Thereby, the electrical performance can be enhanced.

5) A software can be used to automatically design and route the thick and wide metal trace exceeding a predetermined length according to the need of an interconnection.

6) The thick and wide metal traces can be employed to replace some or all of the circuitry in a BGA substrate. Therefore, the cost of producing the BGA substrate can be declined.

7) Tin-lead bumps, tin-silver bumps, gold bumps and wires formed by a wirebonding process can be used to connect the thick and wide metal trace over the passivation layer to an external circuit.

8) The thick and wide metal trace over the passivation layer can provide the functions of fanning out bond pads, relocating bond pads, reducing bond pads and increasing bond pads. Thereby, the bond pads can be set at suitable positions to lead tin-lead bumps, tin-silver bumps, gold bumps and wires formed by a wirebonding process to be conveniently formed over the bond pads. Thereby, the flexibility in the next stage of a packaging process can be enhanced.

9) The thick and wide metal traces used to distribue a power voltage, a ground reference voltage or a signal can be employed to reduce I/O counts.

10) An opening in the passivation layer may have a greatest lateral dimension ranges form 2.5 microns to 0.1 microns. The thick and wide metal traces over the passivation layer can be connected to the thin-film metal layer below the passivation layer through the opening in the passivation layer.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A semiconductor chip comprising:
a semiconductor substrate;
a first MOS device in and over said semiconductor substrate;
a second MOS device in and over said semiconductor substrate;
a first metallization structure over said semiconductor substrate, wherein said first metallization structure is connected to a diffusion layer of said first MOS device, and wherein said first metallization structure comprises a first portion and a second portion over said first portion, wherein said first portion is connected to said second portion;
a second metallization structure over said semiconductor substrate, wherein said second metallization structure is connected to a gate of said second MOS device, and wherein said second metallization structure comprises a third portion and a fourth portion over said third portion, wherein said third portion is connected to said fourth portion, and wherein said first and third portions are provided by a first metal layer, and said second and fourth portions are provided by a second metal layer over said first metal layer;
an insulating layer between said first and second metal layers;
a passivation layer over said first and second metal layers and over said insulating layer, wherein said passivation layer comprises a nitride layer having a thickness between 0.2 and 1.2 micrometers; and
a third metallization structure over said passivation layer, wherein said third metallization structure is connected to said first metallization structure through a first opening in said passivation layer, and to said second metallization structure through a second opening in said passivation layer, and wherein said diffusion layer is connected to said gate through, in sequence, said first metallization structure, said third metallization structure and said second metallization structure.

2. The semiconductor chip of claim 1, wherein said diffusion layer comprises a source connected to said gate through, in sequence, said first metallization structure, said third metallization structure and said second metallization structure.

3. The semiconductor chip of claim 1, wherein said first opening has a greatest transverse dimension between 0.5 and 20 micrometers.

4. The semiconductor chip of claim 1 further comprising a polymer layer between said passivation layer and said third metallization structure, wherein said polymer layer has a thickness between 2 and 150 micrometers.

5. The semiconductor chip of claim 1, wherein said insulating layer comprises an oxide.

6. The semiconductor chip of claim 1, wherein said passivation layer further comprises an oxide layer under said nitride layer.

7. The semiconductor chip of claim 1 further comprising a polymer layer between said passivation layer and said third metallization structure.

8. The semiconductor chip of claim 7, wherein said polymer layer comprises polyimide.

9. The semiconductor chip of claim 1, wherein said third metallization structure comprises a third metal layer having greater than 90 weight percent of gold to a thickness between 2 and 10 micrometers.

10. The semiconductor chip of claim 1, wherein said third metallization structure comprises a third metal layer having greater than 90 weight percent of gold to a thickness between 1 and 100 micrometers.

11. The semiconductor chip of claim 1, wherein said third metallization structure comprises a third metal layer and a fourth metal layer on said third metal layer, wherein said fourth metal layer has greater than 90 weight percent of gold, and wherein said third metal layer comprises gold.

12. The semiconductor chip of claim 1, wherein said third metallization structure comprises a third metal layer having greater than 90 weight percent of copper to a thickness between 2 and 10 micrometers.

13. The semiconductor chip of claim 1, wherein said third metallization structure comprises a third metal layer having greater than 90 weight percent of copper to a thickness between 1 and 100 micrometers.

14. The semiconductor chip of claim 1, wherein said third metallization structure comprises a third metal layer and a fourth metal layer on said third metal layer, wherein said fourth metal layer has greater than 90 weight percent of copper, and wherein said third metal layer comprises copper.

15. The semiconductor chip of claim 1, wherein said third metallization structure comprises a copper layer and a nickel layer on said copper layer.

16. The semiconductor chip of claim 1, wherein said third metallization structure comprises a copper layer and a gold layer over said copper layer.

17. The semiconductor chip of claim 1, wherein said third metallization structure comprises a copper layer and a palladium layer over said copper layer.

18. The semiconductor chip of claim 1 further comprising a polymer layer on said third metallization structure.

19. The semiconductor chip of claim 18, wherein said polymer layer comprises polyimide.

20. The semiconductor chip of claim 1, wherein said second metal layer comprises a copper layer and an adhesion/barrier layer covering a bottom and a sidewall of said copper layer.

* * * * *